United States Patent
Kim

(10) Patent No.: US 7,176,494 B2
(45) Date of Patent: *Feb. 13, 2007

(54) THIN FILM TRANSISTOR FOR LIQUID CRYSTAL DISPLAY AND METHOD OF MANUFACTURING THE SAME

(75) Inventor: Dong-Gyu Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/876,007

(22) Filed: Jun. 25, 2004

(65) Prior Publication Data

US 2004/0227864 A1  Nov. 18, 2004

Related U.S. Application Data

(60) Continuation of application No. 10/358,266, filed on Feb. 5, 2003, now Pat. No. 6,828,167, which is a division of application No. 10/142,977, filed on May 13, 2002, now Pat. No. 6,624,446.

(30) Foreign Application Priority Data

May 14, 2001 (JP) .................... 2001-26147

(51) Int. Cl.
 H01L 29/04 (2006.01)
 H01L 29/15 (2006.01)
 H01L 31/036 (2006.01)
 H01L 31/0376 (2006.01)
 H01L 31/20 (2006.01)

(52) U.S. Cl. .................... 257/72; 257/57; 257/59; 257/66; 257/73; 257/291

(58) Field of Classification Search .............. 257/57, 257/59, 66, 72–73, 291
See application file for complete search history.

(56) References Cited

U.S. PATENT DOCUMENTS

| 5,003,356 | A | | 3/1991 | Wakai et al. ............ 257/390 |
| 5,327,268 | A | * | 7/1994 | Takabatake et al. ......... 349/42 |
| 5,459,595 | A | * | 10/1995 | Ishiguro et al. ............ 349/111 |
| 6,001,539 | A | * | 12/1999 | Lyu et al. .................. 430/317 |
| 6,038,003 | A | * | 3/2000 | Kim ............................ 349/43 |
| 6,218,221 | B1 | | 4/2001 | Sah ............................ 438/158 |

(Continued)

FOREIGN PATENT DOCUMENTS

JP  8-292449  4/1995

(Continued)

*Primary Examiner*—Ida M. Soward
(74) *Attorney, Agent, or Firm*—Don C. Lawrence; MacPherson Kwok Chen & Heid LLP

(57) ABSTRACT

Disclosed is a thin film transistor (TFT) for a liquid crystal display (LCD) and a method for manufacturing the same that allows the number of photomasks used in a photolithography process to be decreased as compared to conventional methods. A passivation film is formed as a single layered organic insulating film, and the number of needed exposure steps is reduced, so as to decrease the number of needed photomask sheets and thereby improve the efficiency of the TFT production process. Applications of the disclosed method include reflection and transmission composite type LCDs as well as a reflection type LCD.

9 Claims, 60 Drawing Sheets

U.S. PATENT DOCUMENTS

| | | | |
|---|---|---|---|
| 6,300,152 B1 * | 10/2001 | Kim | 438/30 |
| 6,337,723 B1 * | 1/2002 | Bae | 349/43 |
| 6,366,331 B1 * | 4/2002 | Sakamoto et al. | 349/43 |
| 6,469,759 B2 | 10/2002 | Jang et al. | 349/113 |
| 6,522,369 B2 * | 2/2003 | Ohta et al. | 349/39 |
| 6,567,150 B1 * | 5/2003 | Kim | 349/187 |
| 6,624,446 B2 * | 9/2003 | Kim | 257/72 |
| 6,924,865 B2 * | 8/2005 | Ohta et al. | 349/141 |
| 2002/0054268 A1 * | 5/2002 | Kim et al. | 349/158 |
| 2003/0179325 A1 * | 9/2003 | Rho et al. | 349/43 |

FOREIGN PATENT DOCUMENTS

| | | |
|---|---|---|
| JP | 11-084425 | 9/1997 |
| JP | 2000-155335 | 11/1998 |
| JP | 2002-280567 | 3/2001 |

* cited by examiner

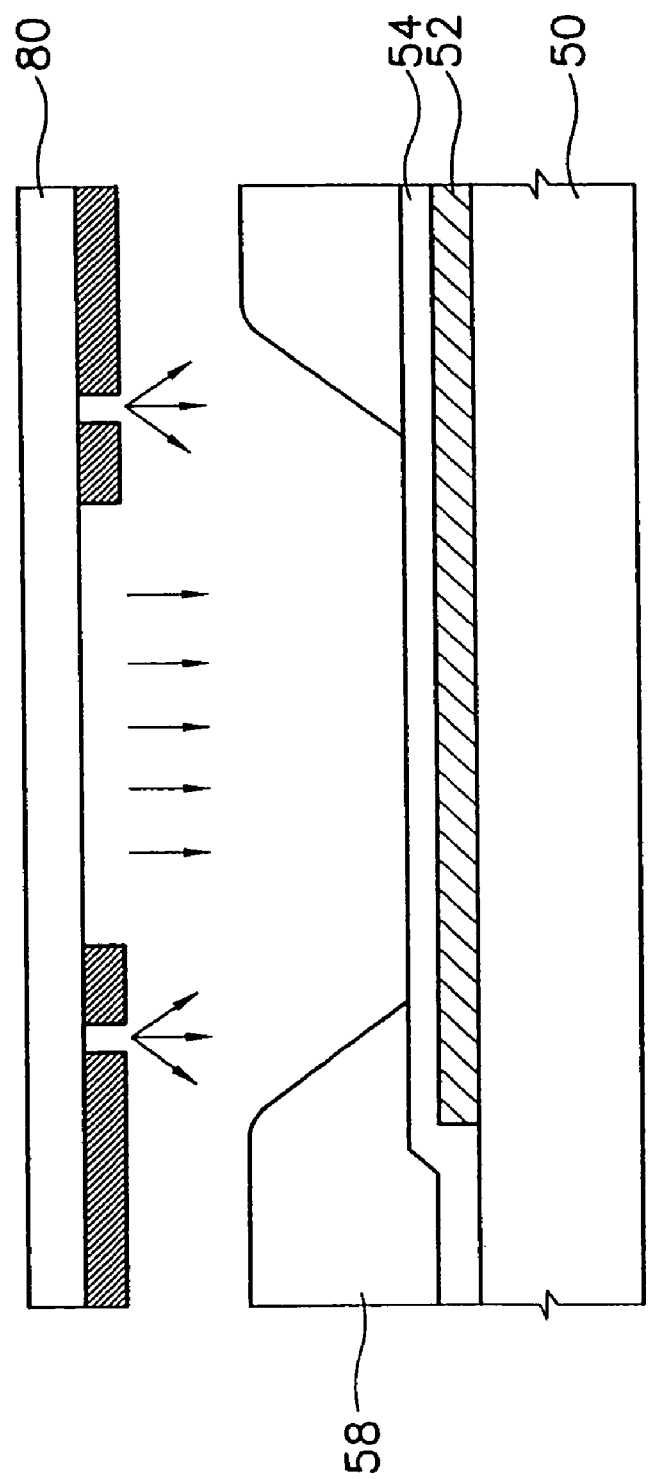

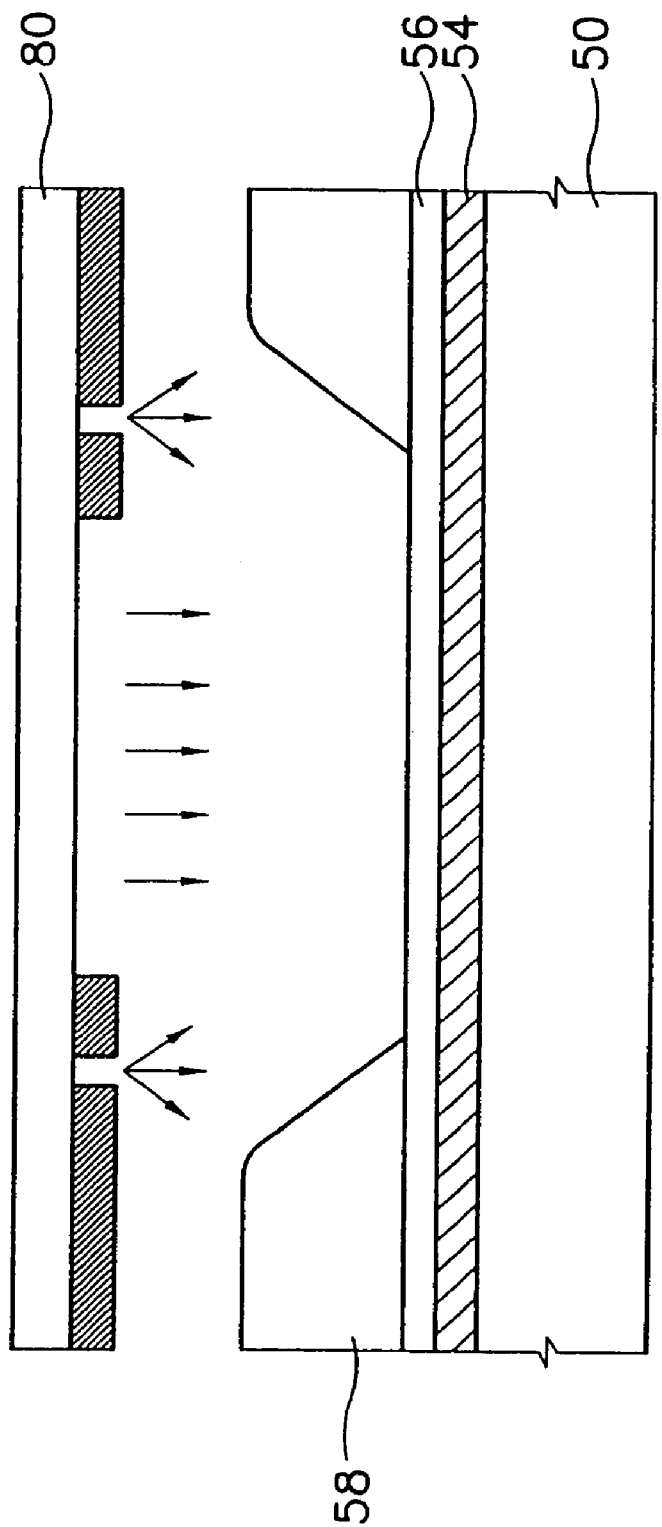

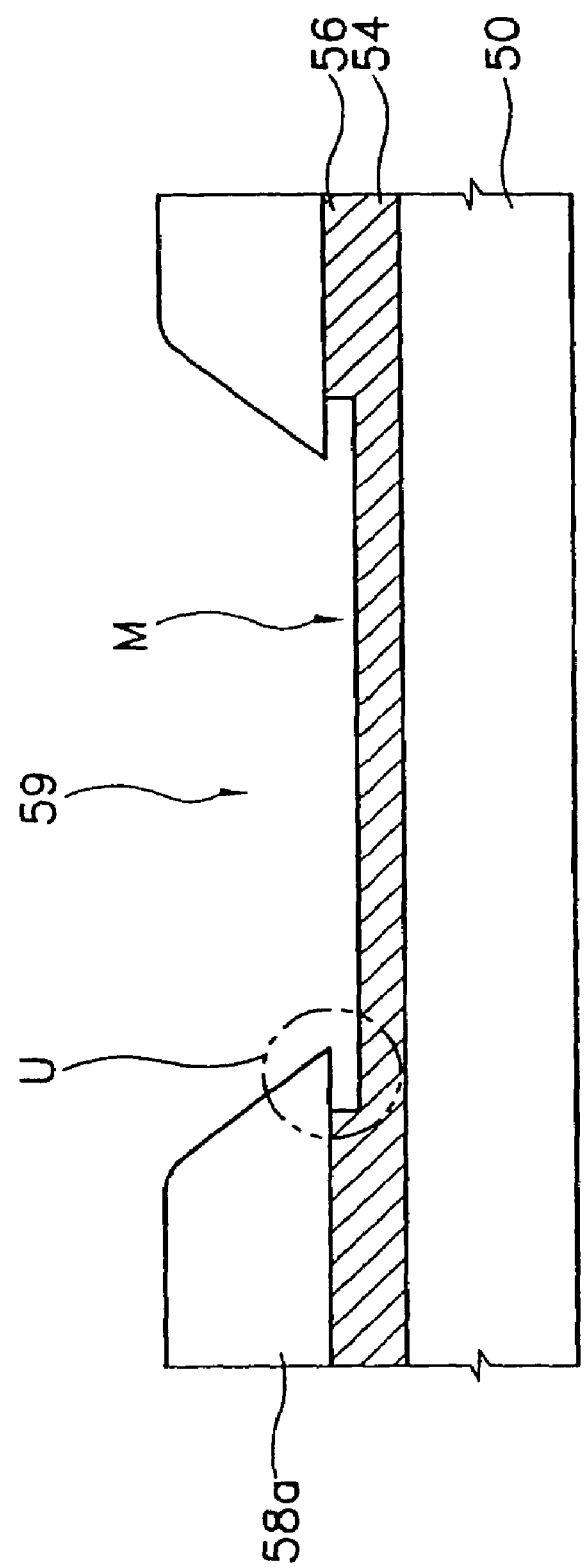

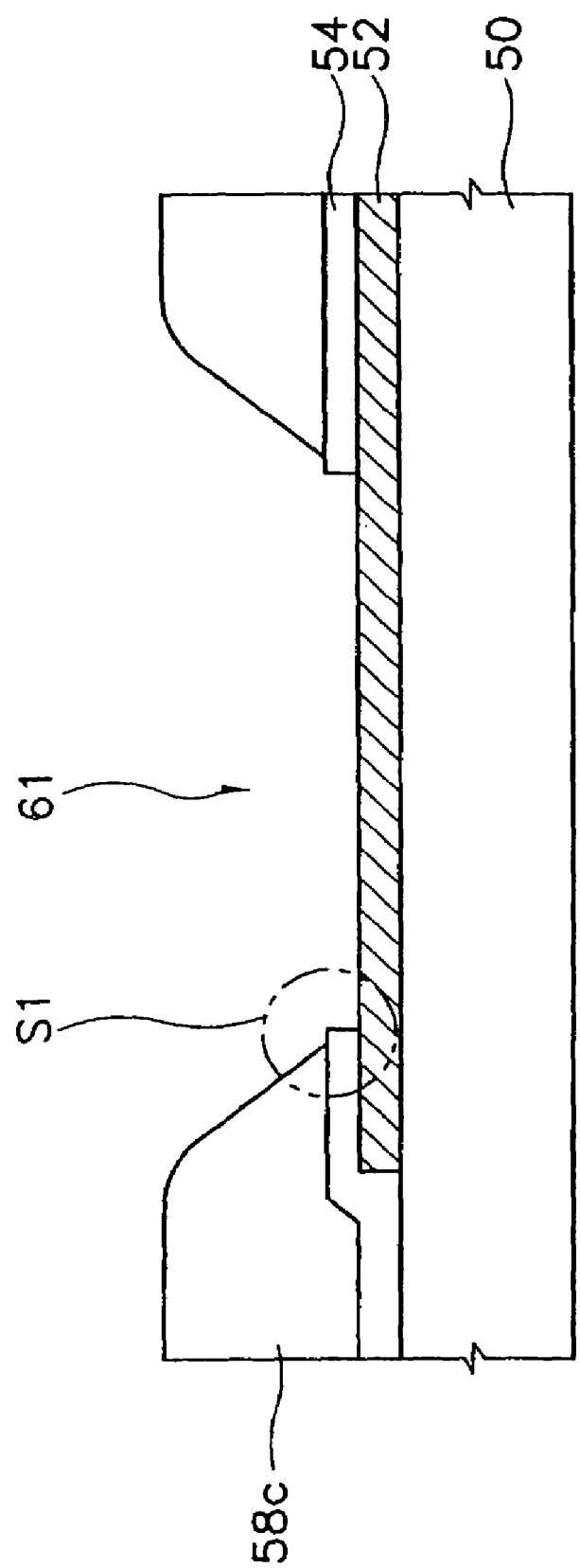

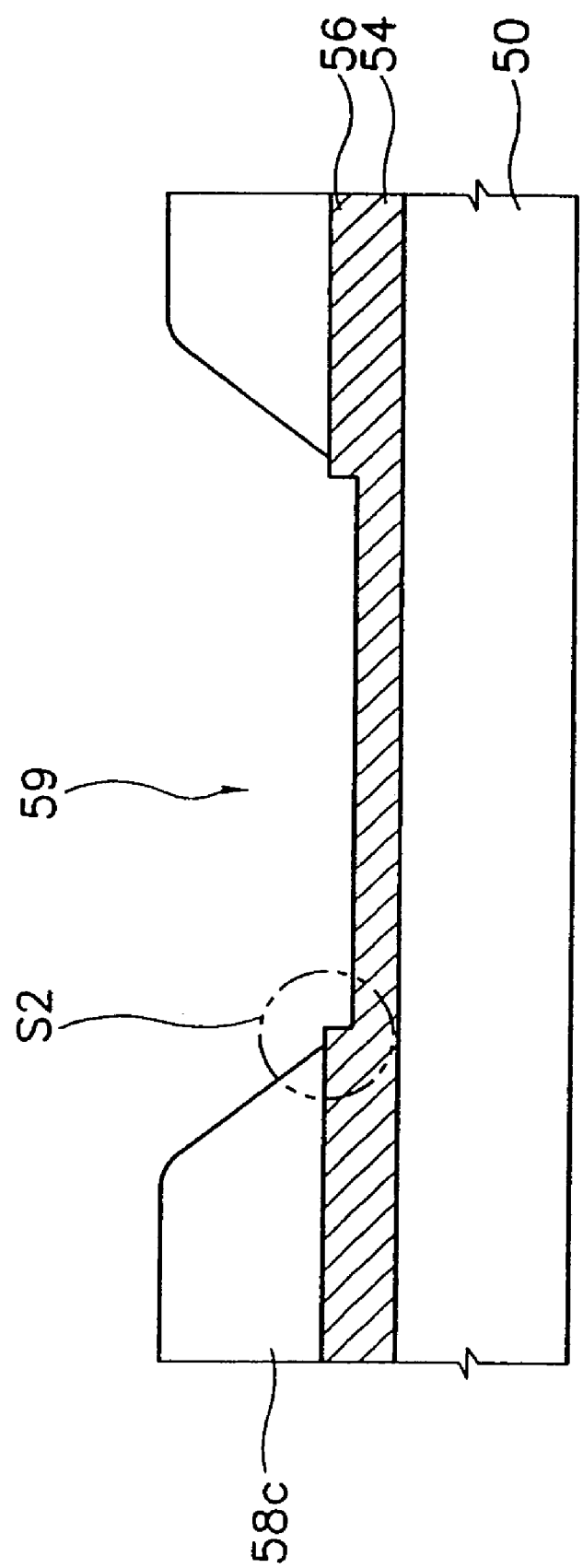

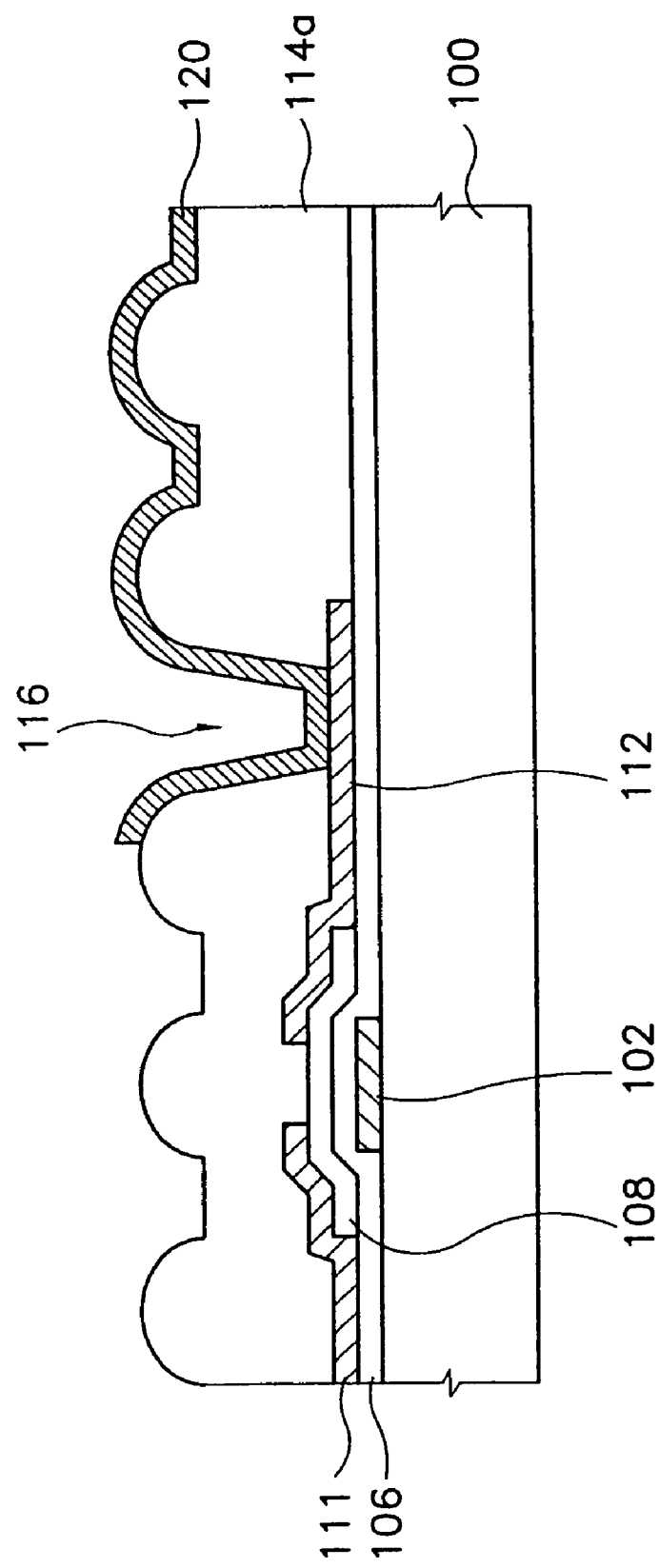

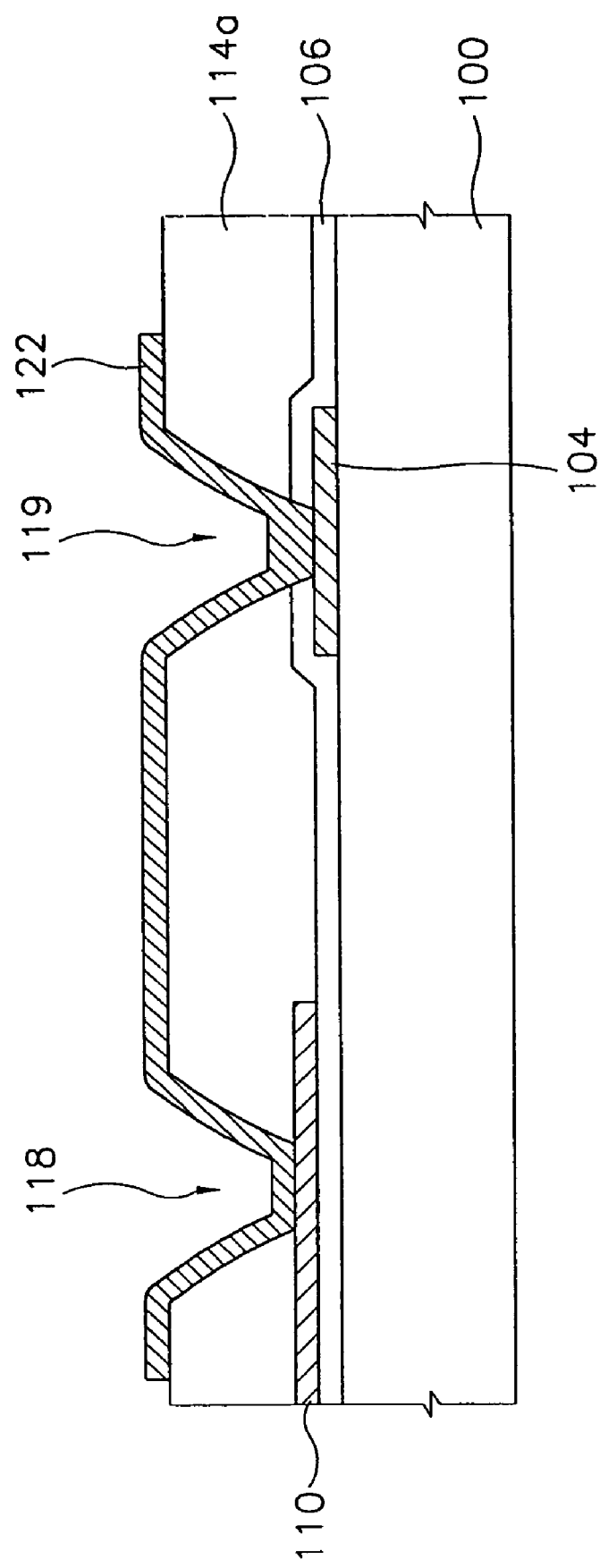

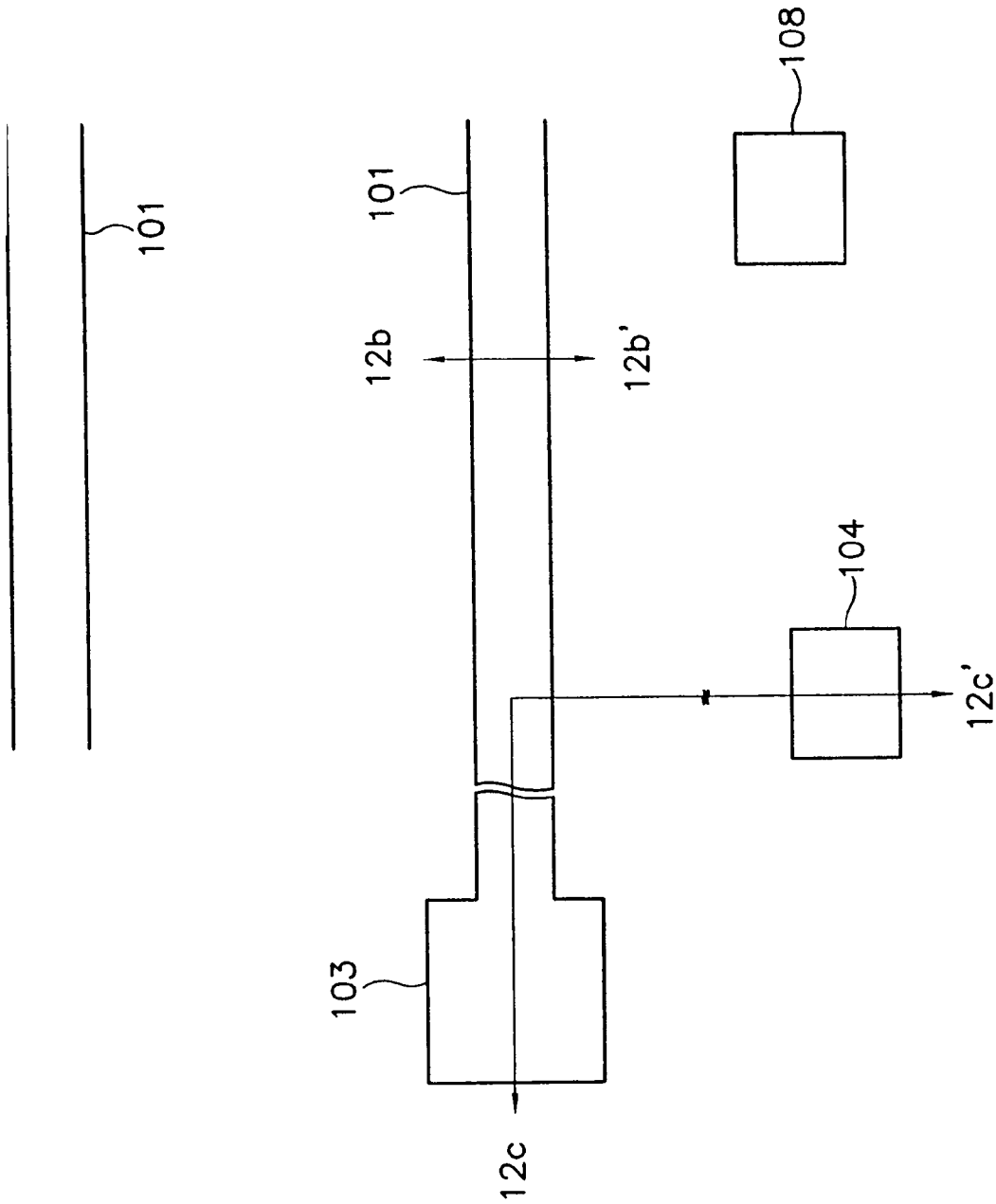

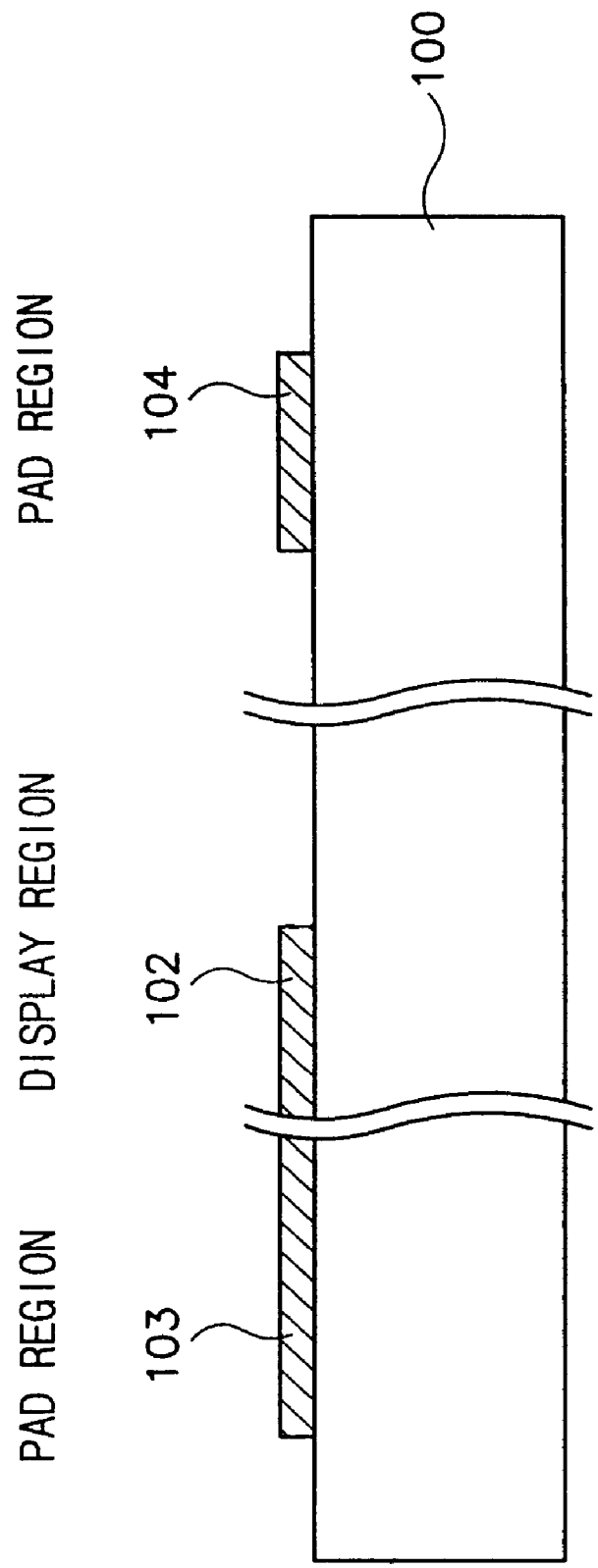

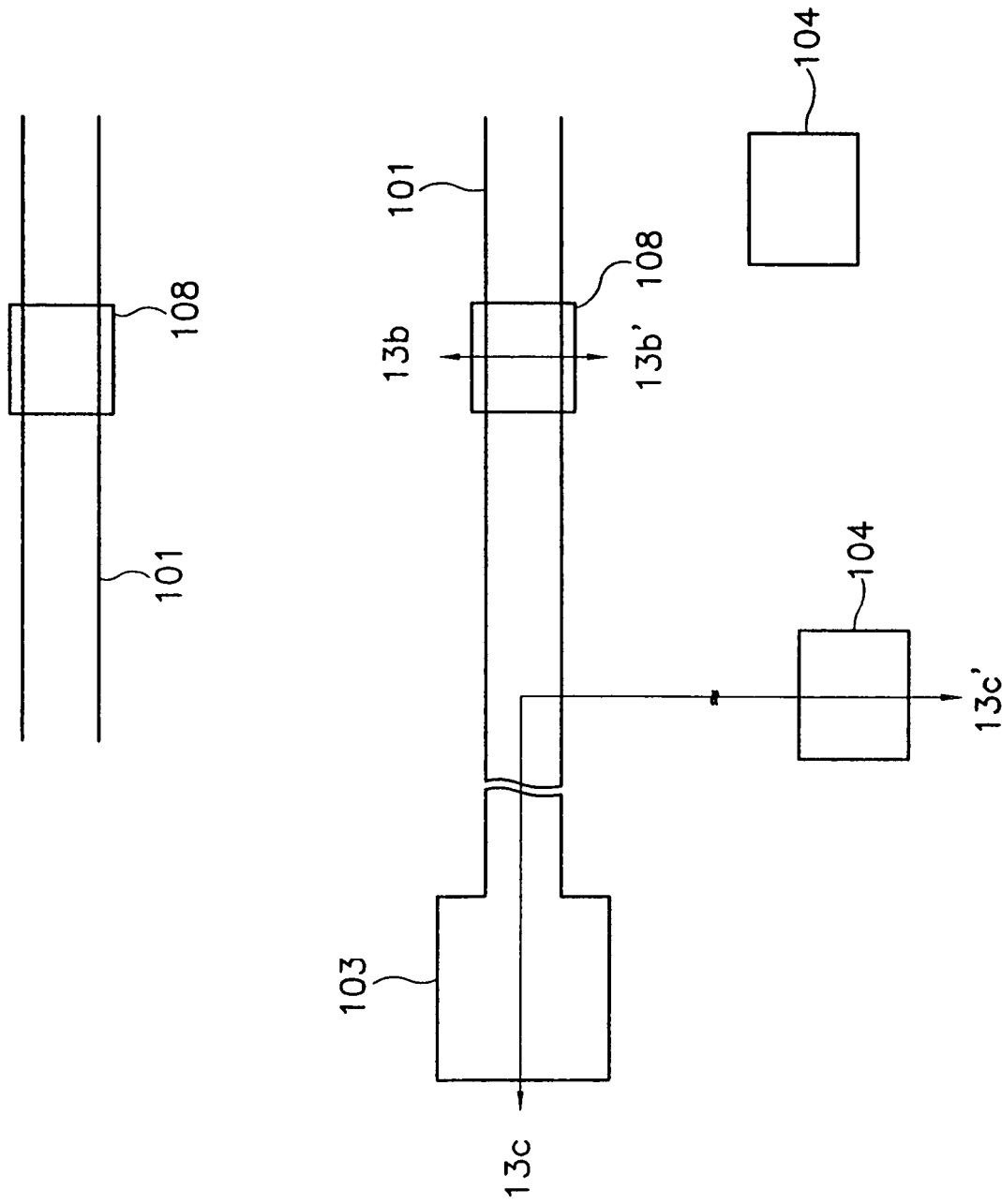

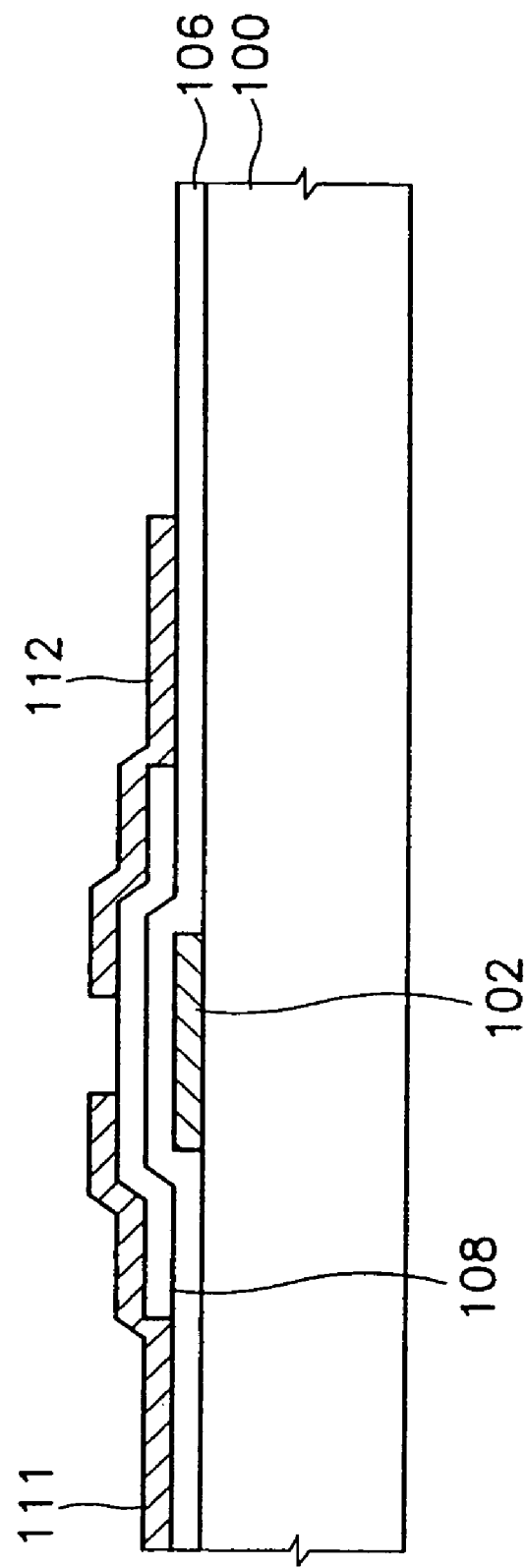

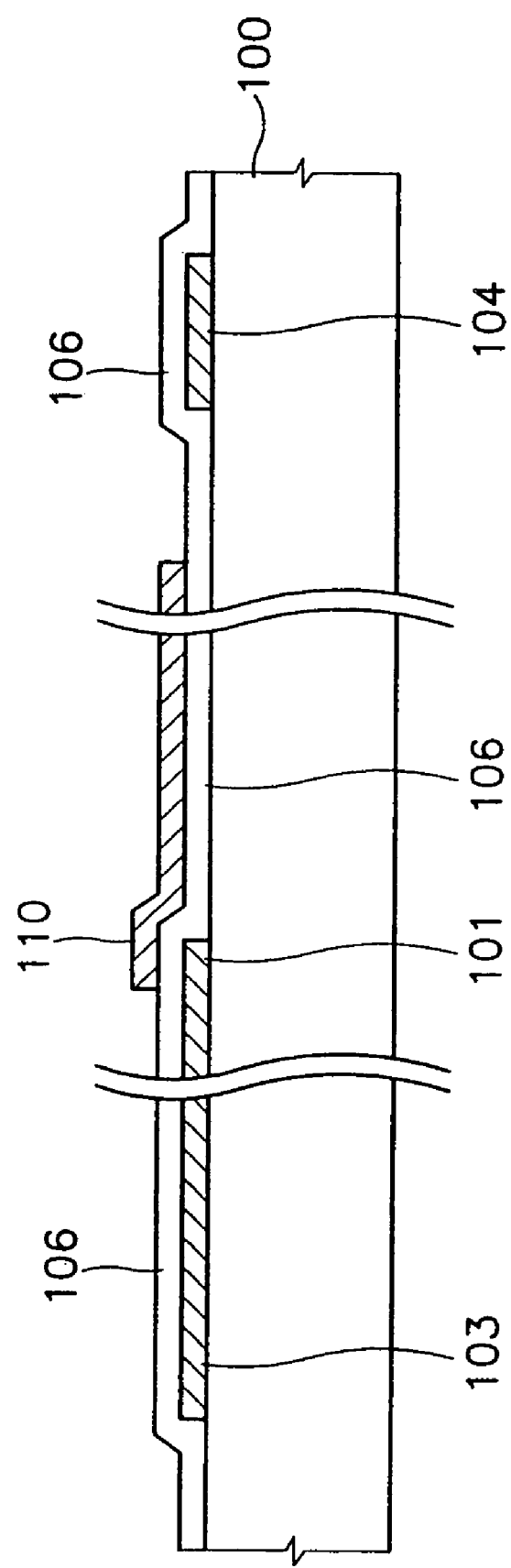

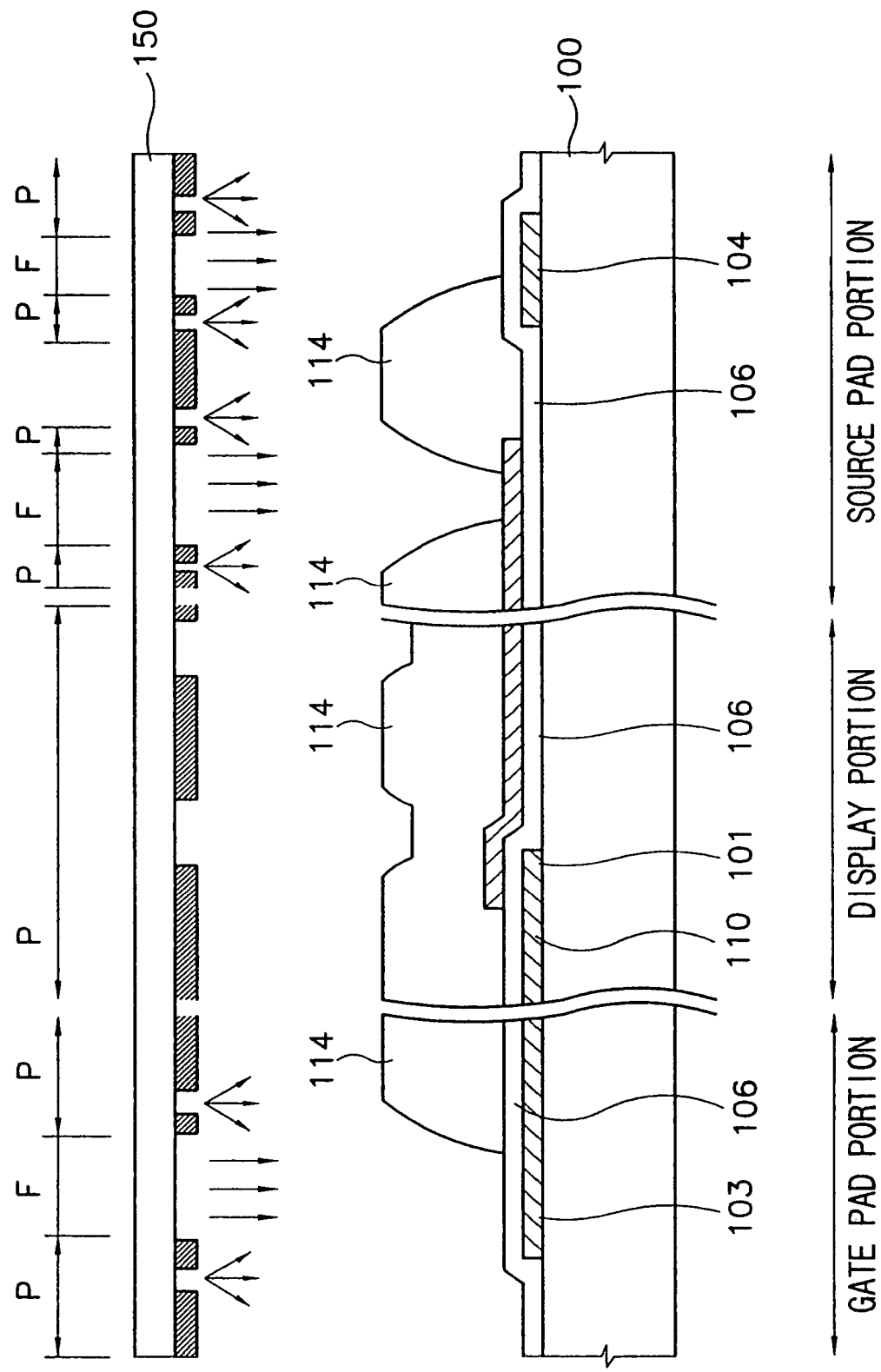

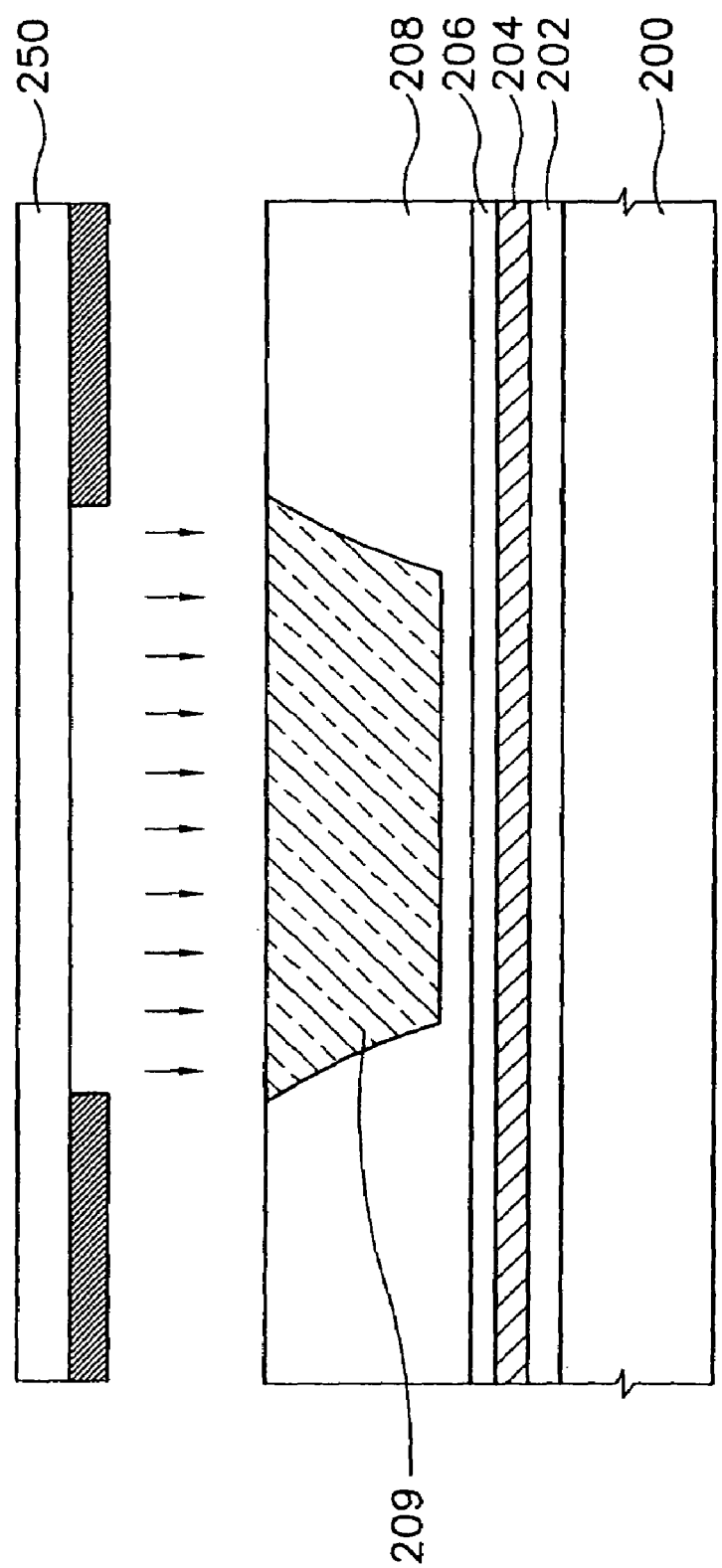

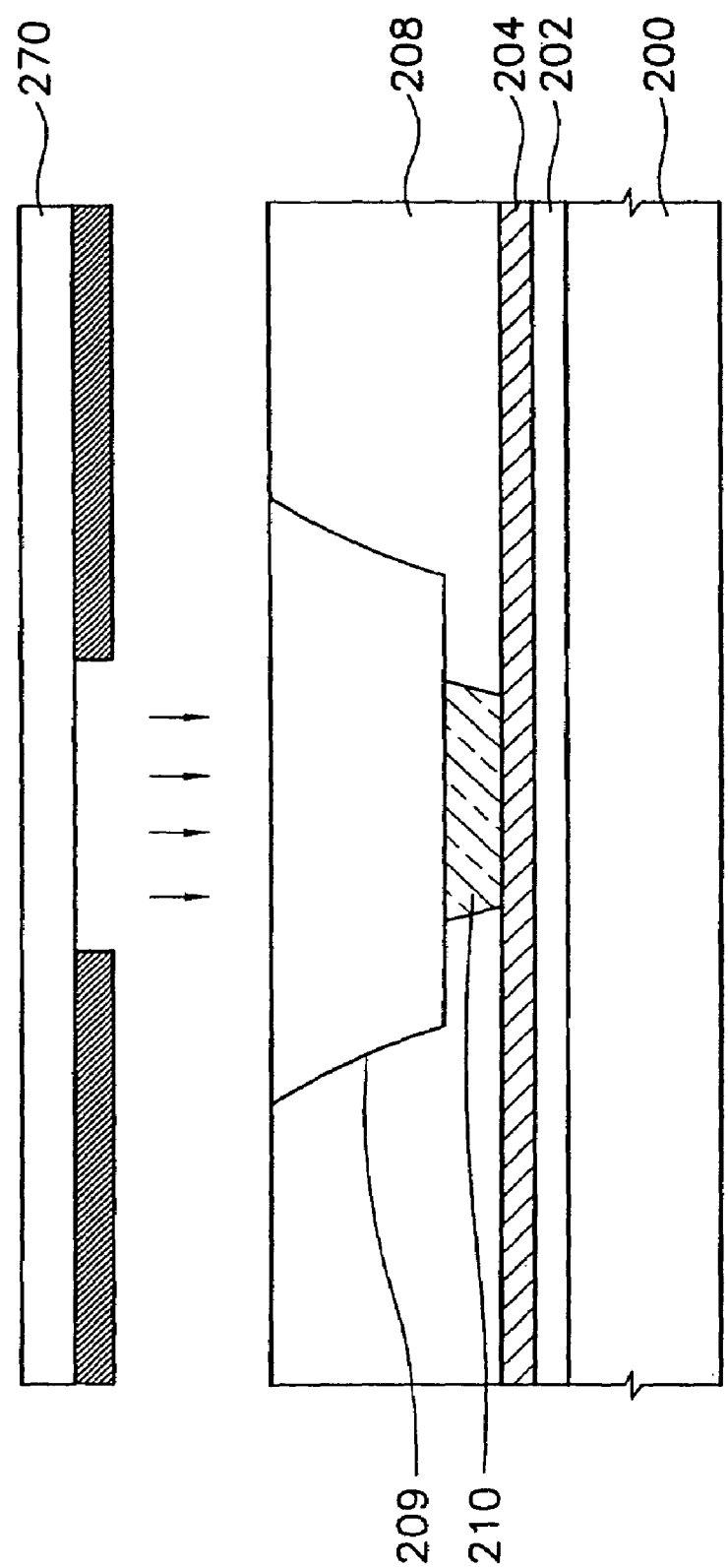

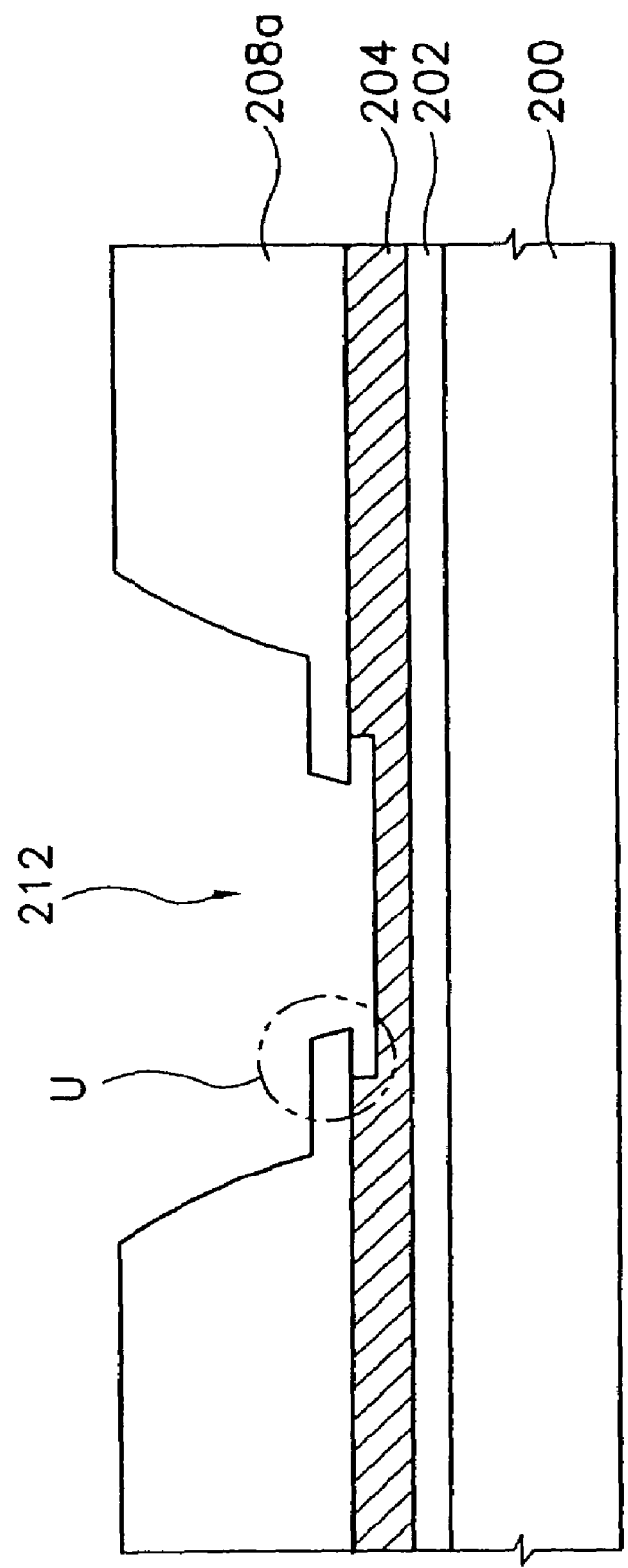

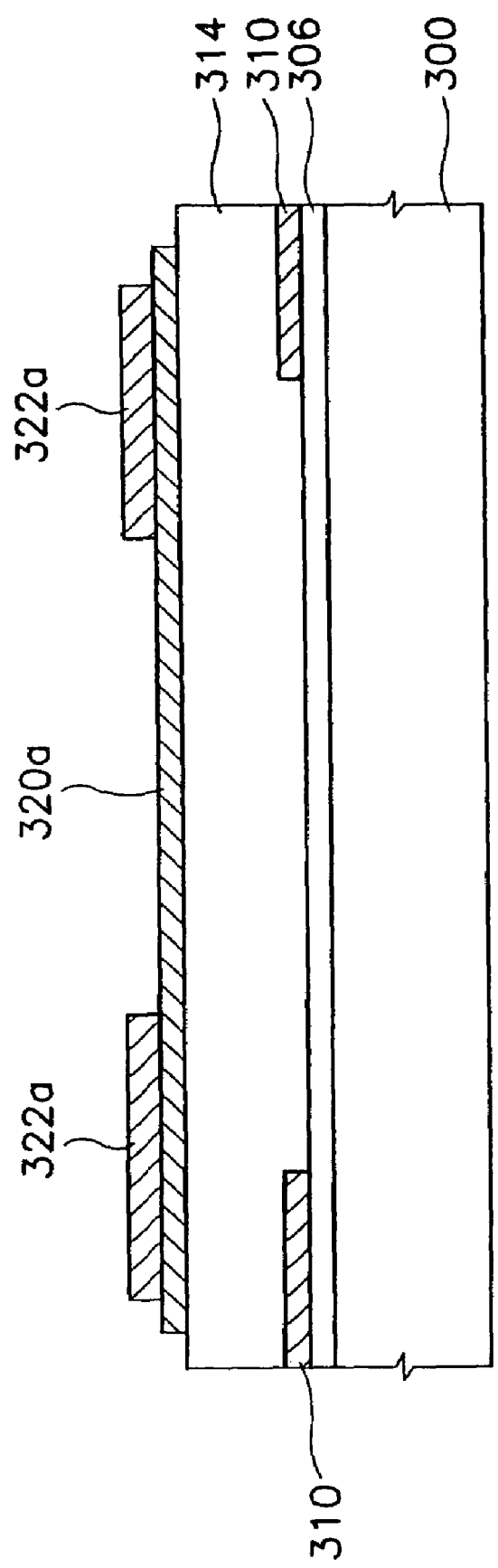

US 7,176,494 B2

THIN FILM TRANSISTOR FOR LIQUID CRYSTAL DISPLAY AND METHOD OF MANUFACTURING THE SAME

This is a continuation application of the U.S. patent application Ser. No. 10/358,266 filed Feb. 5, 2003 now U.S. Pat. No. 6,828,167, which is a divisional application of the U.S. patent application Ser. No. 10/142,977, filed on May 13, 2002, which is now U.S. Pat. No. 6,624,446.

BACKGROUND OF THE INVENTION

1. Field of the Invention

The present invention relates to a thin film transistor for a liquid crystal display and a method for manufacturing the same, and more particularly, to a thin film transistor for a liquid crystal display and a method for manufacturing the same capable of decreasing the number of required photomasks.

2. Description of the Related Art

In an information-oriented society these days, the role of electronic displays is becoming increasingly important. The electronic displays of all kinds are widely used in various industrial fields.

Generally, the electronic display is an apparatus for visually transmitting a variety of information to a person. That is, an electrical information signal output from various electronic devices is converted into a visually recognizable optical information signal presented on electronic displays. Therefore, the electronic display serves as a bridge for connecting the person and the electronic devices.

The electronic display is classified into an emissive display, in which the optical information signal is displayed by a light-emitting method, and a non-emissive display, in which the optical information signal is displayed by an optical modulation method, including light-reflecting, dispersing and interfering phenomena. Examples of the emissive display, referred to as an active display, include a CRT (Cathode Ray Tube), a PDP (Plasma Display Panel), an LED (Light Emitting Diode) and an ELD (Electroluminescent Display). Examples of the non-emissive display referred to as a passive display, include an LCD (Liquid Crystal Display), an ECD (Electrochemical Display) and an EPID (Electrophoretic Image Display).

The CRT used in an image display such as a television receiver or a monitor, has the highest market share to date with respect to display quality and economical efficiency, but the CRT also has many disadvantages such as heavy weight, large volume and high power consumption.

Meanwhile, due to rapid development of a semiconductor technology, various kinds of electronic devices are now driven by lower voltage and lower power, which produces electronic equipment that is considerably slimmer and lighter. Therefore, a flat panel type display having these slimmer and lighter characteristics, as well as lower driving voltage and lower power consumption characteristics, is very desirable according to the new environment.

The LCD among the various developed flat panel type displays is much slimmer and lighter than any other displays; LCDs also have low driving voltage and low power consumption, as well as displaying quality similar to that of the CRT. Therefore, the LCD is widely used in various electronic equipment.

The LCD comprises two substrates respectively having an electrode, and a liquid crystal layer interposed between the two substrates. In the LCD, a voltage is applied to the electrode to re-align liquid crystal molecules and to control an amount of light transmitted through the molecules. These LCDs are classified into a transmission type LCD, for displaying an image using an external light source, and a reflection type LCD, for displaying an image using natural light.

One of the LCDs, which is mainly used nowadays, is provided with the electrode formed at each of the two substrates and having a thin film transistor for switching power supplied to each electrode. Generally, the thin film transistor (referred to as TFT, hereinafter) is formed at one side of the two substrates.

Generally, a substrate on which TFTs are formed is referred to as a "TFT substrate." And, such a TFT substrate is generally manufactured by a photolithography process using a photomask; currently, for example, seven sheets of photomasks are required at the present.

FIG. 1 is a sectional view of a conventional reflection type TFT LCD.

Referring to FIG. 1, after depositing a single layered metallic film or a double layered metallic film such as chromium (Cr), aluminum (Al), molybdenum (Mo) or an alloy of Mo and tungsten (W) as a gate film on a transparent substrate 10 made of glass, quartz, or sapphire, the gate film is patterned using a photolithography process to form a gate wiring (using a first mask). The gate wiring includes a gate electrode 12, a gate line connected to the gate electrode 12 and a gate pad 13 that receives a signal from the outside and transmits the received signal to the gate line.

A gate insulating film 14 made of silicon nitride is formed to a thickness of about 4,500 Å on the substrate on which the gate wiring is formed. A semiconductor film made of amorphous silicon is deposited on the gate insulating film 14 and then patterned to form an active pattern 16 of a TFT (using a second mask).

A metal film is deposited on the active pattern 16 and the gate insulating film 14 and then is patterned using the photolithography process to form a data wiring (using a third mask). The data wiring includes a source electrode 18, a drain electrode 19 and a data pad (not shown) for transmitting an image signal.

After depositing an inorganic passivation film 20 made of silicon nitride on the data wiring and the gate insulating film 14 to a thickness of about 4,000 Å, the inorganic passivation film 20 and the gate insulating film 14 on the source electrode, gate wiring and data pad are dry-etched by the photolithography process (using a fourth mask).

A photosensitive organic passivation film 22 is deposited to a thickness range of about 2–4 μm on the inorganic passivation film 20 and is then exposed using a photomask (using a fifth mask). At this time, the organic passivation film 22 placed on the source electrode 18, gate wiring and data pad is fully exposed.

In addition, to make the reflection plate of the pixel region in a light scattering structure, the organic passivation film 22 is again exposed (using a sixth mask). At this time, the organic passivation film 22 of the display region is incompletely exposed in an irregular pattern having a line width corresponding to the resolution of an exposing machine.

Subsequently, the exposed organic passivation film 22 is developed to form an irregular surface having a plurality of concave portions and convex portions in the organic passivation film 22 and a first via hole for exposing the source electrode 18 and a second via hole for exposing the gate pad 13. In addition, although not shown in the drawings, there is formed a third via hole for exposing the data pad together.

On the organic passivation film 22, in which the aforementioned via holes are formed, a reflection metal film such as aluminum (Al) is deposited and then patterned to form a pixel electrode 26, which is connected to the source electrode 18 through the first via hole, and a gate pad electrode 27, which is connected to the gate pad 13 through the second via hole (using a seventh mask). In addition, there is formed a data pad electrode (not shown), which is connected to the data pad through the third via hole, together. The pixel electrode 26 is formed within the pixel region enclosed by the gate wiring and the data wiring and is provided as a reflection plate.

To manufacture a TFT according to the aforementioned conventional method, the photolithography process is used in the seven layers of the gate wiring, active pattern, data wiring, inorganic passivation film, organic passivation film and pixel electrode and thus at least seven sheets of photomask are needed.

As the number of photomasks used in the photolithography process increases, the more the manufacturing cost and the probability of process error increase. Since this causes an increase in the manufacturing costs, there has been proposed a method for forming the inorganic passivation film as a single layer by deleting the inorganic passivation film in order to simplify the process.

FIG. 2A to 4B are sectional views for describing a method for forming a via hole in a TFT in accordance with another conventional method in which the inorganic passivation film is deleted. Here, FIGS. 2A, 3A and 4A show a part of the display region and FIGS. 2B, 3B and 4B show a part of the pad region.

Referring to FIGS. 2A and 2B, after depositing an organic passivation film 45, made of a photosensitive material, on a substrate 40 on which a gate wiring 42, made of a first metal film, a gate insulating film 43, made of an inorganic insulating film and a data wiring, made of a second metal film, are formed in the order named, via hole portions 45a and 45b of the organic passivation film 45 are exposed using a photomask 30.

Referring to FIGS. 3A and 3B, the exposed via hole portions 45a and 45b of the organic passivation film 45 are developed and removed to form an organic passivation film pattern 45c. Afterwards, the gate insulating film 42 placed below the removed via hole portions 45a and 45b is dry-etched using the organic passivation film pattern 45c as an etch mask to form the first via hole 46 for exposing the data wiring 44 and the second via hole 47 for exposing the gate wiring 42. At this time, the inorganic insulating film is side-etched and thereby an undercut "A" is generated beneath the organic passivation film pattern 45c.

Likewise, in the case that the data wiring 44 is formed of a material having a high consumptive rate, such as molybdenum (Mo) or MoW, the data wiring 44 is side-etched at an edge of the first via hole 46 and thus the undercut "A" is generated beneath the organic passivation film pattern 45c. At the same time, the data wiring 44 is consumed by a predetermined thickness at the bottom "B" of the first via hole 46.

Referring to FIGS. 4A and 4B, after depositing a reflection metal film such as aluminum (Al) on the organic passivation film pattern 45c in which the first and second via holes 46 and 47 are formed, the deposited reflection metal film is patterned by a photolithography process to form the pixel electrode 48, which is connected to the data wiring 44 through the first via hole 46, and the pad electrode 49, which is connected to the gate wiring 42 through the second via hole 47.

At this time, due to the undercut that is formed beneath the organic passivation film pattern 45c, a failure in the coverage of the reflection metal film is generated and thereby an opening failure of the reflection metal film occurs at the bottom of the first and second via holes 46 and 47.

Accordingly, it is inevitably required to resolve this undercut problem. If the undercut problem is not resolved, it is difficult to use the passivation film as a single layer of organic insulating film and thus it becomes impossible to decrease the number of photomask layers that are needed.

SUMMARY OF THE INVENTION

Accordingly, to address the foregoing difficulties, it is a first object of the invention to provide a TFT for an LCD capable of decreasing the number of photomasks needed by forming the passivation film as a single layer.

It is a second object of the invention to provide a method of manufacturing a TFT for a LCD capable of decreasing the number of photomasks needed by forming the passivation film as a single layer.

It is a third object of the invention to provide a method of manufacturing a TFT for a reflection and transmission type LCD capable of enhancing a boundary characteristic between the reflection electrode and the transparent electrode by forming the passivation film as a single layer and using IZO (indium-zinc-oxide) as the transparent electrode.

To accomplish the first object of the invention, there is provided a TFT for a LCD. The TFT includes a gate wiring formed on a substrate including a display region and a pad region positioned outside the display region and extending in a first direction. A gate insulating film is formed on the gate wiring and the substrate to partially expose the gate wiring. An active pattern is formed on the gate insulating film. A data wiring is partially overlapped with the active pattern, and is formed on the gate insulating film and extends in a second direction perpendicular to the first direction. An organic passivation film pattern is formed on the data wiring and the gate insulating film. The organic passivation film pattern includes a first via hole for partially exposing the data wiring and a second via hole for exposing the partially exposed gate wiring. A pixel electrode is formed on the organic passivation film pattern and is connected to the data wiring through the first via hole on the data wiring. A pad electrode is formed on the organic passivation film pattern and is connected to the gate wiring through the second via hole. The gate insulating film is protruded inwardly relative to the organic passivation film pattern at a bottom edge of the second via hole.

To accomplish the second object of the invention, there is provided a method for manufacturing a TFT for a LCD. In the above method, gate wiring is formed to extend in a first direction on a substrate including a display region and a pad region positioned at an outer portion of the display region. A data wiring is formed to extend in a second direction perpendicular to the first direction on the gate wiring with a gate insulating film interposed between the gate wiring and the data wiring. An organic passivation film is formed on the data wiring and the gate insulating film. The organic passivation film is patterned such that the slope of the organic passivation film decreases as it travels to an edge where a via hole is being formed, to form an organic passivation film pattern. The gate insulating film is etched by using the organic passivation film pattern as a mask to form a first via hole for exposing the data wiring and a second via hole for exposing the gate wiring. An undercut placed beneath the organic passivation film pattern is removed. A pixel electrode is formed to be connected to the data wiring through the first via hole and a pad electrode is formed connected to the gate wiring through the second via hole on the organic passivation film pattern.

To accomplish the third object of the invention, there is provided a method for manufacturing a TFT for a LCD. In the above method, gate wiring is formed to extend in a first direction on a substrate including a display region and a pad region placed at an outer portion of the display region. The gate wiring includes a gate line having a gate electrode formed within the display region and a gate pad formed at the pad region and connected to an end of the gate line. A gate insulating film is formed on the gate wiring and the substrate. An active pattern is formed on the gate insulating film. A data wiring is formed to extend in a second direction perpendicular to the first direction on the gate insulating film. The data wiring includes a first electrode overlapped with a first region of the active pattern and a second electrode overlapped with a second region facing the first region. An organic passivation film is formed on the data wiring and the gate insulating film. The organic passivation film is patterned such that the slope of the organic passivation film decreases as it travels to an edge of a portion where a via hole is being formed, to form an organic passivation film pattern. The gate insulating film is etched by using the organic passivation film pattern as a mask, to form a first via hole for exposing the first electrode and a second via hole for exposing the gate pad. An undercut beneath the organic passivation film pattern is removed. A pixel electrode is formed to be connected to the first electrode through the first via hole and a pad electrode is formed to be connected to the gate pad through the second via hole on the organic passivation film pattern.

To accomplish the third object of the invention, there is provided a method for manufacturing a TFT for a reflection and transmission type LCD. In the above method, a gate wiring is formed to extend in a first direction on a substrate including a display region and a pad region placed outside the display region. A data wiring is formed to extend in a second direction perpendicular to the first direction on the gate insulating film with a gate insulating film interposed between the gate wiring and the data wiring. A passivation film is formed on the data wiring and the gate insulating film. The passivation film has a first via hole for exposing the data wiring and a second via hole for exposing the gate wiring. A transparent electrode layer made of IZO and a reflection electrode layer are deposited in the order named on the first and second via holes and the passivation film. A photoresist pattern is formed on the reflection electrode layer such that the photoresist pattern remains thicker in the reflection region than in the transmission region. The reflection electrode layer and the transparent electrode layer are wet-etched at the same time using the photoresist pattern as a mask. The photoresist pattern is removed by a predetermined thickness such that the reflection electrode layer of the transmission region is exposed. The reflection electrode layer of the transmission region is removed by a dry-etch. The photoresist pattern is removed to form a transparent electrode and a reflection electrode enclosing the transparent electrode.

According to the first embodiment of the present invention, a passivation film made of an organic insulating film is once exposed using a photomask having a partial exposure pattern formed in a slit structure, or made of semi-transparent material at an edge portion of a via hole, to form an organic passivation film pattern such that the slope of the organic passivation film decreases as it travels to an edge where the via hole is being formed. Afterwards, a dry-etch process is performed by using the organic passivation film pattern as an etch mask to form the via hole. Then, in order to remove the organic passivation film pattern, an ashing or plasma dry-etch is performed to remove the undercut beneath the organic passivation film pattern. Thus, as the undercut is removed, a lower film of the organic passivation film pattern is protruded from a bottom edge of the via hole. Therefore, there does not occur a deposition failure in which a metal film deposited during a subsequent process is opened at a stepped portion.

Preferably, if the partial exposure pattern is further formed at a position corresponding to the reflection plate of the pixel region in the photomask, the via hole can be formed by an exposure process using a single photomask and at the same time an irregular surface having a plurality of concave portions and convex portions can be formed. Therefore, in a reflection and transmission composite type LCD or a reflection type LCD, it is possible to reduce the number of photomasks needed from seven sheets to five sheets.

According to the second embodiment of the present invention, an organic passivation film pattern is left at an edge of a via hole region by performing the exposure process twice in succession using two photomasks. Afterwards, the via hole is formed using the organic passivation film pattern and an ashing or plasma dry-etch process is performed to remove the undercut formed beneath the organic passivation film pattern. Therefore, a failure in which a metal film for a pixel electrode is opened at a stepped portion due to a height difference is prevented.

Here, since either one of the two photomasks can be used as an exposure mask for forming an irregular surface in the organic passivation film, in a reflection and transmission composite type LCD or a reflection type LCD, it is possible to reduce the number of photomasks needed from seven sheets to six sheets.

According to the third embodiment of the present invention, since a transparent electrode in a reflection and transmission composite type LCD is formed of IZO instead of ITO, a boundary characteristic between the transparent electrode and the reflection electrode is enhanced and the manufacturing process is simplified. Also, since a passivation film is made of a single layer of an organic insulating film and one end of the transparent electrode is overlapped with a gate wiring and a data wiring such that a reflection electrode is left around the overlapped region, a high aperture ratio for a sufficient light transmission is obtained.

BRIEF DESCRIPTION OF THE DRAWINGS

The above objects and other advantages of the present invention will become more apparent by describing in detail preferred embodiments thereof with reference to the attached drawings in which:

FIGS. 5A to 9B are sectional views describing a method for forming a via hole in accordance with a first embodiment of the present invention;

FIGS. 11A to 11C are sectional views of TFTs for an LCD taken respectively along the lines C–C', D–D' and E–E' in FIG. 10;

DETAILED DESCRIPTION OF THE PREFERRED EMBODIMENTS

Figure 1:
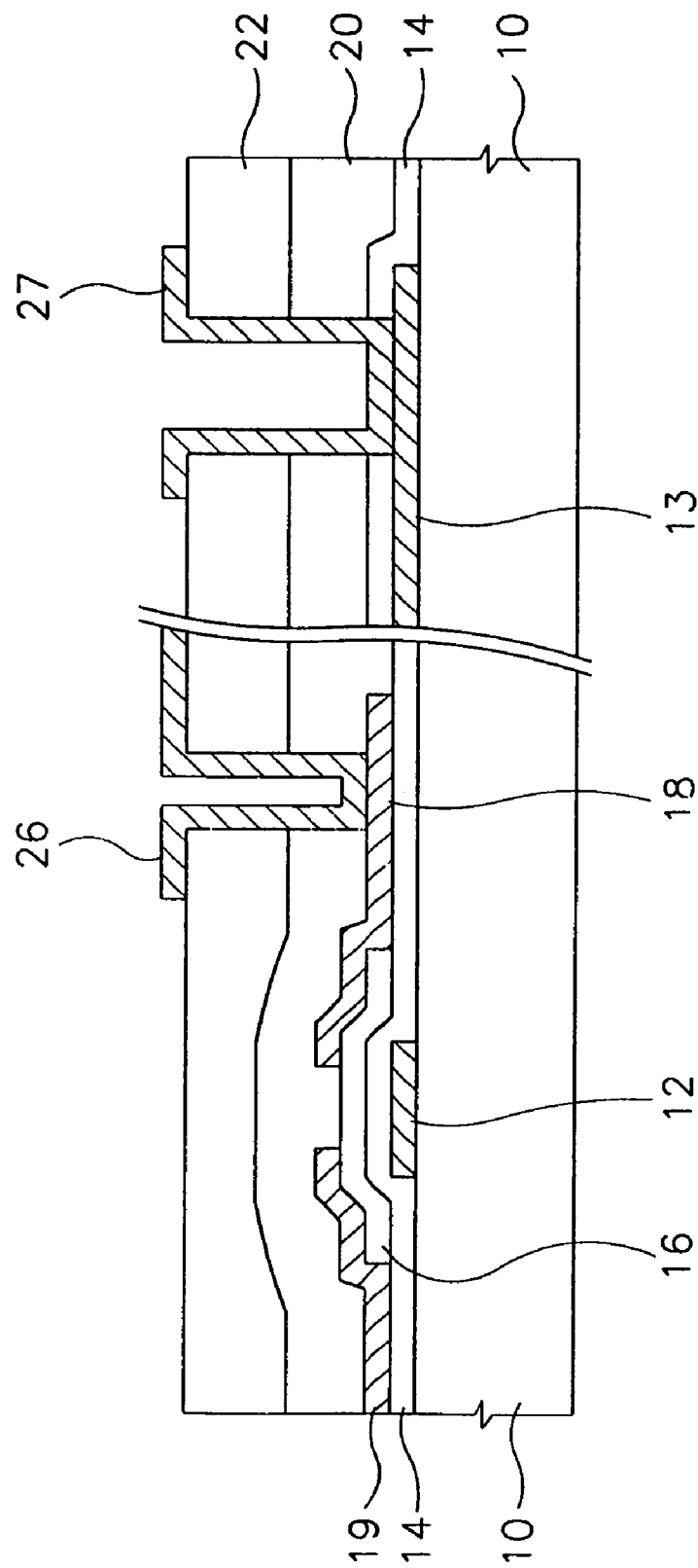
FIG. 1 is a sectional view of a TFT for a conventional reflection type LCD.
Figure 2A:
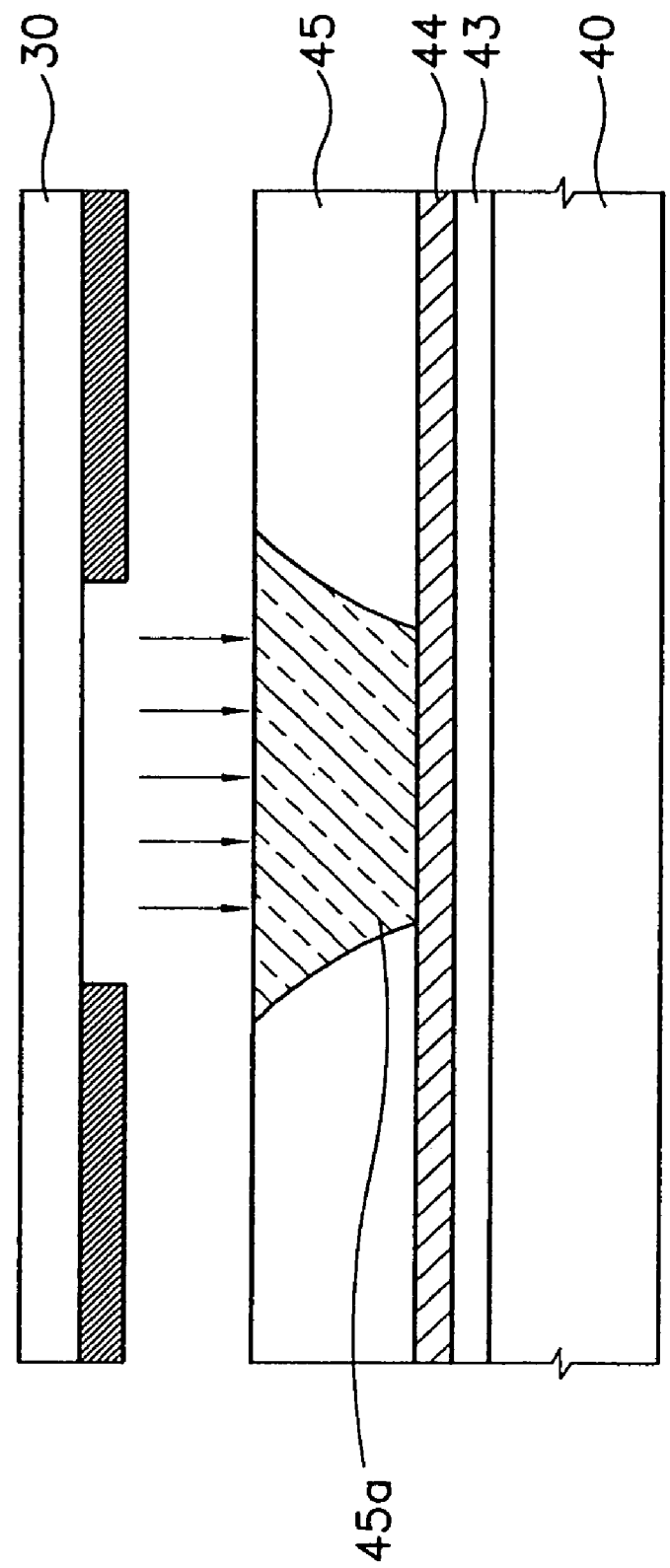
FIGS. 2A to 4B are sectional views describing a method for forming a via hole in a TFT for a reflection type LCD in accordance with conventional art.
Figure 2B:
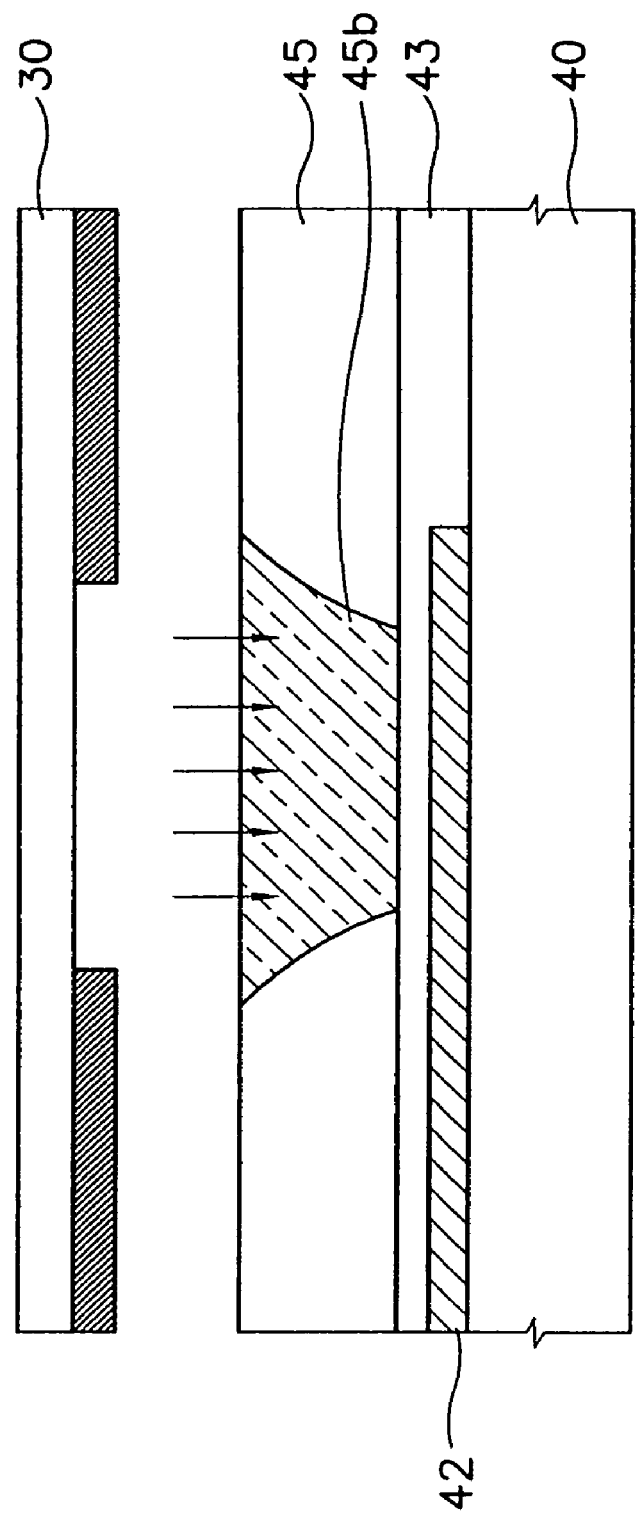
Figure 3A:
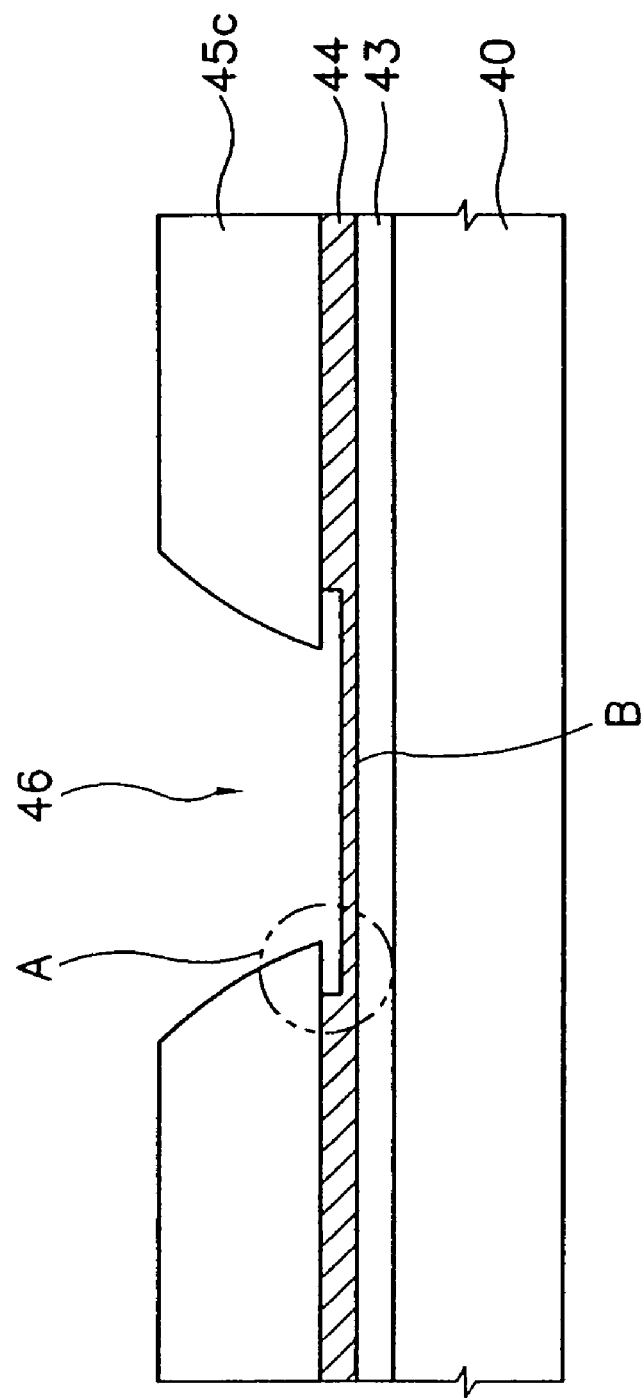
Figure 3B:
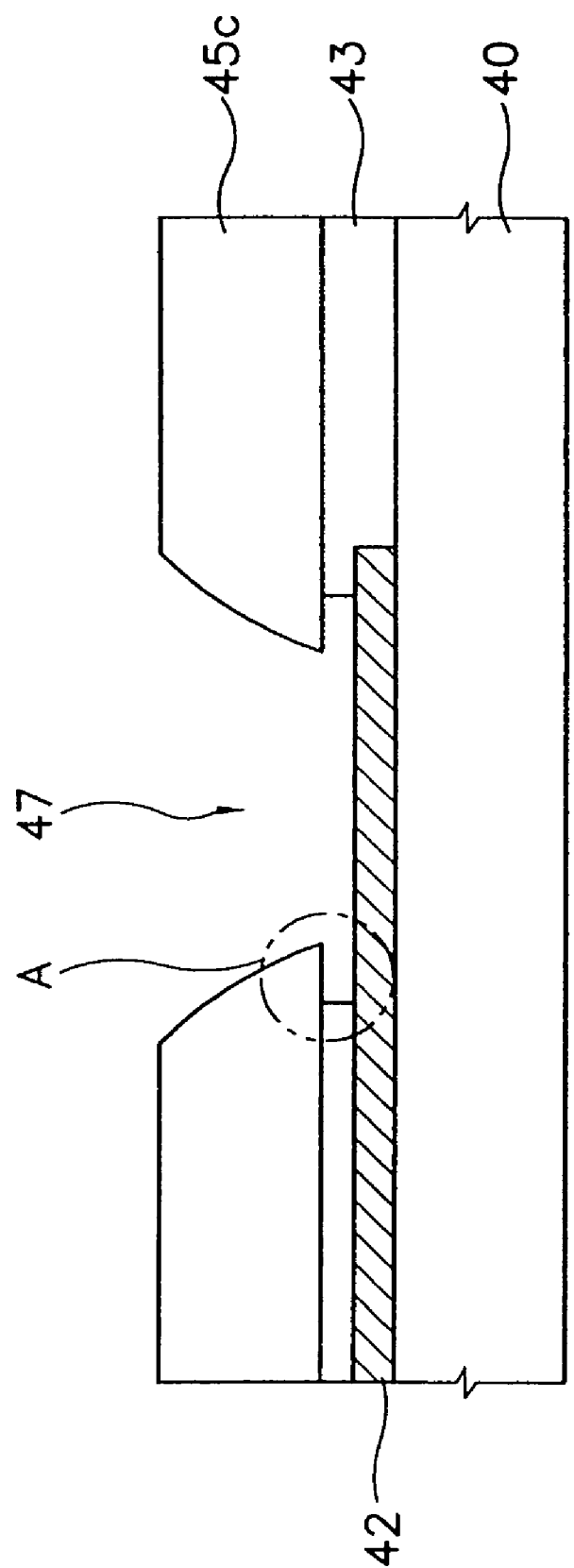
Figure 4A:
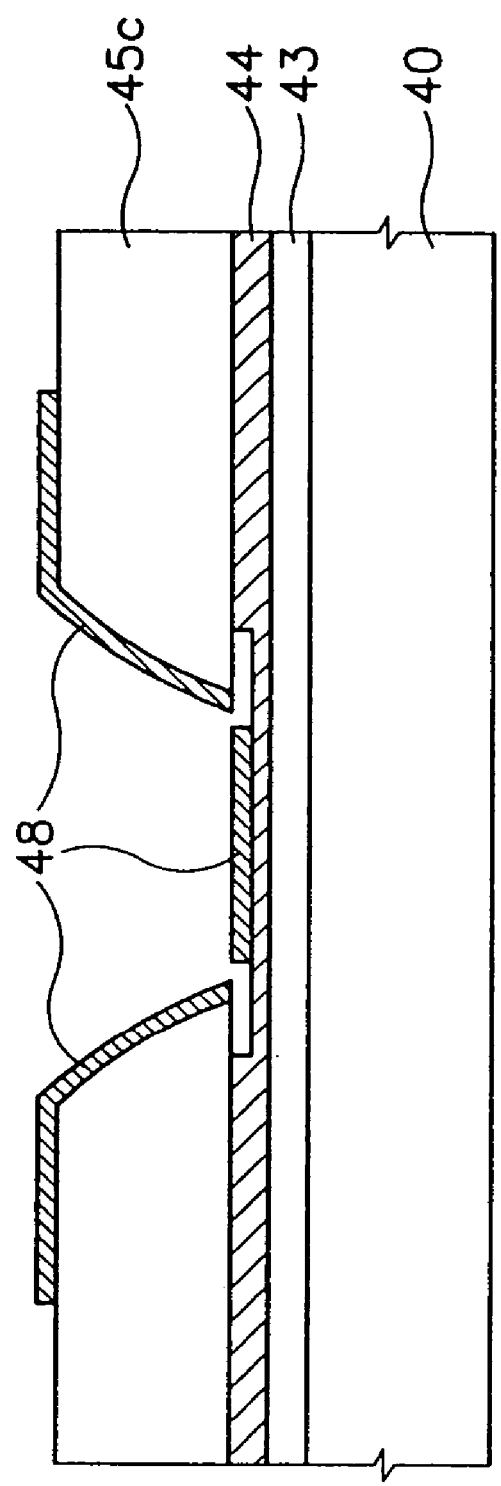
Figure 4B:
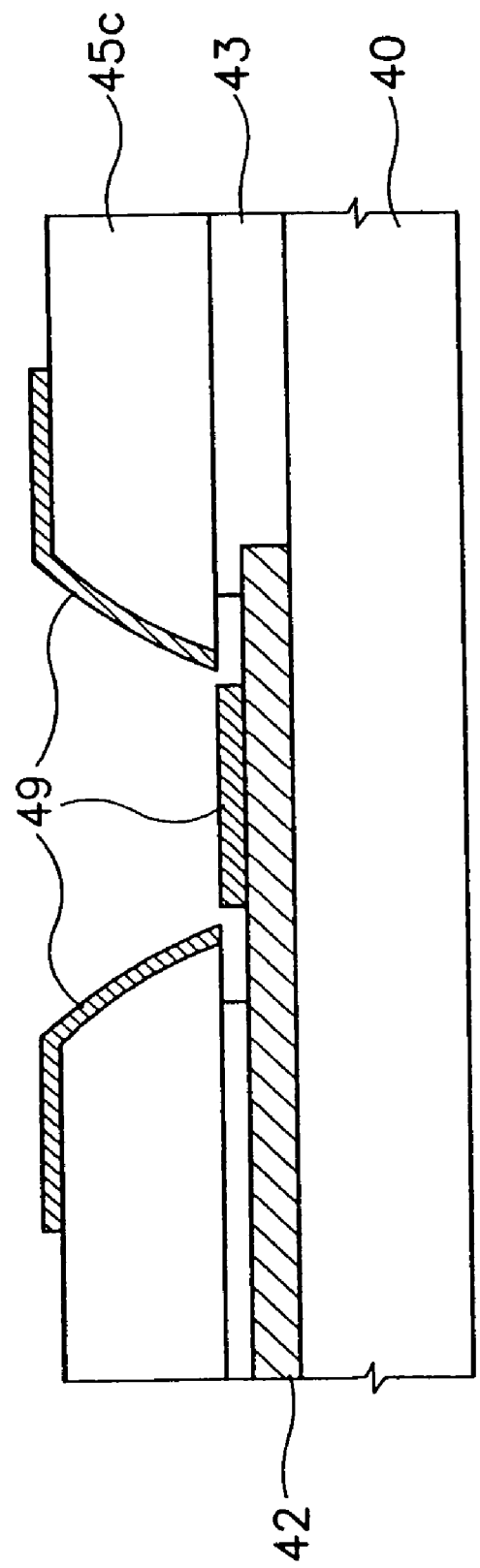

Now, preferred embodiments of the present invention will be described in detail with reference to the drawings.

Embodiment 1

FIGS. 5A to 9B are sectional views describing a method for forming a via hole in accordance with a first embodiment of the present invention, wherein FIGS. 5A, 6A, 7A, 8A and 9A show a part of a pad region in a substrate on which a thin film transistor is formed, and FIGS. 5B, 6B, 7B, 8B and 9B show a part of a display region in the substrate.

Referring to FIGS. 5A and 5B, on a substrate 50 on which a gate wiring 52 made of a first metal film, a gate insulating film 54 made of an inorganic insulating film and a data wiring 56 made of a second metal film are formed in the order named, a photosensitive organic passivation film 58 is deposited to a thickness of about 2 μm or more.

The photosensitive organic passivation film 58 is exposed using a photomask 80 having a partial exposure pattern made in a slit structure, or made of semi-transparent film at an open region of the organic passivation film 58, i.e., at an edge of a via hole region. Then, the organic passivation film 58 is fully exposed at a center portion of the via hole region while it is diffraction-exposed at the edge of the via hole region by a slit. Preferably, the partial exposure pattern is formed in the shape of an open pattern having a line width corresponding to half of the resolution of an exposure machine. In addition, in the case of a reflection and transmission composite type LCD or a reflection type LCD, an exposure process using a separate photomask is not performed and the partial exposure pattern is formed to correspond to the reflection plate of a pixel part, so that it is possible to form an irregular surface having a plurality of concave portions and convex portions for light scattering at the organic passivation film.

Next, the exposed organic passivation film 58 is developed to form an organic passivation film pattern 58a. The organic passivation film pattern 58a comes to have a low slope at an edge of the via hole region. Then, the organic passivation film pattern 58a has a first via hole 59 (see FIG. 6B) for partially exposing the data wiring 56 and a second via hole 61 (see FIG. 6A) for partially exposing the gate wiring 52.

Figure 6A:
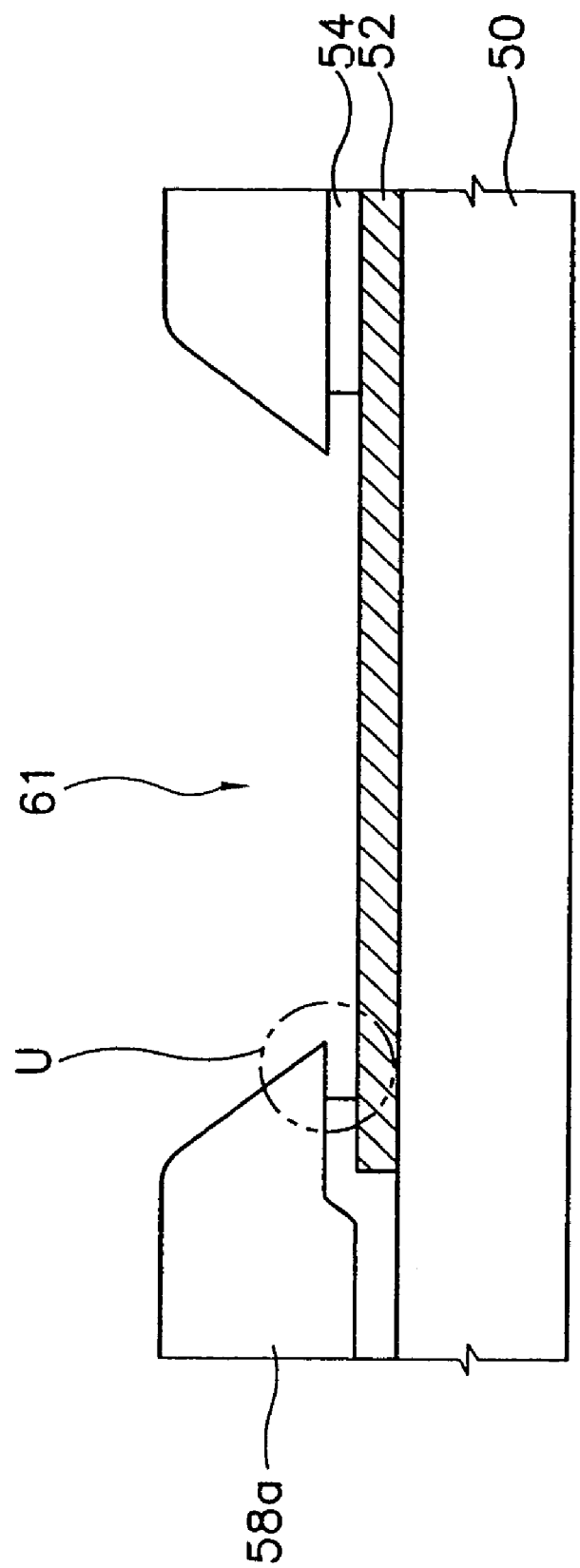

That is, referring to FIGS. 6A and 6B, using the organic passivation film pattern 58a as an etch mask, the gate insulating film 54 disposed beneath the organic passivation film pattern 58a is dry-etched to form the first via hole 59 for exposing the data wiring 56 and a second via hole 61 for exposing the gate wiring 52. At this time, the gate insulating film 54 made of inorganic insulating material is side-etched and thereby an undercut is generated beneath the organic passivation film pattern 58a. Likewise, in case that the data wiring is made of a material having a high consumptive property such as molybdenum (Mo) or MoW, the data wiring 56 is side-etched and thus an undercut (U) is generated beneath the organic passivation film pattern 58c. At the same time, the data wiring 56 is consumed by a predetermined thickness at the bottom surface of the first via hole 59 (M).

Figure 7A:
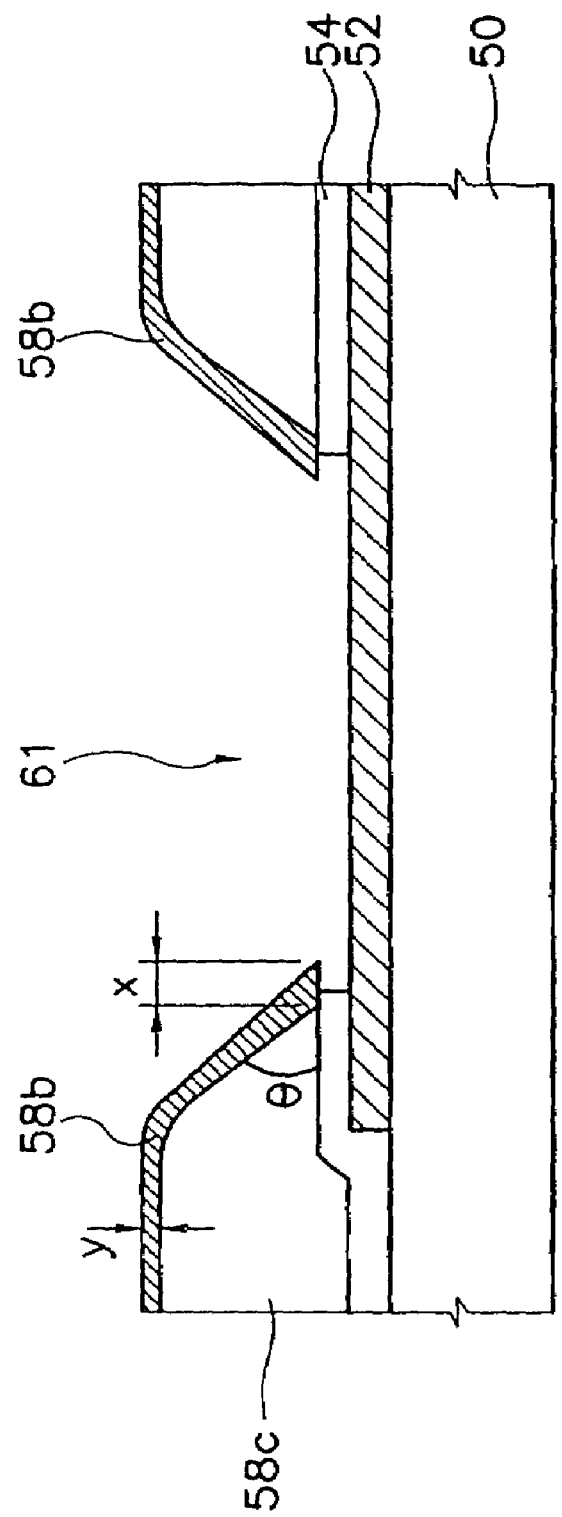
Figure 7B:
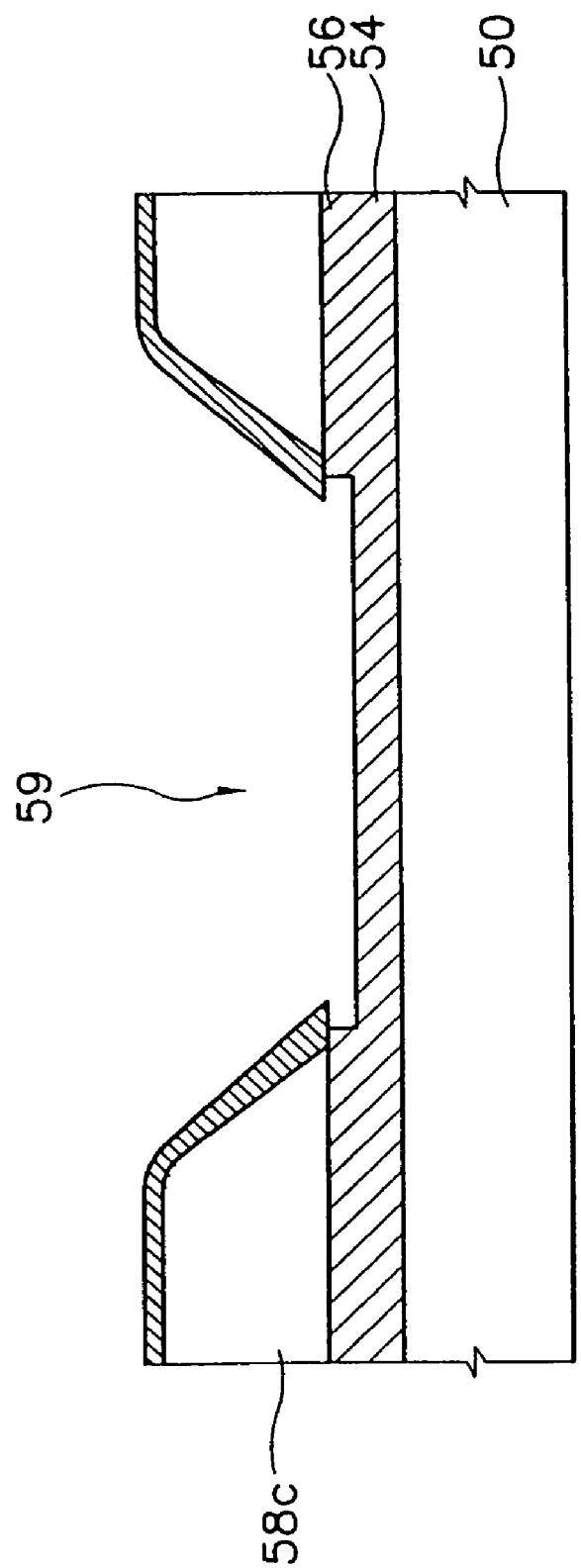

Referring to FIGS. 7A and 7B, the ashing of the organic passivation film pattern 58a is performed to remove the organic passivation film pattern 58a by a selected thickness 58b from its surface to a selected depth in horizontal and vertical directions. As a result, the undercut (U) (see FIGS. 6A and 6B) is removed. Here, a plasma dry-etch method may be used instead of the ashing.

At this time, since the organic passivation film pattern 58c formed at the edge of the via hole by the diffraction exposure has a low slope, although an amount of the ashing is small, a horizontal retrocession of the organic passivation film pattern 58a becomes large. In other words, when it is assumed that the slope angle of the organic passivation film pattern 58c at the edge of the via hole is θ and a vertical retrocession distance of the organic passivation film pattern is y, the horizontal retrocession distance of the organic passivation film pattern 58c, x becomes (y/tan θ). Thus, since there is no need of an over-ashing in order to remove the undercut, a problem in that convex portions of the surface of the organic passivation film within the pixel region collapses does not occur.

If the aforementioned ashing process is completed, the gate insulating film 54 is protruded from a bottom edge S1 of the second via hole 61 relative to the organic passivation film pattern 58c as shown in FIG. 8A. Likewise, the data wiring 56 is protruded from another bottom edge S2 of the second via hole 61 relative to the organic passivation film pattern 58c as shown in FIG. 8B.

Figure 9A:
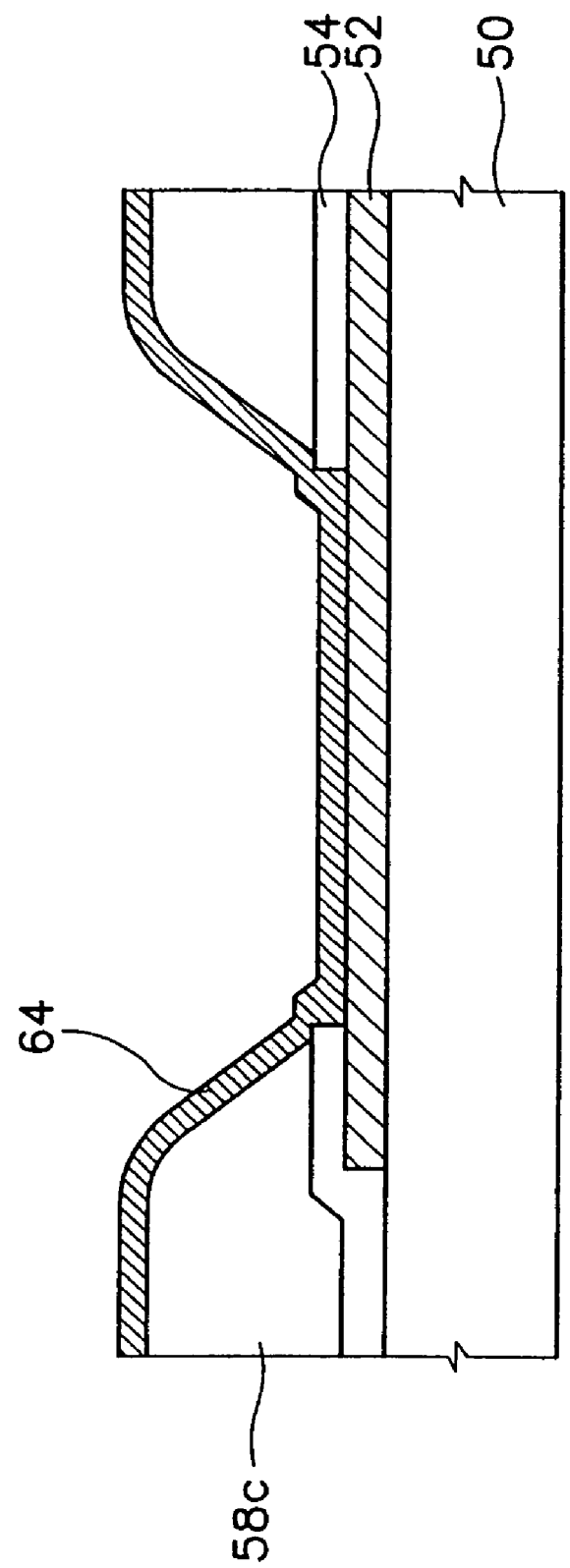
Figure 9B:
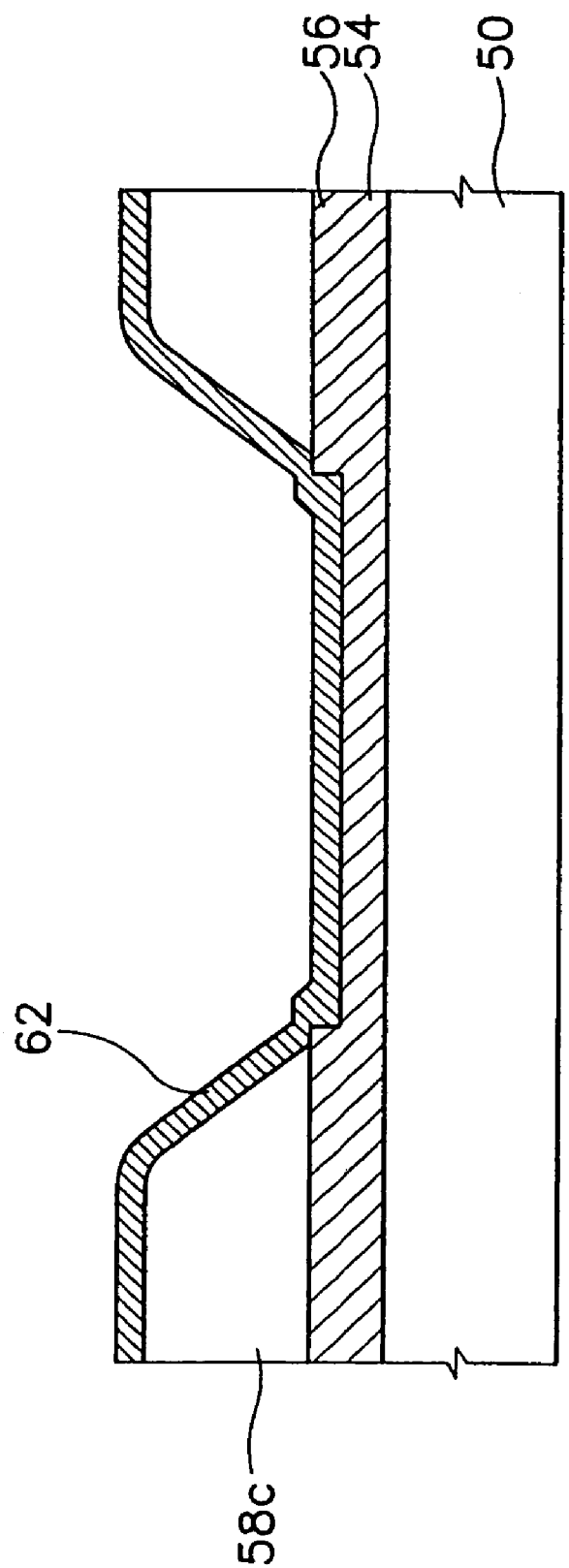

Referring to FIGS. 9A and 9B, in a state where the underlying film of the organic passivation film pattern 58c is protruded from the bottom edges of the via hole, a reflection metal film such as aluminum (Al) is deposited on the resultant structure and then patterned by a photolithography process. As a result, there are formed a pixel electrode 62, which is connected to the data wiring 56 through the first via hole 59, and a pad electrode 64, which is connected to the gate wiring 52 through the second via hole 61. Here, since the reflection metal film is deposited in a state that the undercut placed beneath the organic passivation film pattern 58c, it has good step coverage at the stepped portion.

Figure 10:
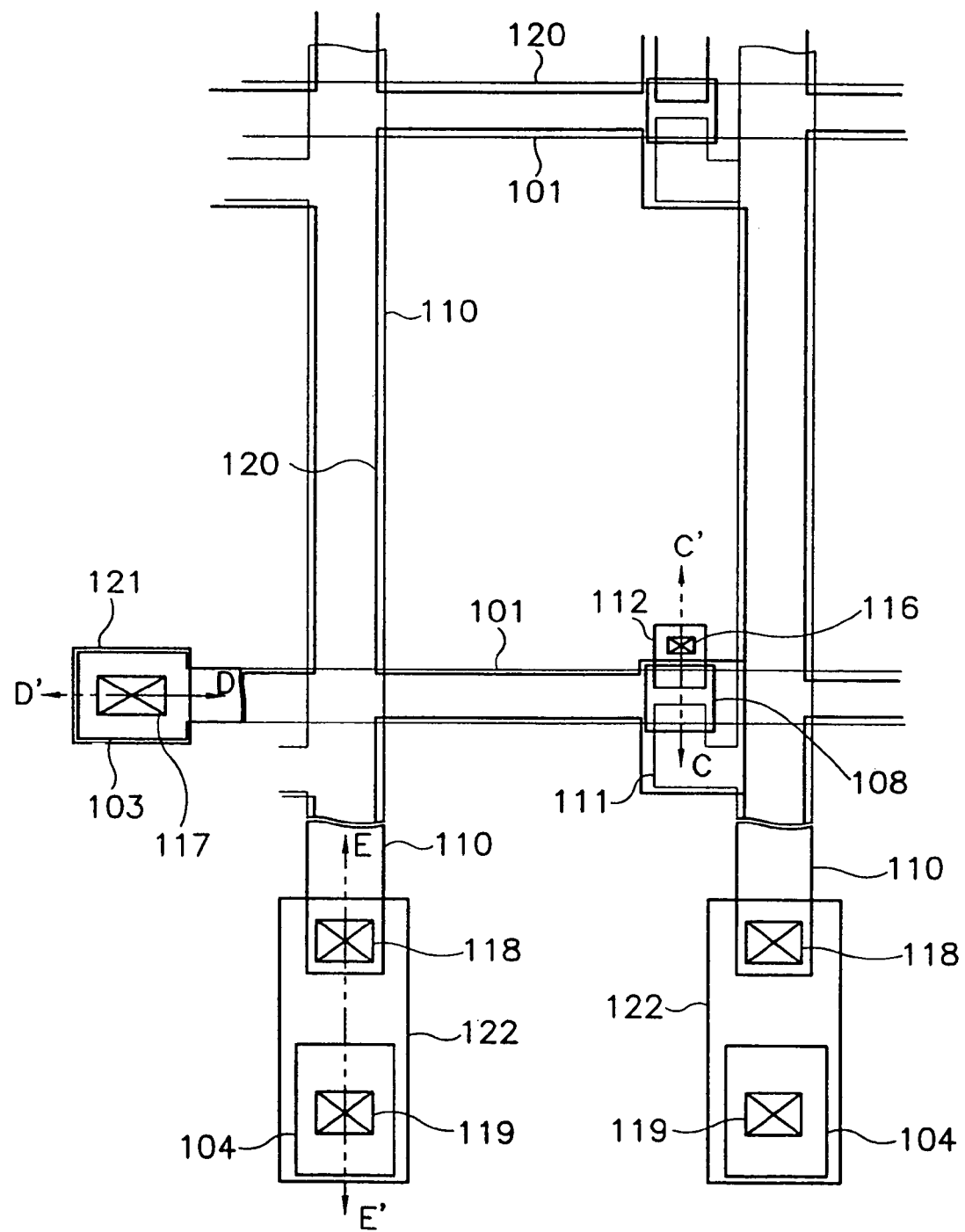
FIG. 10 is a plan view of a TFT for a reflection type LCD capable of applying to the first embodiment of the present invention.
Figure 11B:
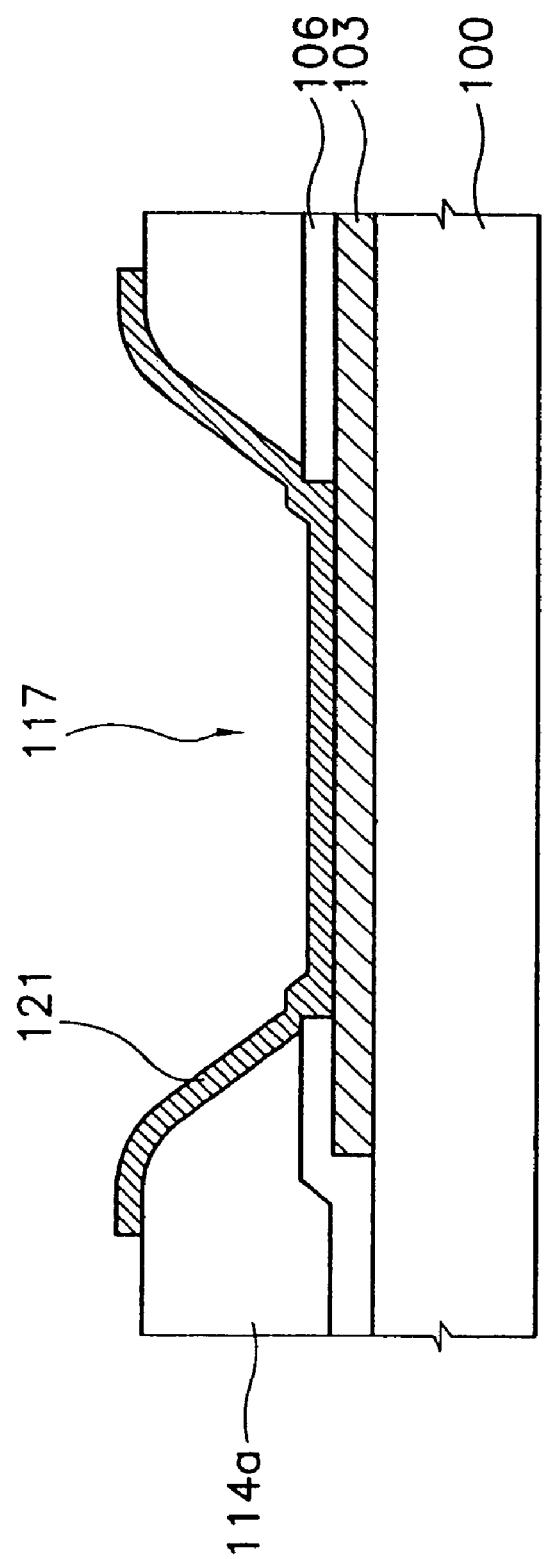

FIG. 10 is a plan view of a TFT for the reflection type LCD capable of applying to the first embodiment of the present invention. FIGS. 11A to 11C are sectional views of TFTs for a LCD taken respectively along the lines C–C', D–D' and E–E' in FIG. 10.

Referring to FIG. 10 and FIGS. 11A to 11C, a gate wiring is formed on a transparent substrate 100. The gate wiring is formed in the form of a single layered metal film or a double layered metal film selected from a group consisting of chromium (Cr), aluminum (Al), an alloy of molybdenum and tungsten (MoW). The gate wiring includes a gate line 101 extending in a first direction (or horizontal direction), a gate pad 103 connected to one end of the gate line 101, for receiving scanning signals from the outside and transferring the received scanning signals to the gate line 101, and a gate electrode 102, which is a part of the gate line 101.

On the gate wiring and the substrate 100, there is formed a gate insulating film 106 made of an inorganic insulating material. An active pattern 108 made of a semiconductor film such as amorphous silicon is formed on the gate insulating film 106

On the active pattern 108 and the gate insulating film 106, there is formed a data wiring 110 extending to a second direction (or vertical direction) which is perpendicular to the first direction. The data wiring 110 includes a first electrode (hereinafter referred to as "source electrode") 112 overlapped with a first region of the active pattern 108, and a second electrode (hereinafter referred to as "drain electrode") 111 overlapped with a second region facing the first region of the active pattern 108. In the aforementioned conventional LCD, the data pad for transmitting an image signal is formed from the same layer as the data wiring, but, in the present embodiment, the data pad is formed together with the gate wiring. In other words, the data pad 104 and the gate wiring are formed from the same layer.

On the data wiring 110, active pattern 108 and gate insulating film 106, there is formed an organic passivation film pattern 114a having a first via hole 116 for exposing the source electrode 112 and a second via hole 117 for exposing the gate pad 103. In the display region, which consists of a plurality of unit pixels to display an image, the upper surface of the organic passivation film pattern 114a is formed in an irregular structure having a plurality of concave portions and convex portions for the light scattering.

On the organic passivation film pattern 114a are formed a pixel electrode 120, which is connected to the source electrode 112 through the first via hole 116 and a pad electrode 121, which is connected to the gate pad through the second via hole 117. The pixel electrode 120 functions to receive an image signal from the TFT and generate an electric field together with the electrode of the upper substrate (not shown). The pixel electrode 120 is formed within a pixel region defined by the gate line and the data wiring 110, and its edge portion is overlapped with the gate line 101 and the data wiring 110 so as to secure a high aperture ratio.

In addition, according to the present embodiment, since the data pad 104 is formed from a different layer from the data wiring 110, there is required a bridge electrode 122 for connecting the data wiring 110 and the data pad 104 electrically. For this requirement, a third via hole 118 for exposing an end of the data wiring 110 and a fourth via hole 119 for exposing the data pad 104 are formed in the organic passivation film pattern 114a when forming the first and second via holes 116 and 117. Then, the bridge electrode 122 is formed from the same layer as in the pixel electrode 120. The bridge electrode 122 electrically connects one end of the data wiring 110 and the data pad 104 to each other.

Figure 12B:
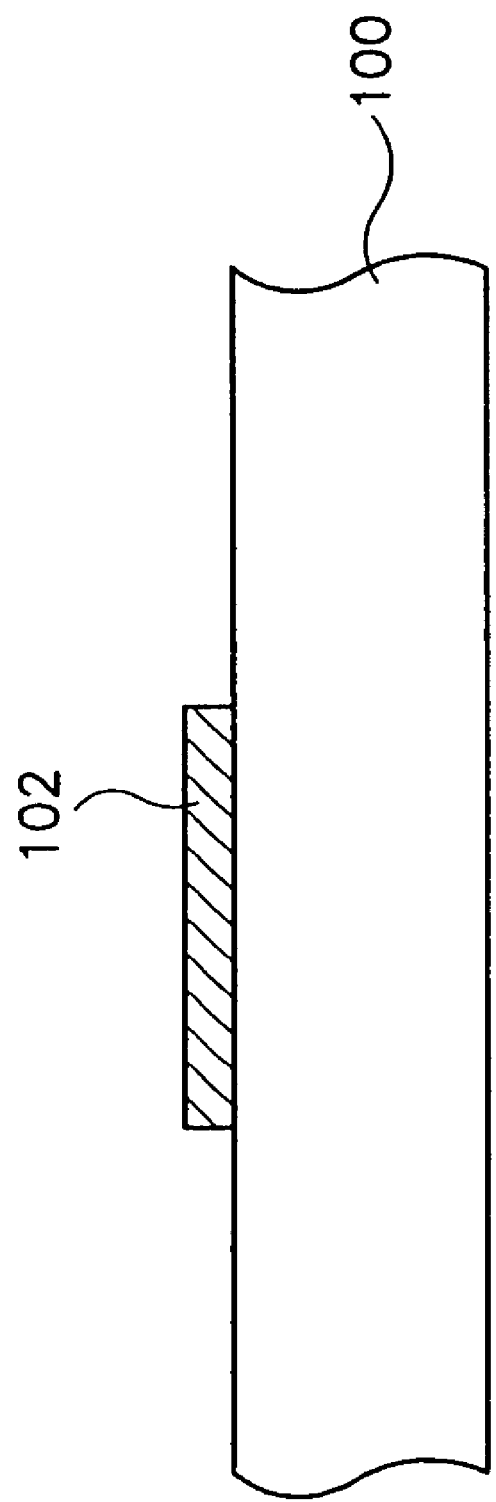
FIGS. 12A to 17B are plan views and sectional views for describing a method for manufacturing a TFT for a reflection type LCD capable of applying to the first embodiment of the present invention.

FIGS. 12A to 17B are plan views and sectional views for describing a method for manufacturing a TFT for a reflection type LCD capable of applying to the first embodiment of the present invention. Specifically, FIG. 12A is a plan view of a substrate on which a gate wiring is formed, and FIG. 12B and FIG. 12C are sectional views taken along the lines 12b–12b' and 12c–12c', respectively.

After depositing a single layered metallic film or a double layered metallic film such as chromium (Cr), aluminum (Al), molybdenum (Mo) or an alloy of Mo and tungsten (W) as a gate film on a transparent substrate 100 made of glass, quartz, or sapphire, the gate film is patterned using a photolithography process to form a gate wiring (using a first mask). The gate wiring includes a gate line 101 extending in a first direction (or horizontal direction), a gate electrode 102, which is a part of the gate line 101, and a gate pad 103 connected to one end of the gate line 101 and formed at the pad region. In addition, according to the present embodiment, there is formed a data pad 104 for transmitting an image signal to thin film transistors together when forming the gate wiring.

Preferably, the gate film is made of chromium (Cr) or MoW containing 30 wt % or more of tungsten (W) in order to form a rigid pad.

Figure 13B:
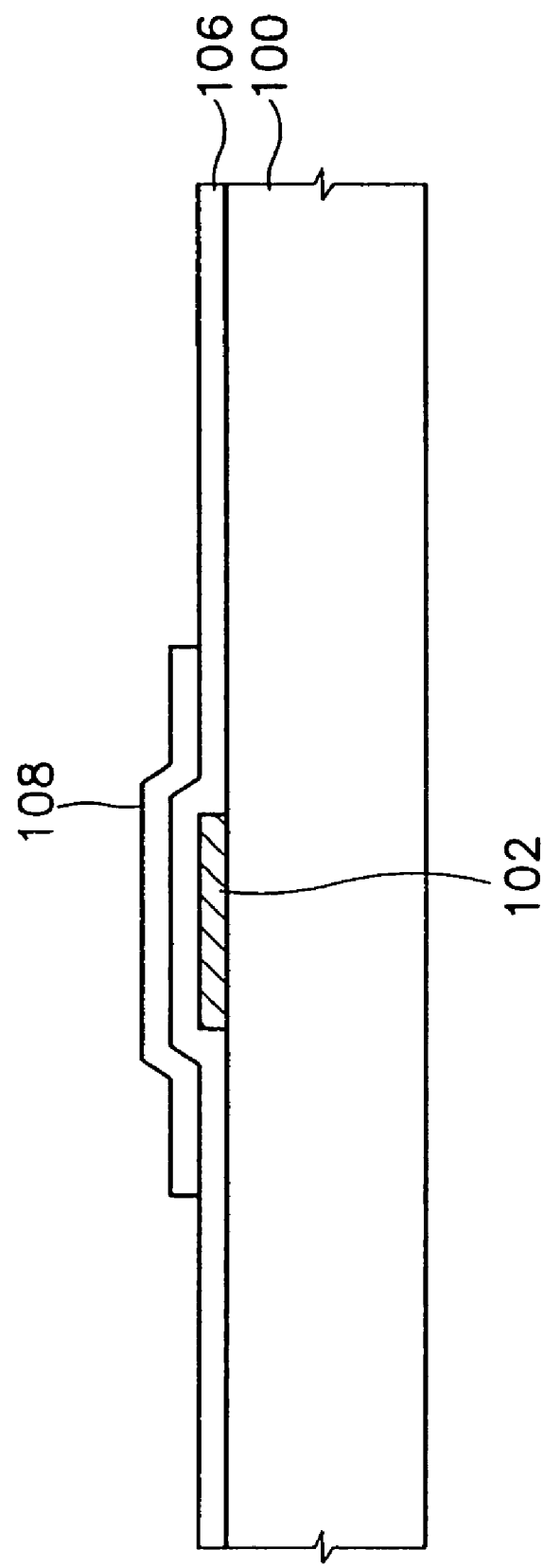
Figure 13C:
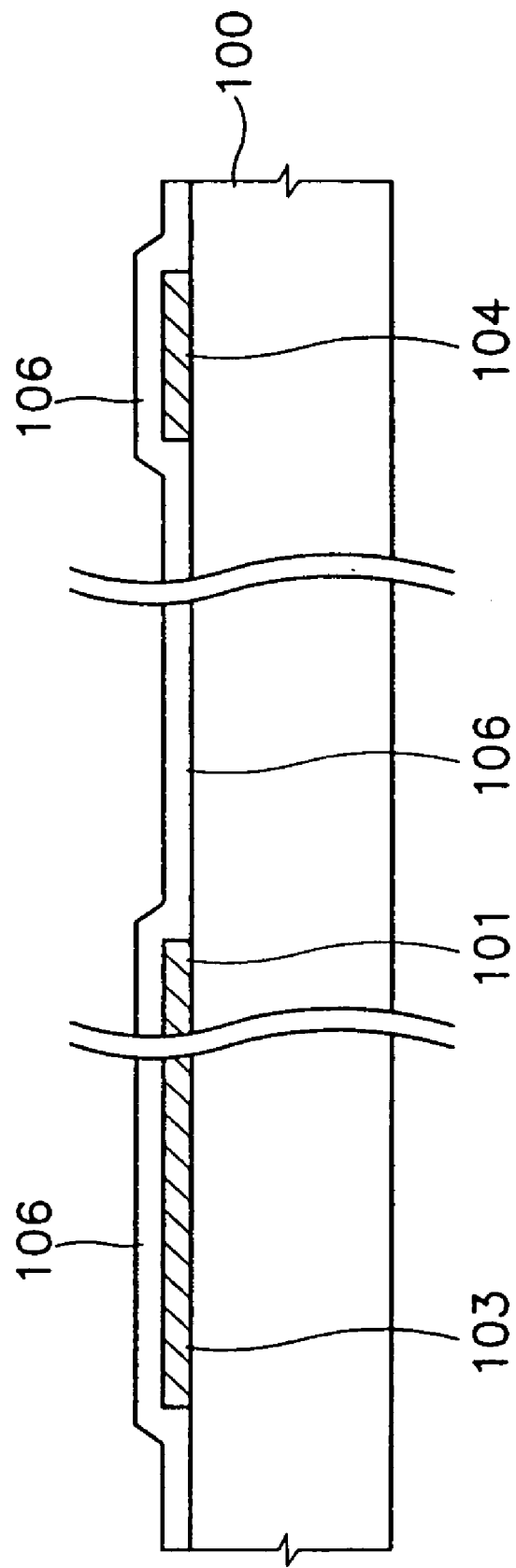

FIG. 13A is a plan view on which an active pattern 108 is formed, and FIGS. 13B and 13C are sectional views taken along the lines 13b–13b' and 13c–13c' of FIG. 13A.

A gate insulating film 106 made of an inorganic insulating film such as silicon nitride is formed to a thickness of about 4,500 Å on the substrate 100 on which the gate wiring is formed. A semiconductor film made of amorphous silicon is deposited on the gate insulating film 106 and then patterned using a photolithography process to form an active pattern 108 of a thin film transistor (using a second mask).

Figure 14A:
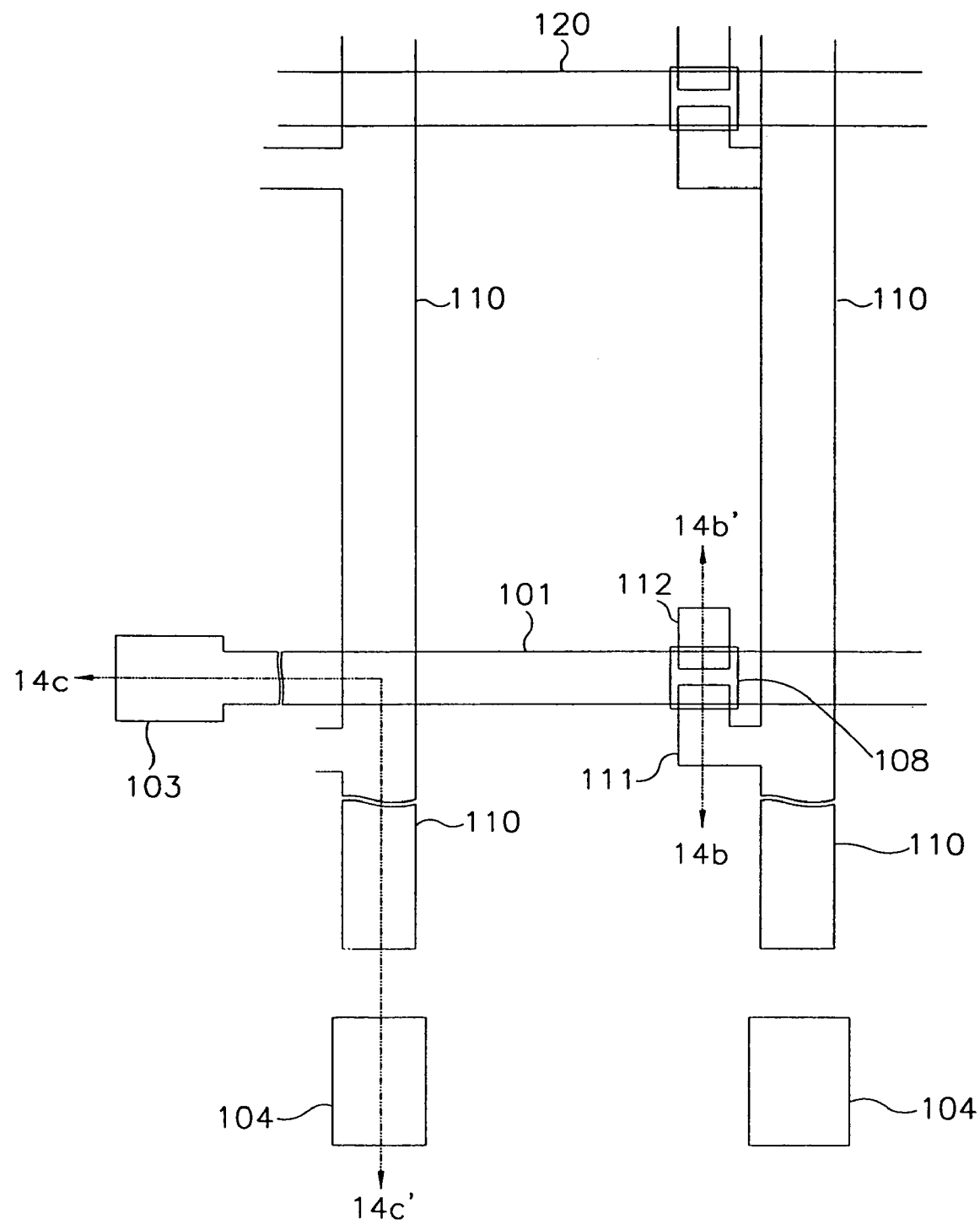

FIG. 14A is a plan view of a substrate on which the data wiring 110 is formed, and FIGS. 14B and 14C are sectional views taken along the lines 14b–14b' and 14c–14c' of FIG. 14A. After depositing a metal film such as molybdenum (Mo), an Mo-based alloy of MoW, or chromium (Cr) on the active pattern 108 and the gate insulating film 106, the deposited metal film is patterned using a photolithography process to form the data wiring 110 (using a third mask). The data wiring 110 extends in the second direction (or vertical direction), which is perpendicular to the gate wiring, and it includes the source electrode 112 overlapped with the first region of the active pattern 108 and the drain electrode 111 overlapped with the second region, which is opposite to the first region.

While the present embodiment shows and describes that the active pattern 108 and the data wiring 110 are formed by a double photolithography process, the active pattern 108 and the data wiring may be formed by one photolithography process. In other words, after subsequently depositing the semiconductor film for the active pattern and the metal film for the data wiring on the gate insulating film, a photoresist film is coated on the metal film. Afterwards, the photoresist film is exposed and developed to form a photoresist pattern having a first portion positioned on the channel region of the TFT and having a first thickness, a second portion positioned on the data wiring and having a thickness thicker than the first thickness, and a third portion where the photoresist film is completely removed. Thereafter, the metal film and semiconductor film beneath the third portion, the metal film beneath the first portion, and the second portion are etched by a predetermined thickness to form the data wiring made of the metal film and the active pattern made of the semiconductor film. Then, the remaining photoresist pattern is removed. Thus, the active pattern 108 and the data wiring 110 can be formed at the same time that needs a photolithography process using only one photomask.

Figure 15A:
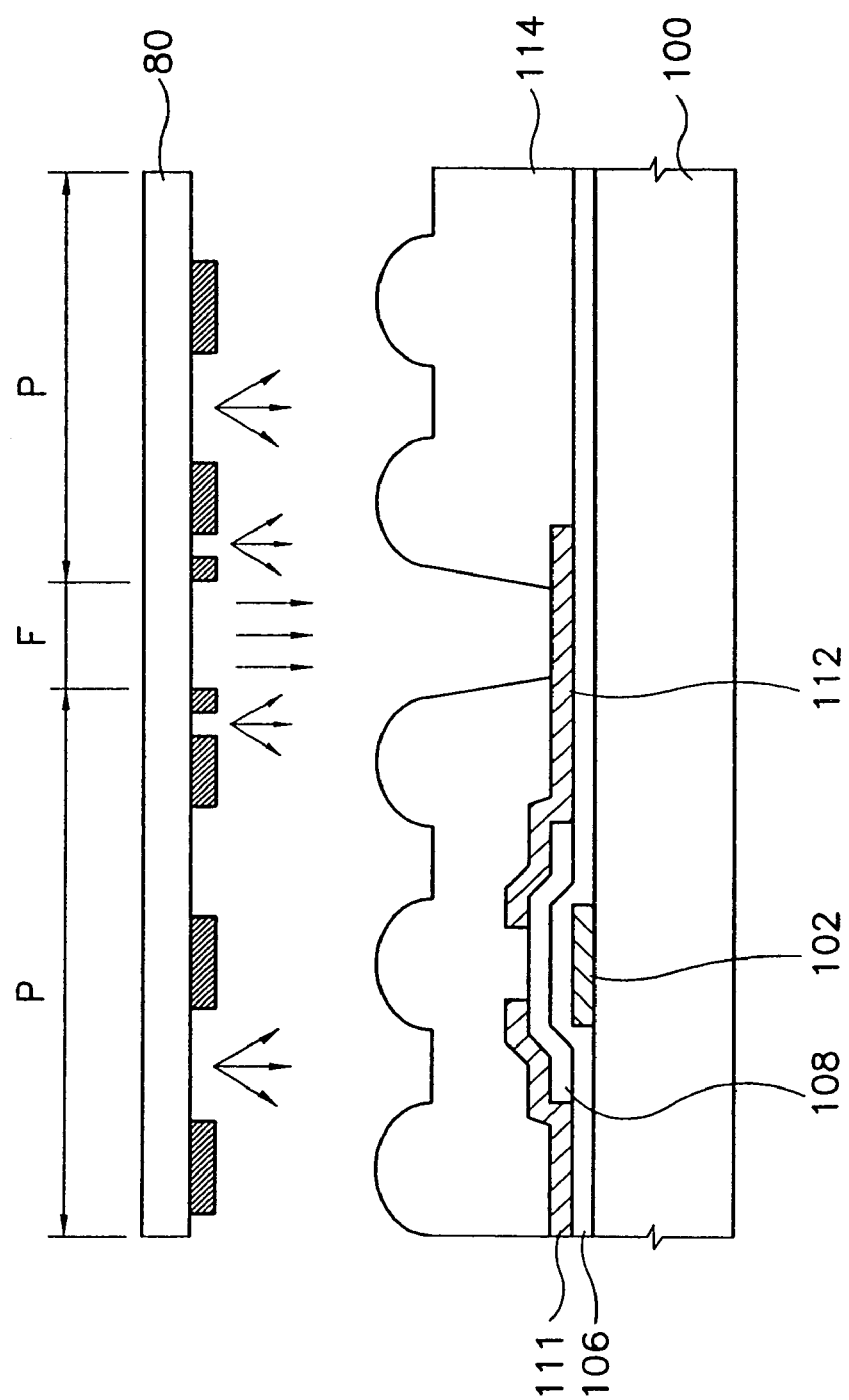

FIGS. 15A and 15B are sectional views taken along the lines 14b–14b' and 14c–14c' of FIG. 14A, respectively and they show a process for exposing an organic passivation film 114. After depositing a photosensitive organic passivation film 114 on the data wiring 110 and the active pattern 108 to a thickness range of about 2–4 μm, the photosensitive organic passivation film 114 is exposed using a photomask 150 (using a fourth mask). At this time, the photomask 150 includes a partial exposure pattern (F) formed at a portion corresponding to the via hole region (alternatively, formed on the source electrode, on the gate pad, on the data pad, and on the end of the data wiring), and a partial exposure pattern (P) formed at a portion corresponding to an edge portion of the via hole region. Also, in order to make the reflection plate of the pixel region in the form of a scattering structure, the photomask 150 has a partial exposure pattern even at a portion corresponding to the pixel region. Preferably, the full exposure pattern is an open pattern having a size of the resolution of the exposure machine or more, and the partial exposure pattern is an open pattern having a line width corresponding to half of the resolution of the exposure machine. The partial exposure pattern has a slit structure or a semi-transparent film pattern.

When the organic passivation film 114 is exposed using the photomask 150 and then developed, the organic passivation film is completely removed at the center portion of the via hole region while it is diffraction-exposed at edge portions of the via hole regions by the partial exposure pattern (P), so that a slope of the organic passivation film becomes lowered. Also, a plurality of concave portions and convex portions are formed at the surface of the organic passivation film 114 of the pixel region.

In the present embodiment, when opening the gate pad 103 and the data pad 104 to which chip bumps are bonded, all of the pads are opened not individually but wholly so as to prevent a contact failure from being generated during the bump bonding. At this time, if the data pad is formed from the data wiring, as in the conventional method, when dry-etching the gate insulating film during a subsequent process the gate insulating film placed below the data pad is side-etched to thereby generate the undercut, so that the data pad may be lifted during the bump bonding. Accordingly, in order to open all of the pads wholly, the data pad should be formed from the same layer as the gate wiring.

Figure 16A:
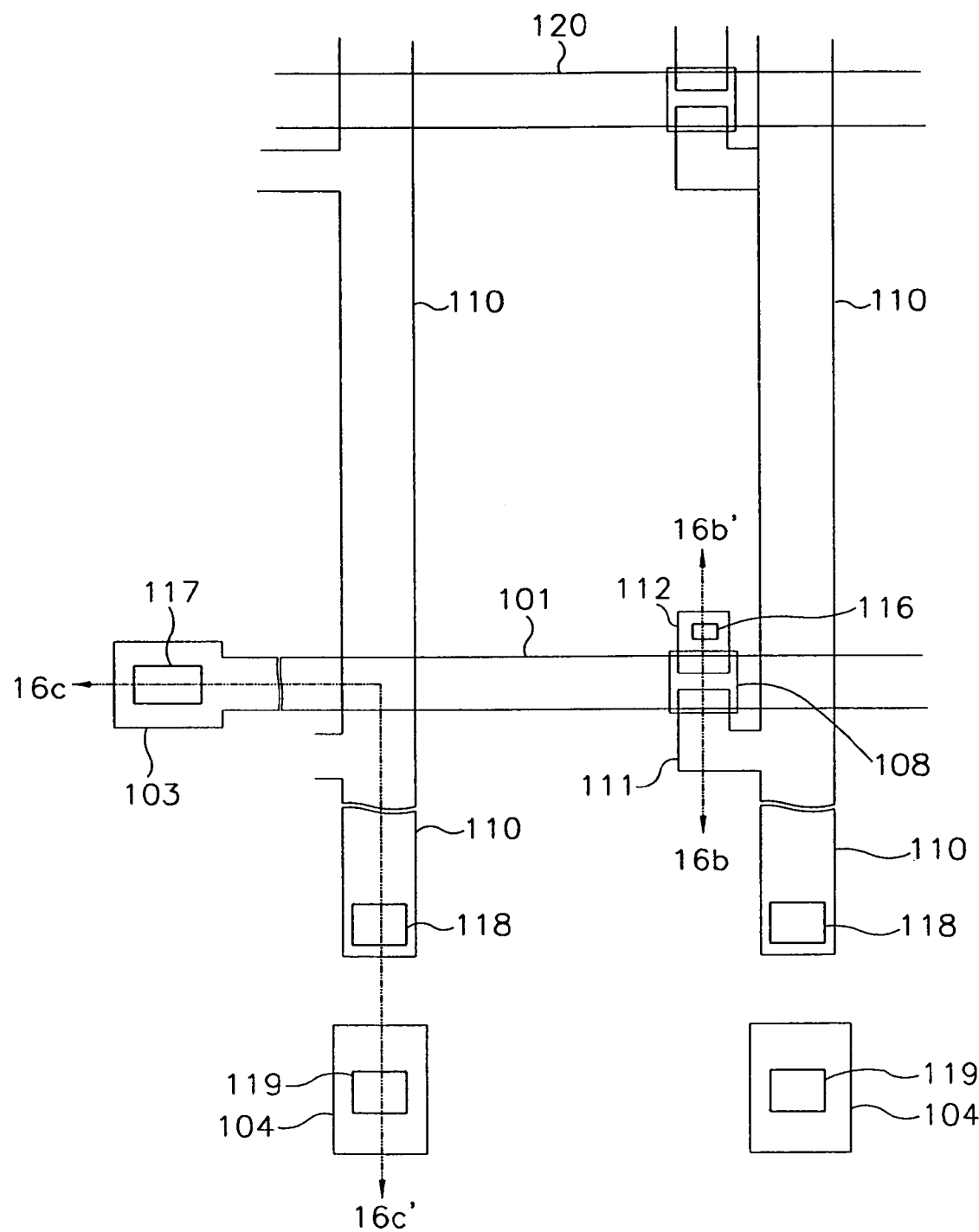
Figure 16B:
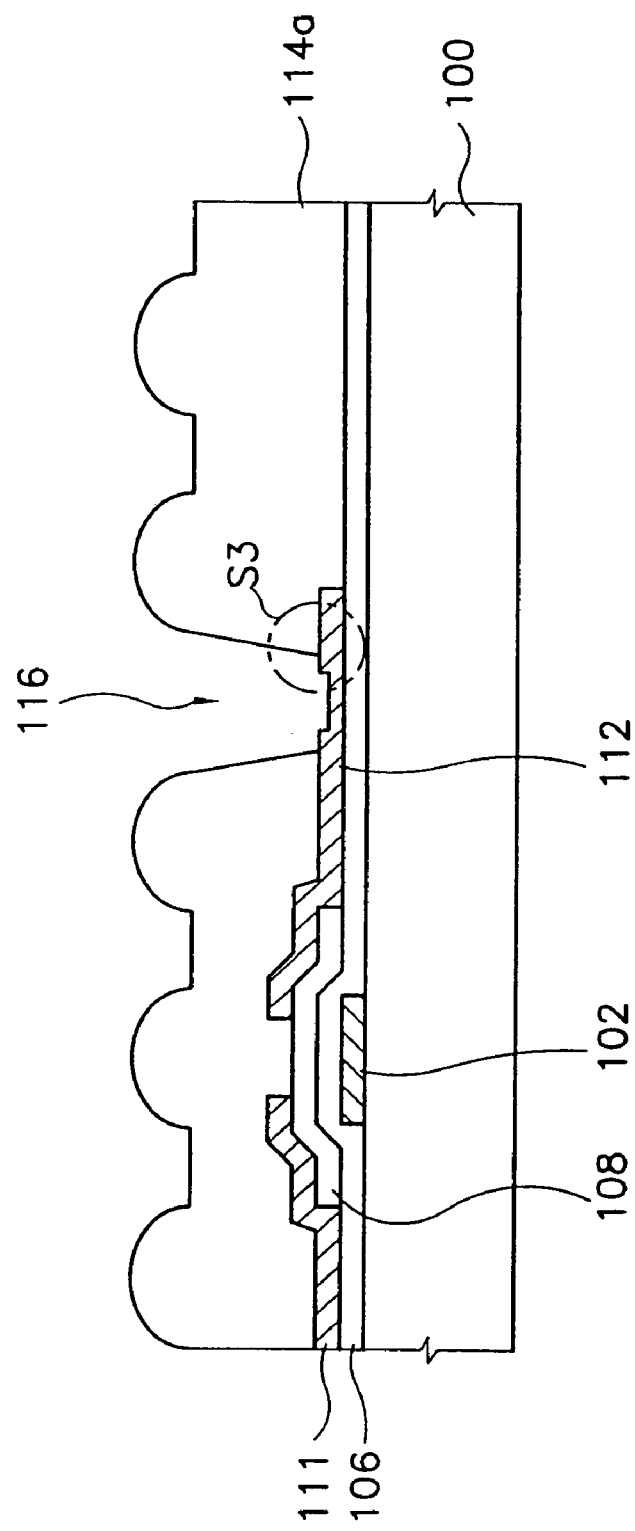
Figure 16C:
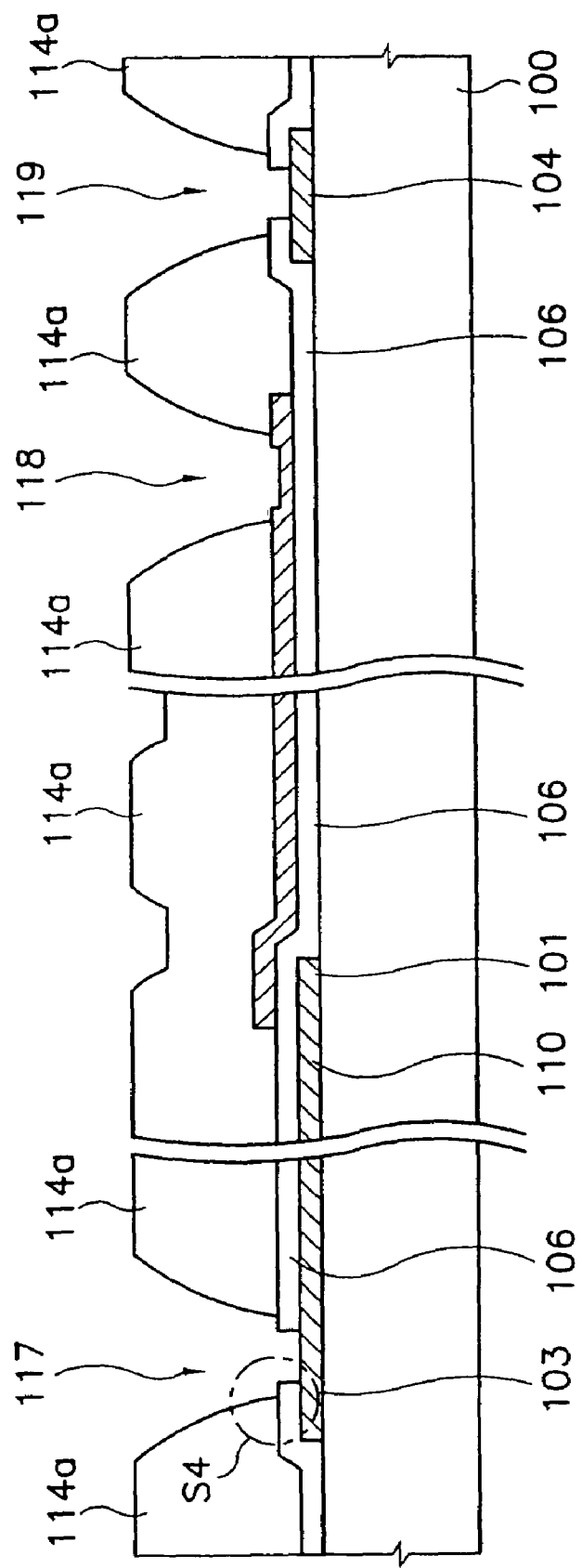

FIG. 16A is a plan view of a substrate in which a via hole is formed and FIGS. 16B and 16C are sectional views taken along the lines 16b–16b' and 16c–16c' of FIG. 16A.

The gate insulating film 106 placed beneath the organic passivation film pattern 114a is dry-etched by using the organic passivation film pattern 114a as an etch mask, so that there are formed a first via hole 116 for exposing the source electrode 112 and a second via hole 117 for exposing the gate pad 103. At the same time, there are also formed a third via hole 118 for exposing one end of the data wiring 110 and a fourth via hole 119 for exposing the data pad 104.

During the aforementioned dry-etching process, the gate insulating film 106 made of an inorganic insulating film or the data wiring 110 is side-etched, so that the undercut is generated beneath the organic passivation film pattern 114a.

Next, the organic passivation film pattern 114a is ashed or plasma dry-etched to remove the organic passivation film pattern 114a by a certain thickness in the horizontal and vertical directions, so that the undercut is removed. When the aforementioned ashing process is completed, the underlying film of the organic passivation film pattern 114a is protruded from the bottom edge of the via hole (S3, S4).

Figure 17A:
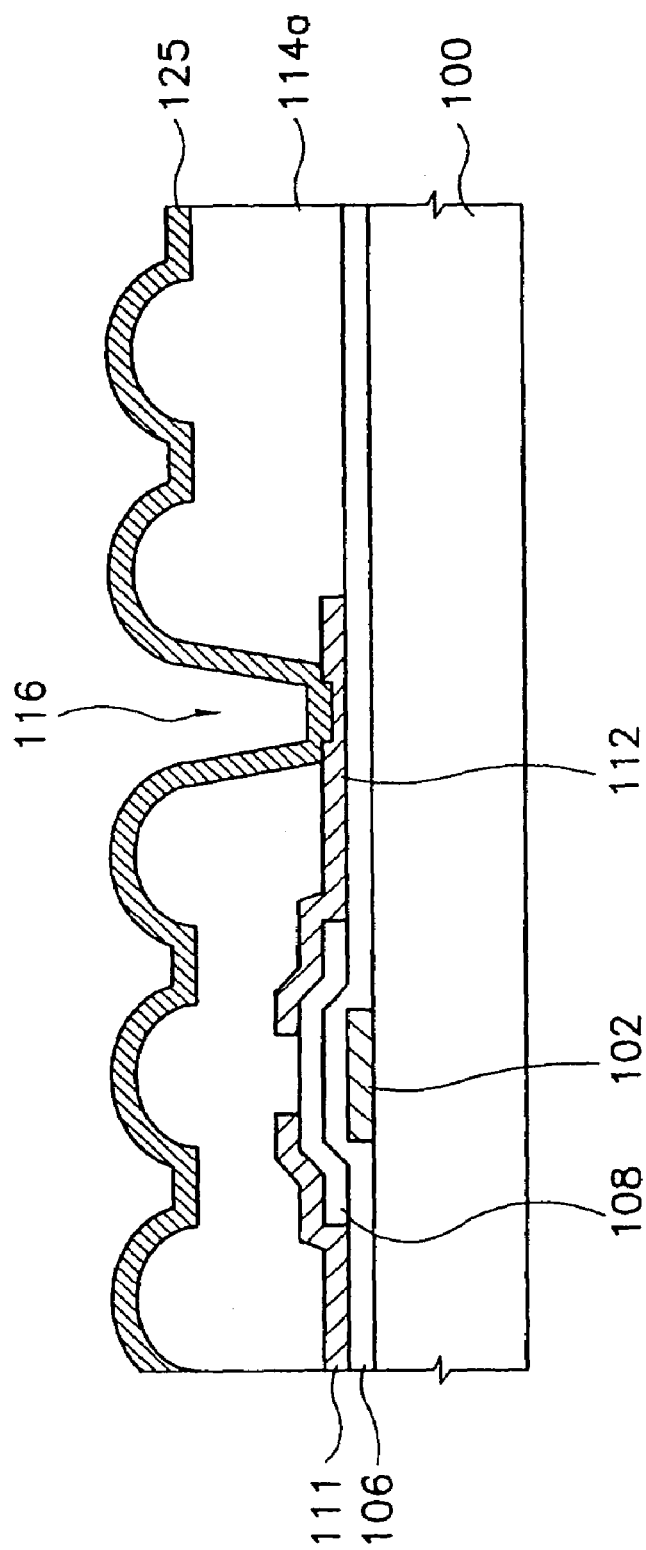
Figure 17B:
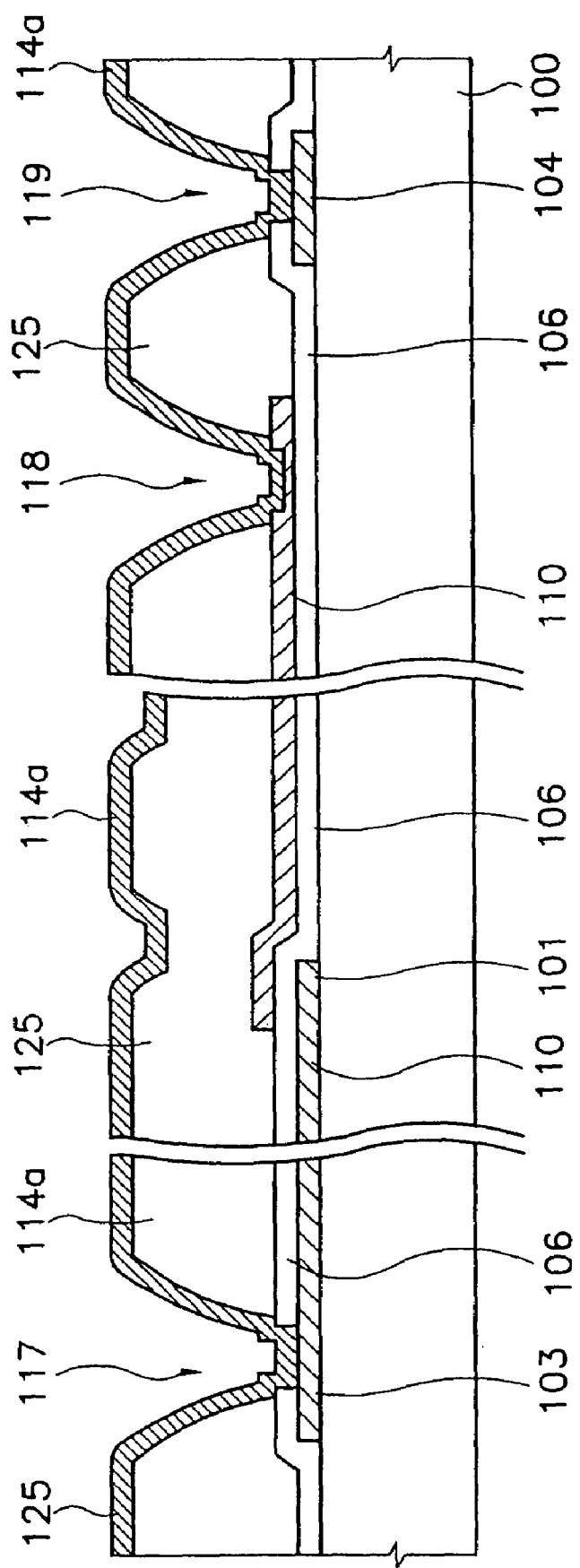

FIGS. 17A and 17B are sectional views taken along the lines 16b–16b' and 16c–16c' of FIG. 16A, and they show a process for depositing a metal film 125 having a high reflectivity such as aluminum (Al) or silver (Ag) on the via holes 116, 117, 118, and 119 and the organic passivation film pattern 114a.

The metal film 125 is patterned by a photolithography process, so that there are formed a pixel electrode 120, which is connected to the source electrode 112 through the first via hole 116, and a pad electrode 121, which is connected to the gate pad 103 through the second via hole 117 (using a fifth mask). At the same time, there is also formed a bridge electrode 122 that connects one end of the data wiring 110 with the data pad 104 through the third and fourth via holes 118 and 119. The pixel electrode 120 is formed within the pixel region defined by the gate wiring and the data wiring 110, and its edge is formed to be overlapped with the gate wiring and the data wiring 110 in order to secure a high aperture ratio.

According to the present embodiment, a passivation film is formed of a single layered organic insulating film, and at the same time a step coverage failure of an upper metal film at the stepped portion due to an undercut is resolved, thereby decreasing by one the number of the photolithography processes needed. In addition, an exposure step for forming a via hole in the organic passivation film and an exposure step for forming concave portions and convex portions at the surface of the reflection plate can be performed at the same time, thereby decreasing by one the number of the exposure steps needed. Accordingly, the number of the exposure steps decreases from seven times to five times, so that the manufacturing process is simplified. Further, if the active pattern and the data wiring are formed by one photolithography process, it is possible to decrease the number of the exposure steps from seven times to four times.

Although the aforementioned first embodiment shows and describes reflection type LCDs as an example, it should be clear to one of ordinary skill in the art that it can be applied to reflection and transmission composite type LCDs.

Embodiment 2

FIGS. 18A to 22B are sectional views describing a method for forming a via hole in accordance with a second embodiment of the present invention, wherein FIGS. 18A, 19A, 20A, 21A and 22A show a case where an inorganic insulating film exists on a metal film while FIGS. 18B, 19B, 20B, 21B and 22B show a case where the inorganic insulating film does not exist on the metal film.

Figure 18B:
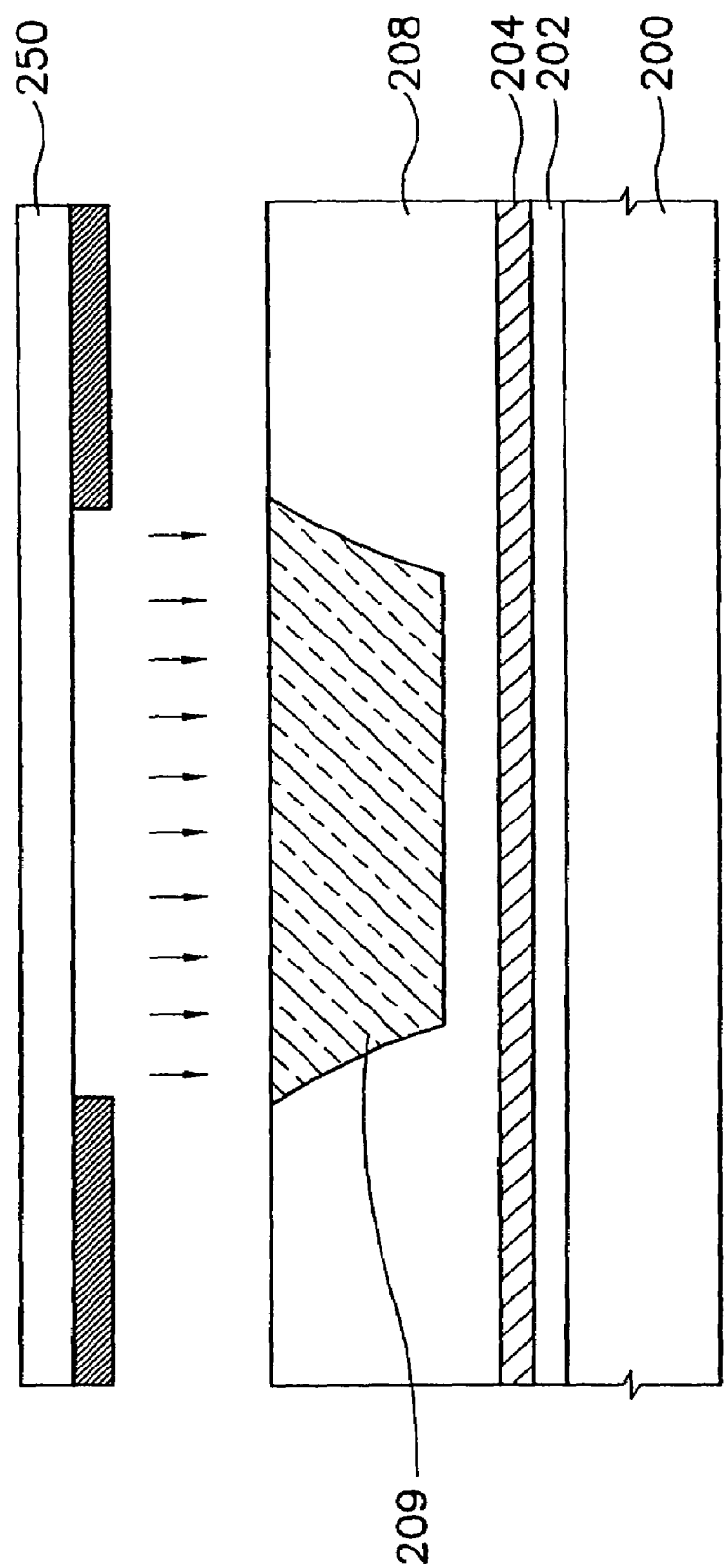
FIGS. 18A to 22B are sectional views describing a method for forming a via hole in accordance with a second embodiment of the present invention.

Referring to FIGS. 18A and 18B, a metal film 204 for a data wiring is deposited on substrates on which a gate wiring (not shown) and a gate insulating film 202 are subsequently stacked. Thereafter, on some portion of the substrates an inorganic insulating film made of silicon nitride is formed as shown in FIG. 18B, or on some other portion the inorganic insulating film is not formed as in FIG. 18A. Afterwards, on the resultant substrate, a photosensitive organic passivation film 208 is coated to a thickness of about 2 µm.

Thereafter, the organic passivation film 208 is firstly exposed by using a first photomask 250 for exposing a first region of the organic passivation film 208. At this time, the first region of the organic passivation film 208 is incompletely exposed such that the first region of the organic passivation film 208 is exposed below a certain thickness.

It is preferable that the incompletely exposed thickness of the organic passivation film is as thin as possible but it is necessary to control the exposure amount by an exposure deviation. Here, the reference numeral 209 denotes a first exposed region.

Figure 19A:
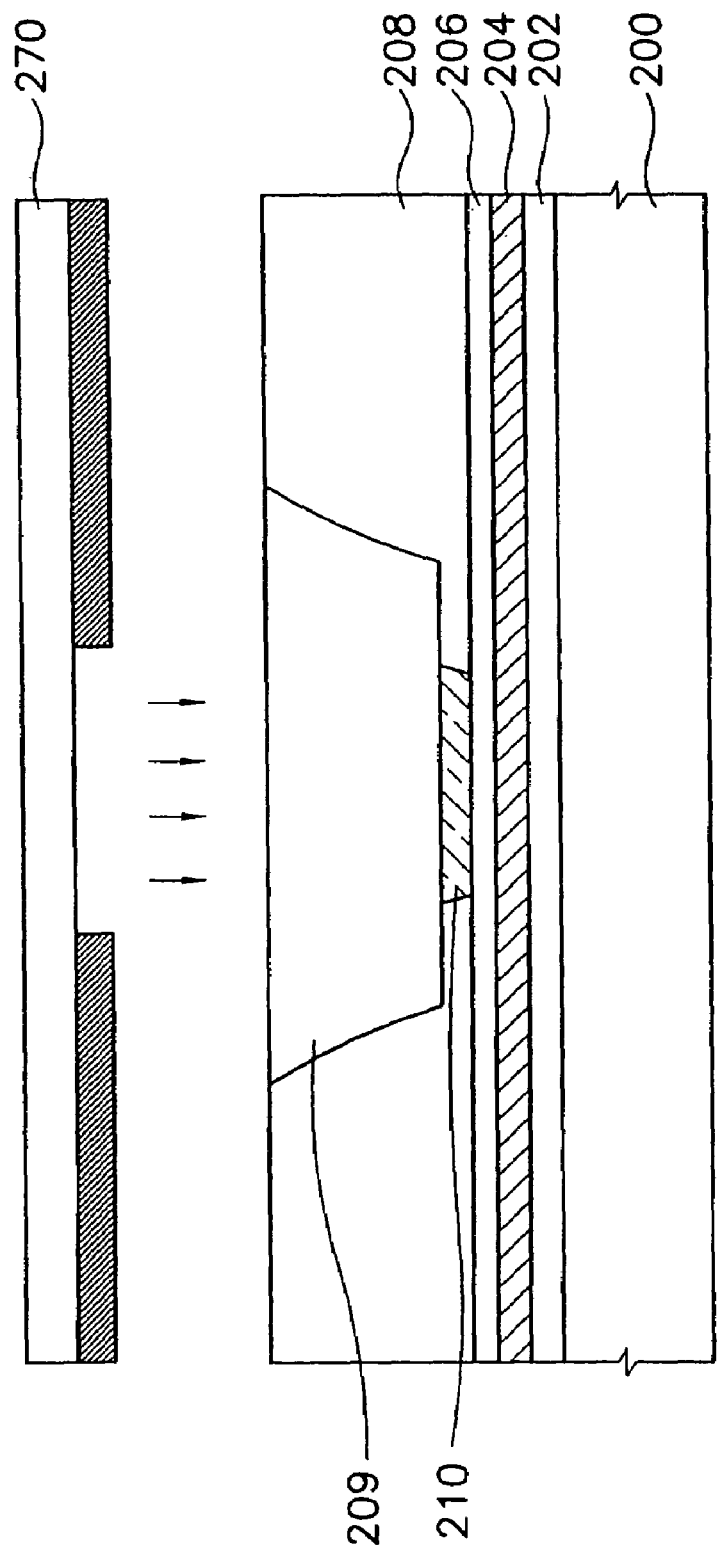

Referring to FIGS. 19A and 19B, the organic passivation film 208 is secondly exposed using a second photomask 270 for exposing a first region and a second region having a size less than the first region and arranged within the first region. At this time, the organic passivation film of an overlapping portion between the first region and the second region is fully exposed. In the transmission type LCD, the second exposure step is performed such that exposed portions of the organic passivation film 208 are sufficiently exposed.

In the case of a reflection and transmission composite type LCD or a reflection type LCD, an exposure step for forming an irregular surface structure and an exposure step for forming a via hole can be performed at the same time by using the second photomask used in the second exposure step as an exposure mask for forming the irregular surface structure of the organic passivation film 208, thereby simplifying the manufacturing process.

Figure 20A:
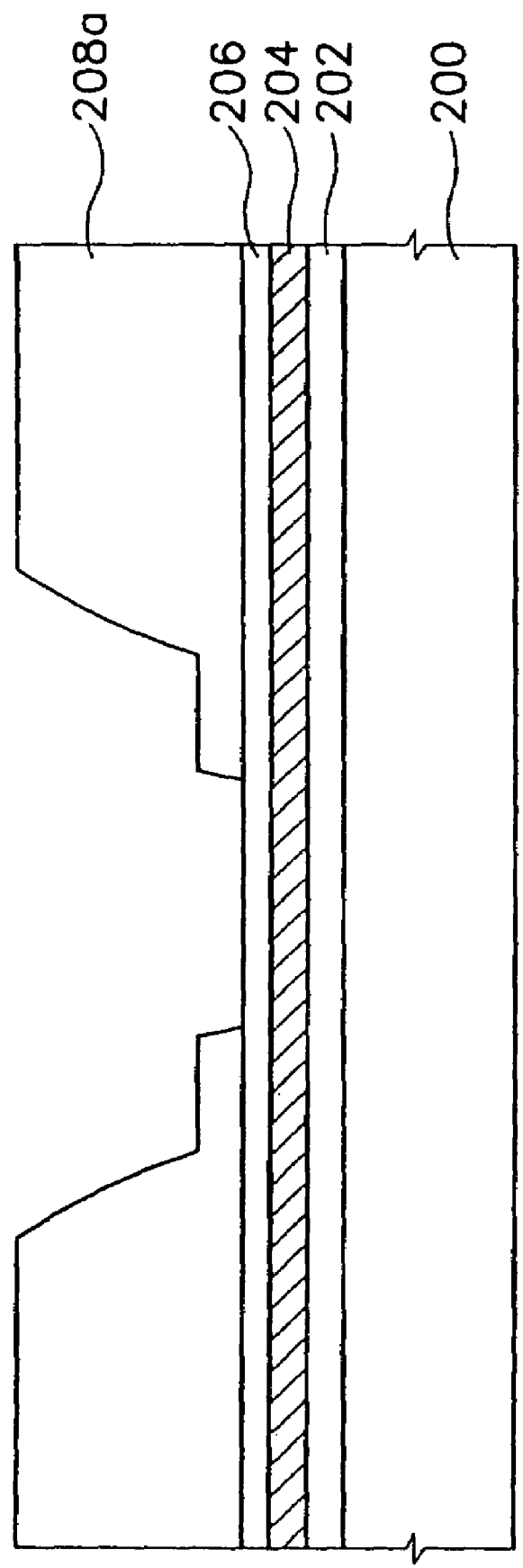
Figure 20B:
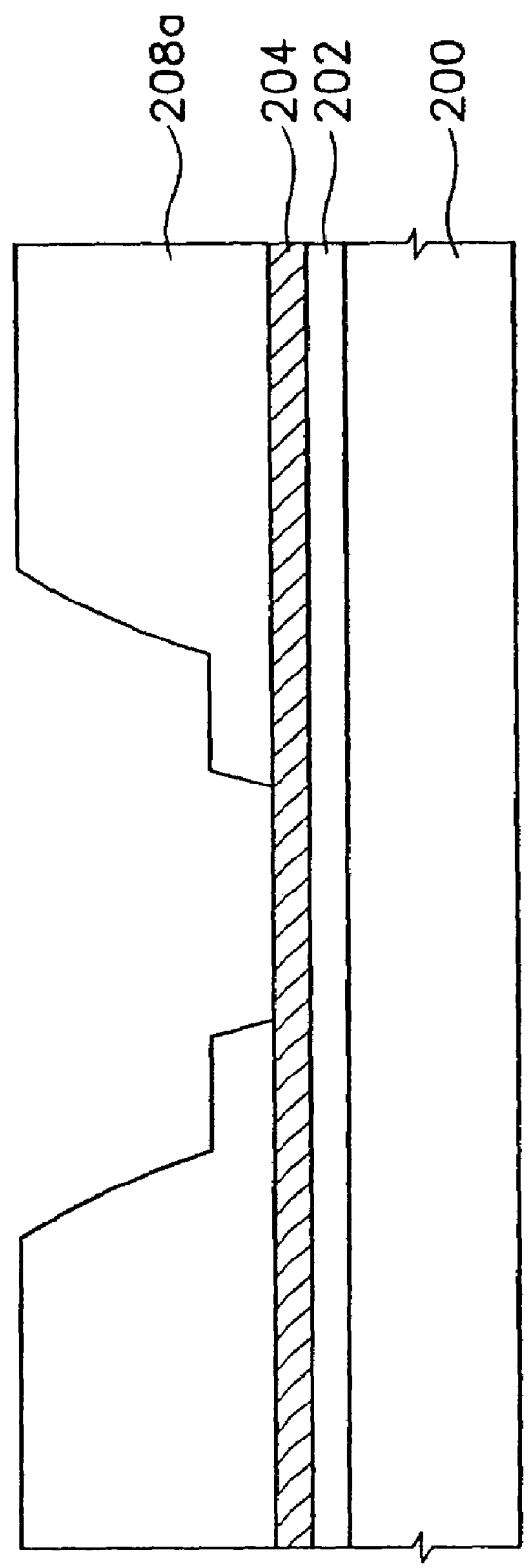

Referring to FIGS. 20A and 20B, as mentioned above, the twice-exposed organic passivation film 208 is developed to remove the exposed portions, so that an organic passivation film pattern 208a is formed. At this time, the slope of the organic passivation film pattern 208a decreases as it travels to an edge of the via hole region, so that the organic passivation film pattern 208a comes to have a low height. At this portion, the organic passivation film pattern 208a has one third or less of total thickness.

Figure 21A:
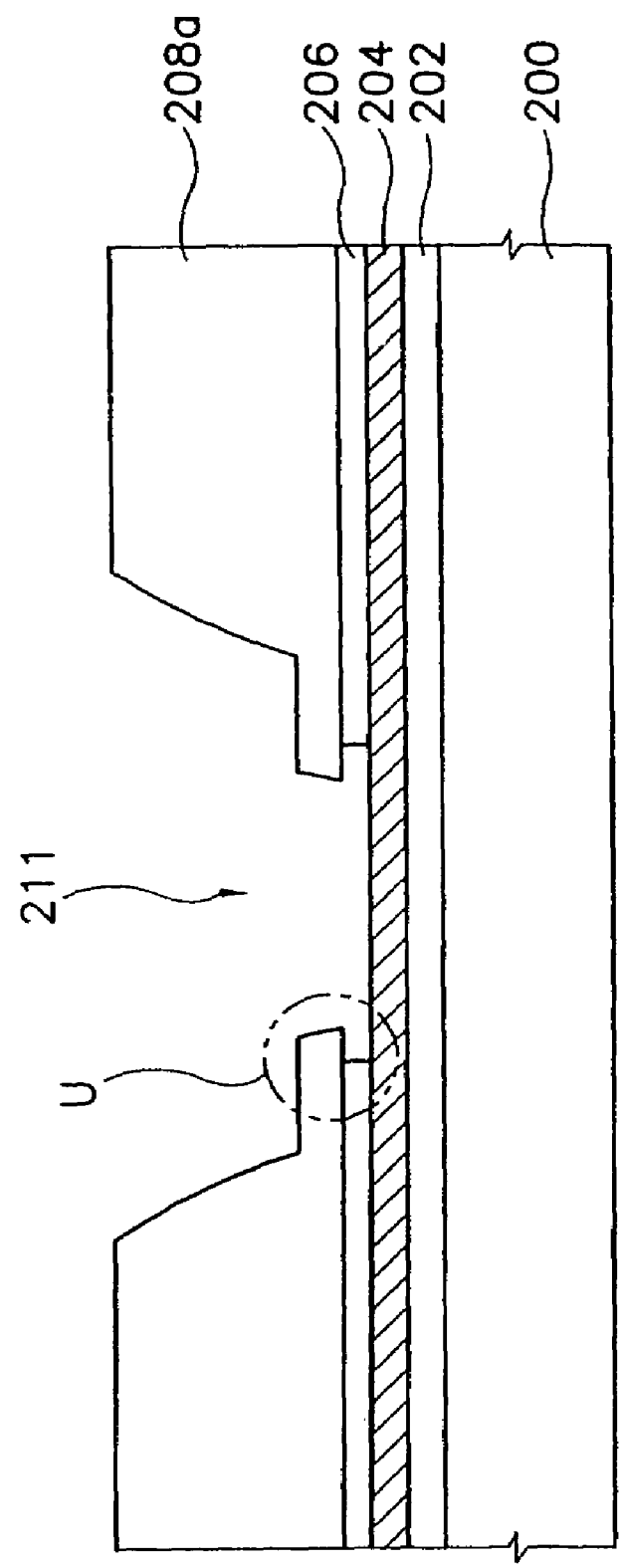

Next, as shown in FIG. 21A, in the case that the inorganic insulating film 206 exists on the metal film, the underlying inorganic insulating film 206 is dry-etched by using the organic passivation film pattern 208a as an etch mask, to form a via hole 211 for exposing the underlying inorganic metal film 204. At this time, the inorganic insulating film 206 is side-etched, so that an undercut is generated beneath the organic passivation film pattern 208a.

Also, as shown in FIG. 21B, in the case that the inorganic insulating film does not exist on the metal film 204, after the organic passivation film is developed, there is formed a via hole 212 for exposing the metal film 204.

In order to prevent the boundary between the metal film 204 and the overlying another metal film that is being deposited from being contaminated or oxidized, the metal film 204 is wet-etched by a predetermined thickness, thereby rendering the surface state in good condition. At this time, the metal film 204 is side-etched, so that the undercut is generated beneath the organic passivation film pattern 208c. At the same time, the metal film is consumed at the bottom of the via hole 212 by a predetermined thickness.

Figure 22A:
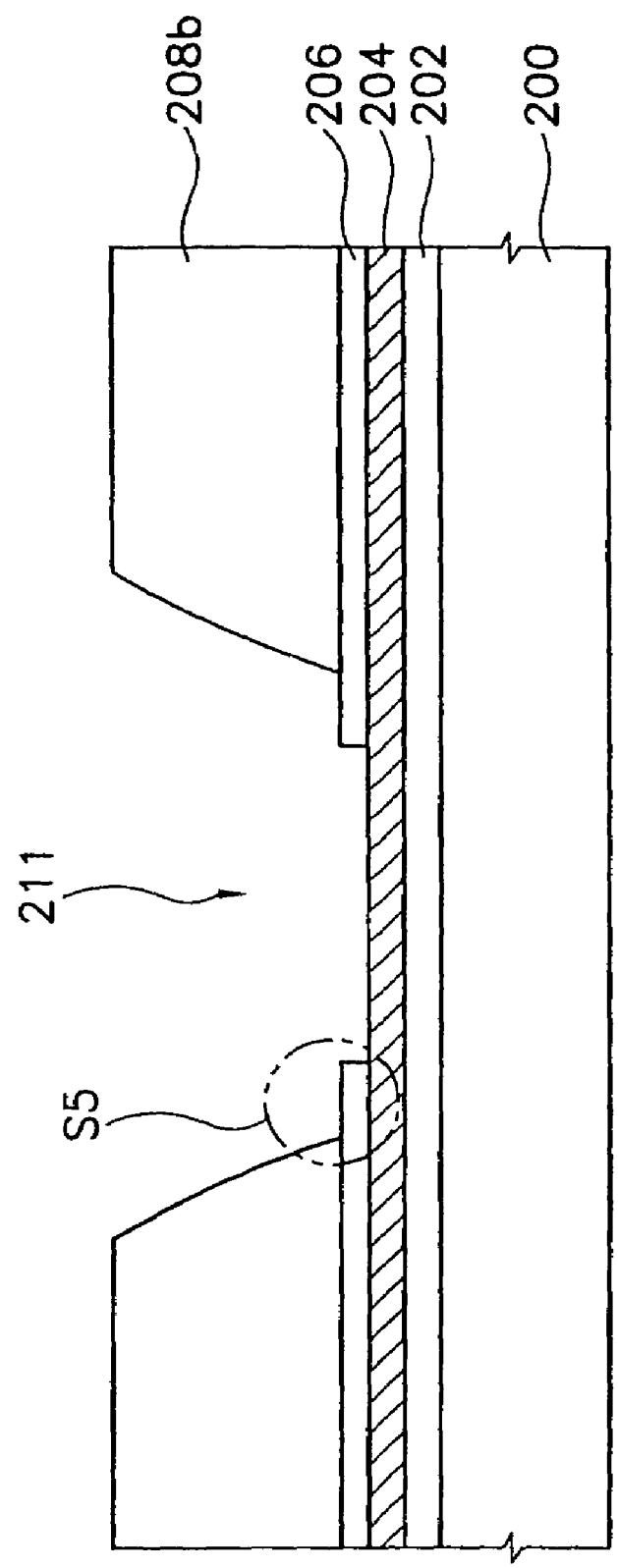
Figure 22B:
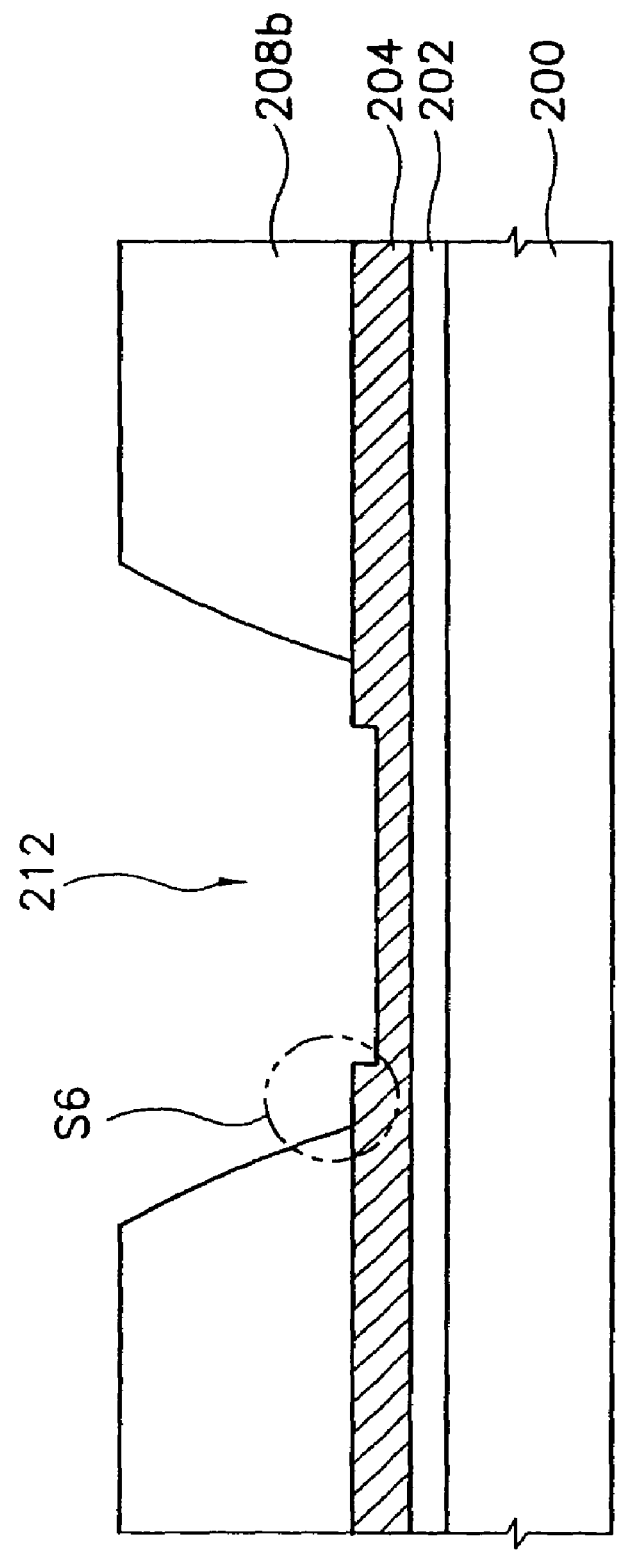

Referring to FIGS. 22A and 22B, the organic passivation film pattern 208a is ashed to remove the organic passivation film pattern 208a by a predetermined thickness from its surface in the horizontal and vertical directions, so that the undercut is removed. Here, the ashing process can be replaced by a plasma dry-etching process.

As shown in FIG. 22A, if the aforementioned ashing process is completed in the case that the inorganic insulating film 206 exists on the metal film 204, the inorganic insulating film 206 is protruded in comparison with the organic passivation film pattern 208b from the bottom edge (S5) of the via hole 211. Likewise, as shown in FIG. 22B, in the case that the inorganic insulating film does not exist on the metal film 204, the metal film 204 is protruded in comparison with the organic passivation film pattern 208b from the bottom edge S6 of the via hole 212.

At the same time, although not shown in the figures, as described above, a transparent conductive film such as ITO or IZO, or a reflection film such as Al or Ag is deposited on the entire surface of the resultant structure in the state where the organic passivation film pattern 208b is protruded from the bottom edge of the via hole, and is then patterned by a photolithography process, to form an electrode connected to the metal film 204 through the via hole 211 or 212. Since the electrode is deposited in a state that the undercut beneath the organic passivation film pattern 208b has been removed, it has good step coverage at stepped portions.

Embodiment 3

Figure 23:
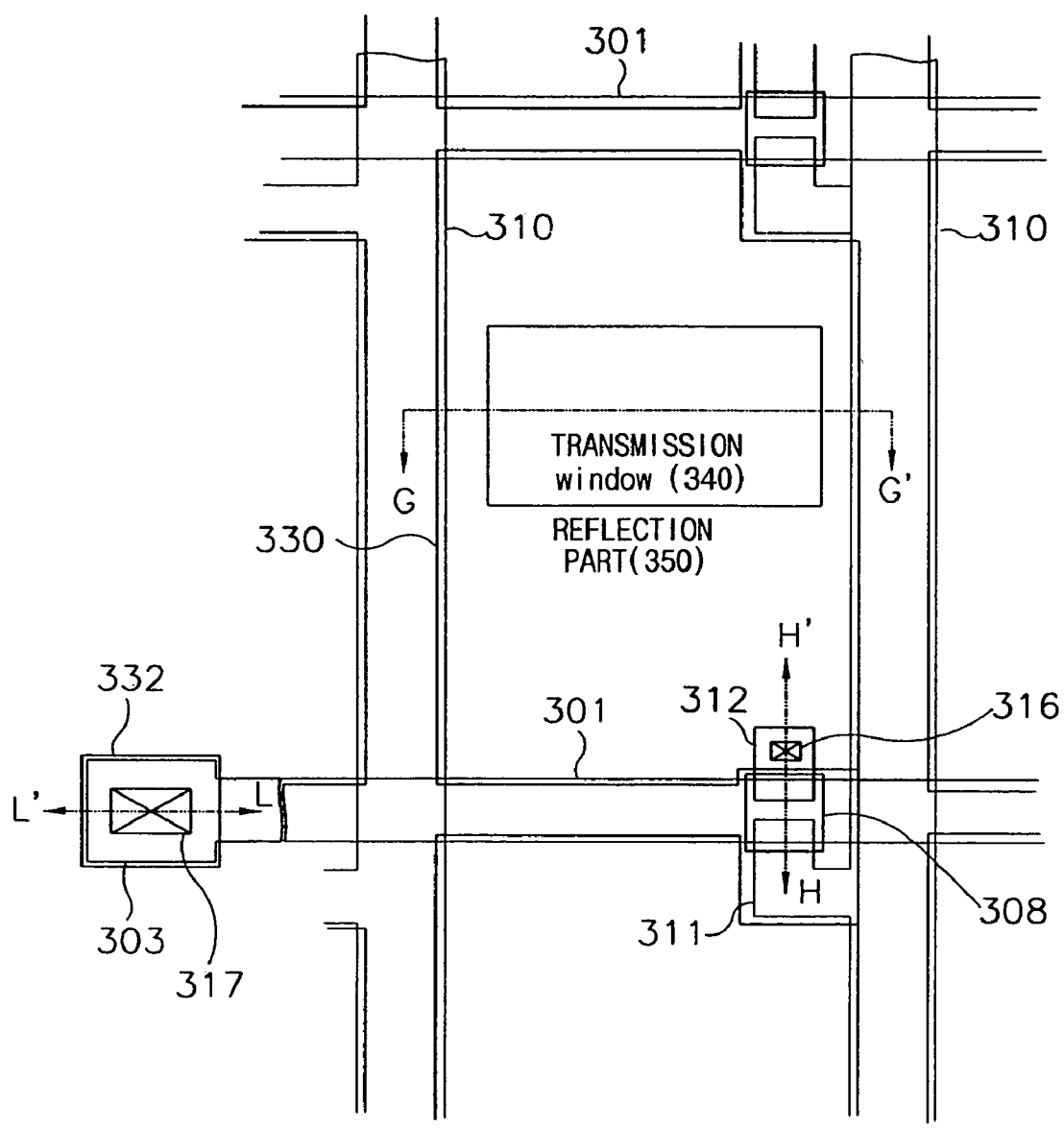
FIG. 23 is a plan view of a TFT for a reflection and transmission type LCD in accordance with a third embodiment of the present invention.

FIG. 23 is a plan view of a TFT for a reflection and transmission type LCD in accordance with a third embodiment of the present invention. Referring to FIG. 23, a reflection part 350 is formed to enclose a transmission window 340.

FIGS. 24A to 27C are sectional views for describing a method for manufacturing a TFT for the LCD in accordance with the third embodiment and they are taken along the lines G–G', H–H' and L–L' of FIG. 23.

Figure 24A:
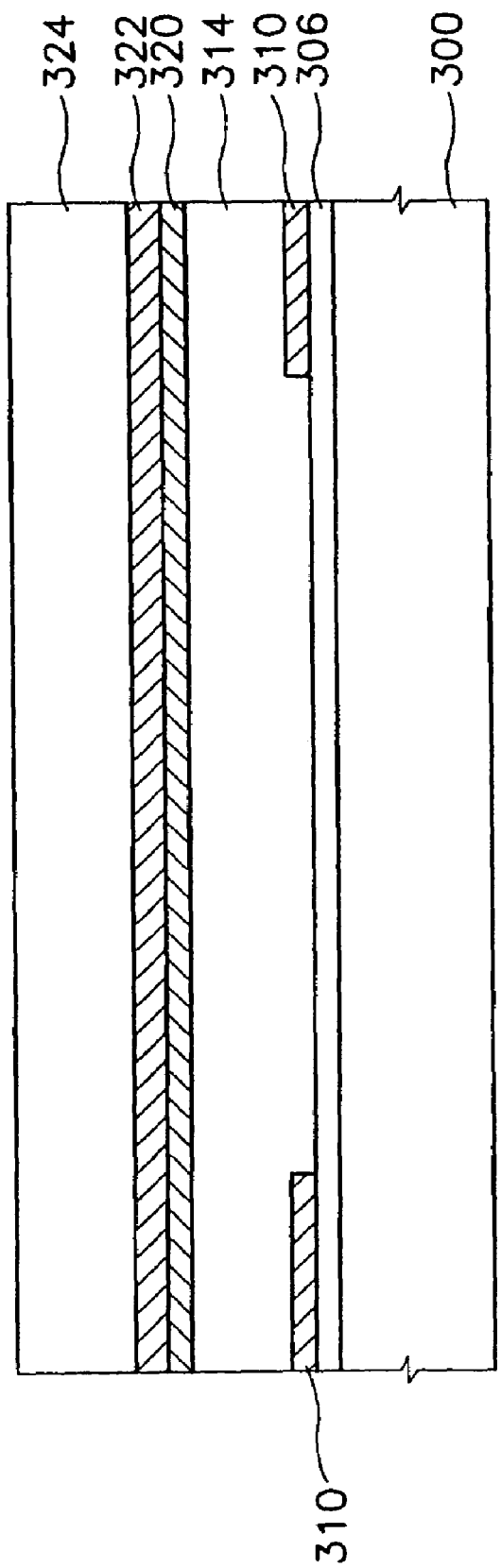
FIGS. 24A to 27C are sectional views describing a method for manufacturing a TFT for the LCD in accordance with a third embodiment of the present invention.
Figure 24B:
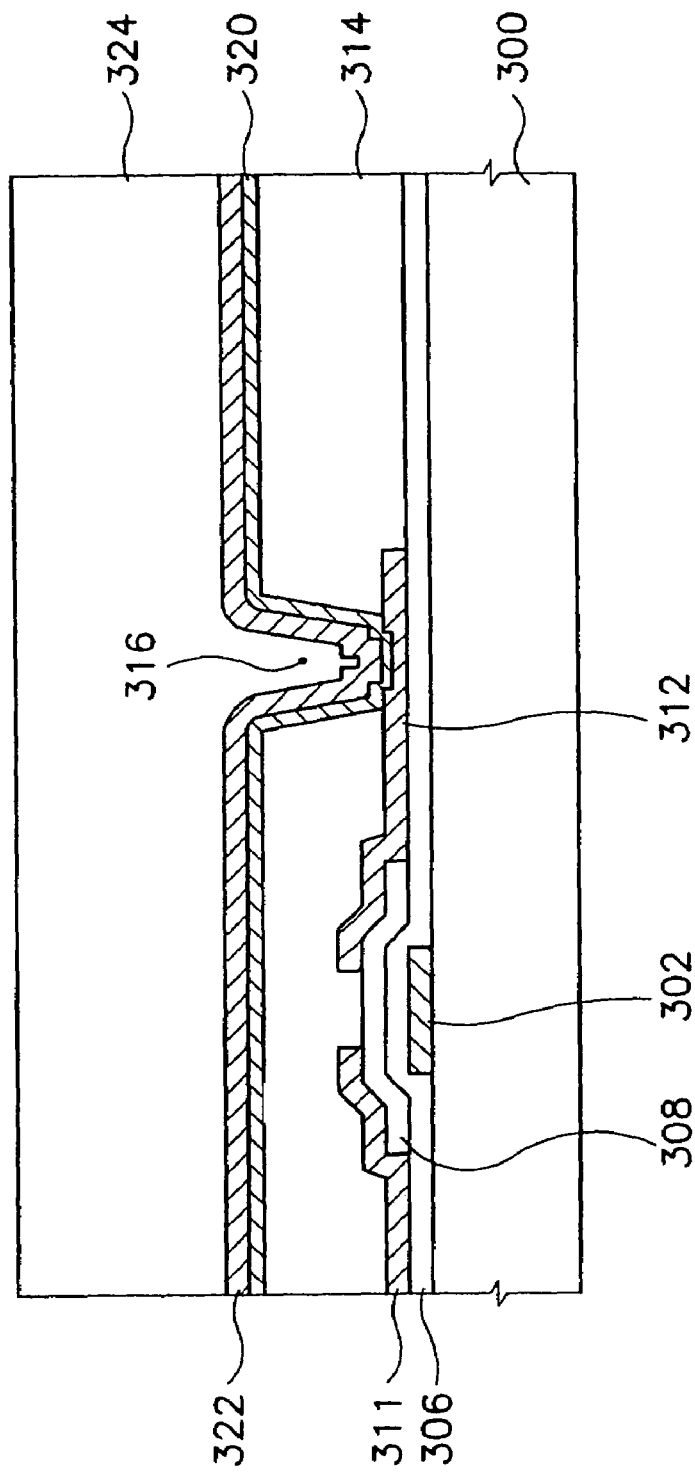
Figure 24C:
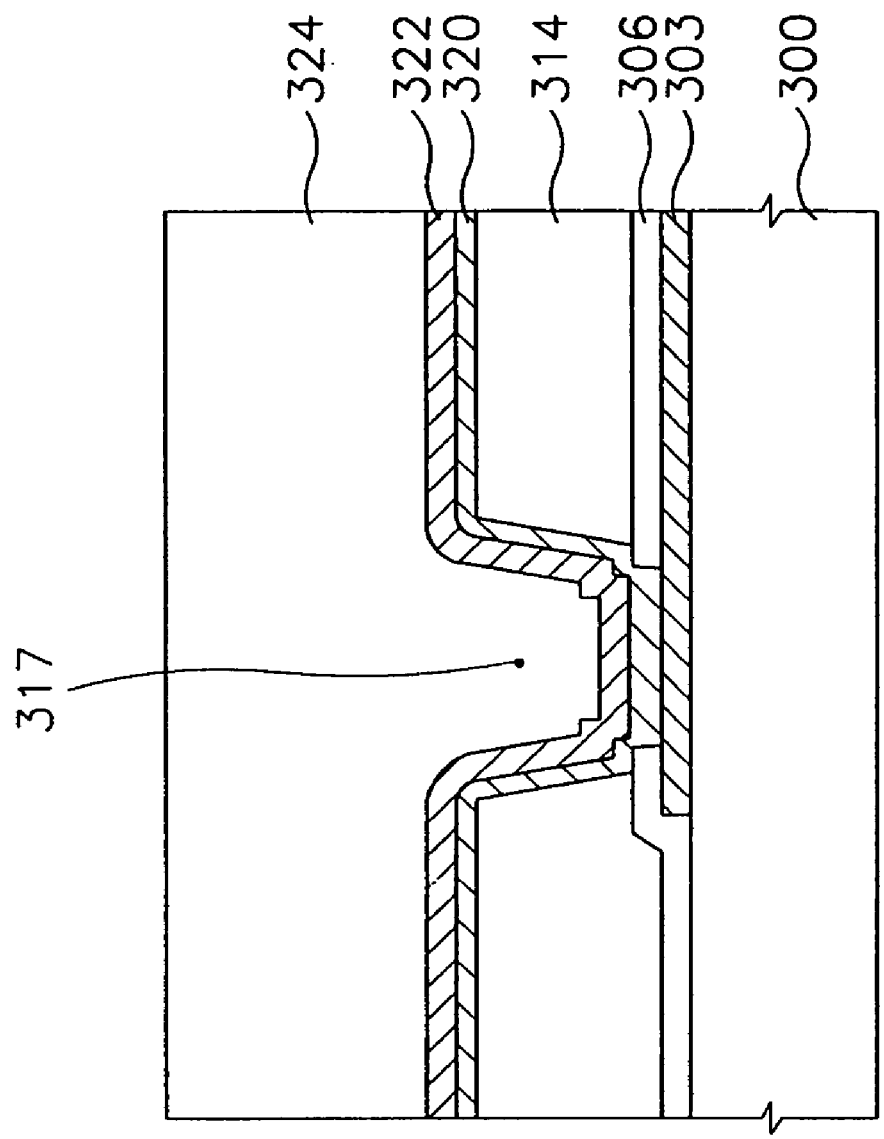

Referring to FIGS. 24A to 24C, after forming a gate wiring 320 made of a first metal film on a substrate 300, a gate insulating film 306 made of an inorganic insulating film such as silicon nitride is formed thereon. The gate wiring includes a gate line 301 extending in a first direction, a gate electrode, which is a part of the gate line 301, and a gate pad 303 connected to one end of the gate line 301, for receiving scanning signals from the outside and transmitting the received scanning signals to the gate line 301. In the same manner as in Embodiment 1, a data pad (not shown) for transmitting an image signal into a drain of a TFT can be formed from the same layer as the gate wiring.

Next, after forming an active pattern 308 made of a semiconductor film on the gate insulating film 306, a data wiring 310 made of a second metal film is formed thereon. The data wiring 310 includes a drain electrode 311 extending in a second direction, which is perpendicular to the first direction. The drain electrode 311 is connected to the source electrode 312 and the data wiring 310.

On the data wiring 310, active pattern 308 and gate insulating film 306, a passivation film, preferably, a photosensitive organic insulating film is thickly formed to a thickness of 2 μm. Thus, if the passivation film is formed by depositing the organic insulating film thickly, a parasitic capacitance is not generated between the data wiring 310 and the pixel electrode that is to be formed thereon. To this end, in order to secure a high aperture ratio, the pixel electrode can be formed to be overlapped with the data wiring 310 and the gate wiring.

Then, in the same manner as in Embodiments 1 and 2, the organic insulating film is patterned by a photolithography process such that the slope of the organic passivation film is lowered at an edge of a region which the via hole is being formed, to thereby form an organic passivation film pattern 314. In other words, the organic passivation film pattern 314 can be formed by a first exposure method using a photomask having both a partial exposure pattern and a full exposure pattern.

In addition, the organic passivation film pattern 314 may be formed by a method including a first exposure step using a first photomask of defining a first exposure region and a second exposure step using a second photomask of defining a second exposure region.

Next, using the organic passivation film pattern 314 as an etch mask, the underlying film is dry-etched to form a via hole 316 for exposing the data wiring, i.e., source electrode 312 and a second via hole 317 for exposing the gate pad 303. At this time, in the case that the data pad is formed from the same layer as the gate wiring, there are formed a third via hole for exposing one end of the data wiring 310 and a fourth via hole for exposing the data pad together in order to connect the data wiring 310 with the data pad. Preferably, when opening the gate pad 303 and the data pad 104 to which chip bumps are bonded, all of the pads are not opened individually but are opened wholly so as to prevent a contact failure from being generated due to the bump misalignment.

Next, the organic passivation film pattern 314 is ashed or plasma dry-etched to remove an undercut beneath the organic passivation film pattern 314. Then, an IZO layer is deposited on a resultant structure to a thickness range of 500–1200Å by a sputtering method to form a transparent electrode layer 320. On the transparent electrode layer 320, there is deposited an aluminum (Al) layer or an aluminum-containing metal alloy such as AlNd to a thickness range of about 1500–4000Å to form a reflection electrode layer 322.

After that, a photoresist film 324 is coated on the reflection electrode layer 322 to a thickness of about 2 μm.

Figure 25A:
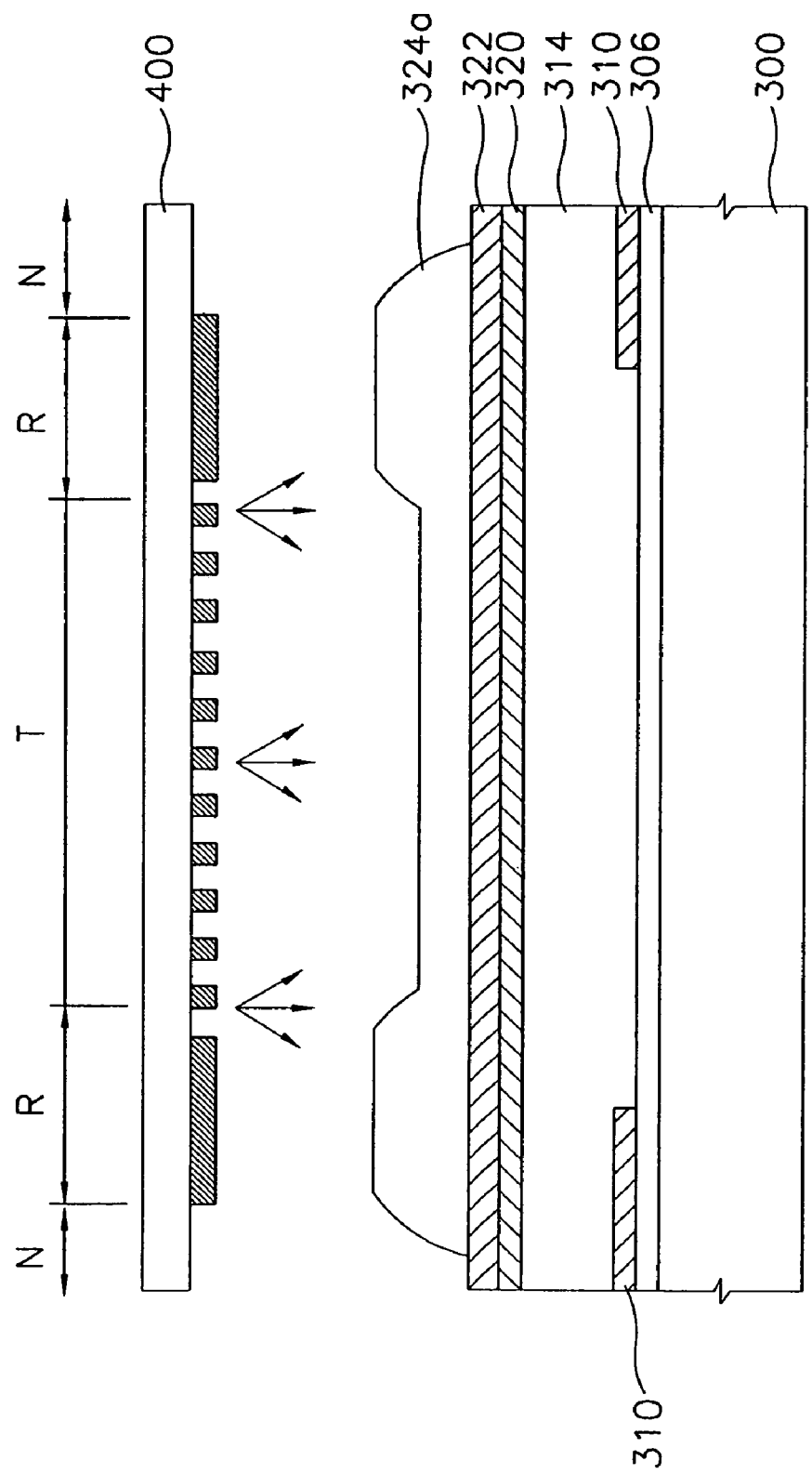
Figure 25B:
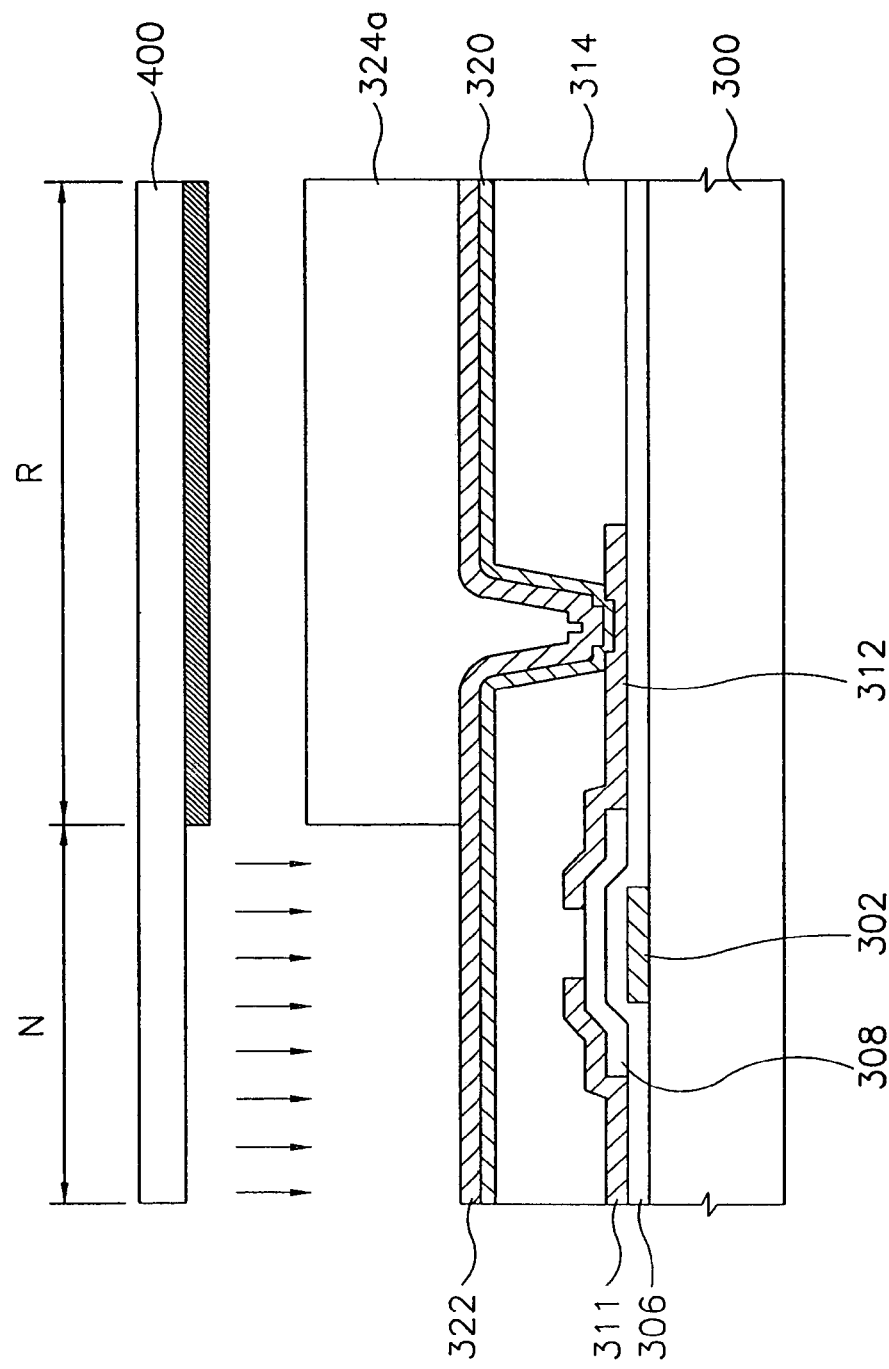
Figure 25C:
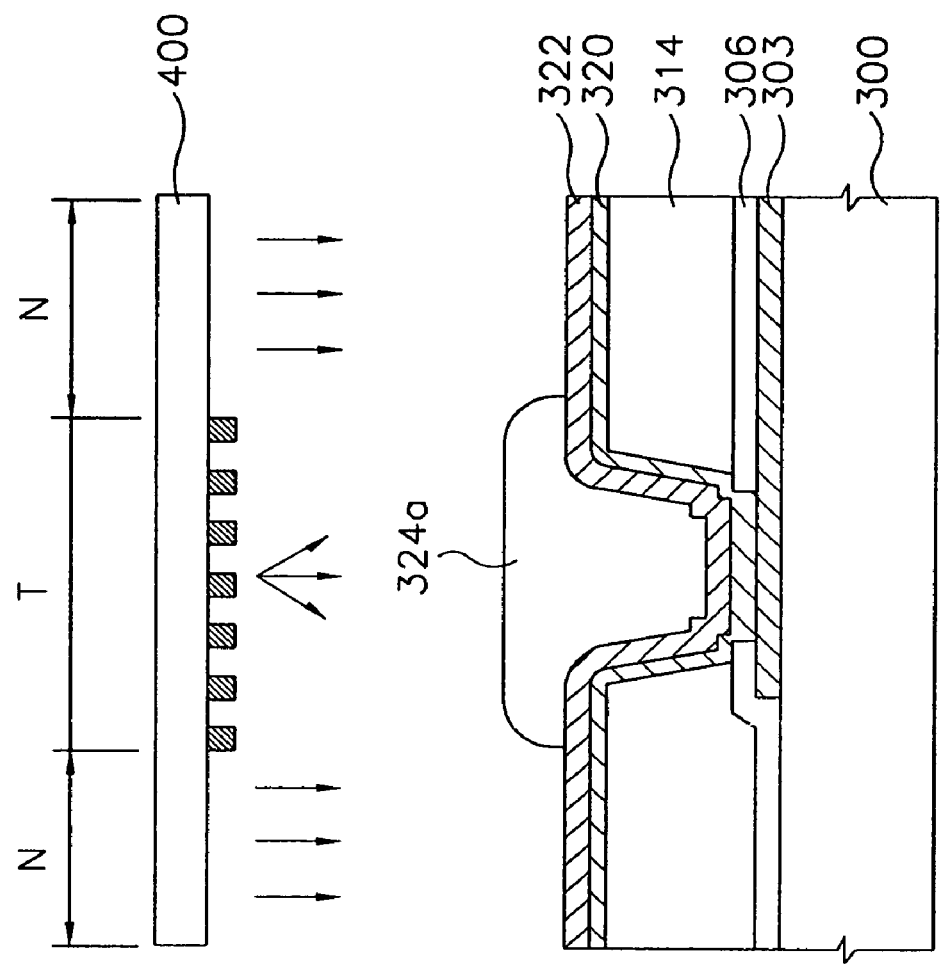

Referring to FIGS. 25A to 25C, using a photomask 400 having a partial exposure pattern corresponding to a transmission region (T) and a full exposure pattern corresponding to a reflection region (R), the photoresist film 324 is exposed. Preferably, the partial exposure pattern has a slit structure or a semi-transparent film pattern and it is made in the form of an open pattern having a line width corresponding to a half of the resolution of the exposure machine.

Next, the photoresist film 320 is developed, so that it remains thick to a thickness of about 1.9 μm at the reflection region (R), remains thin to a thickness of about 4000 Å or less by a diffraction exposure at the transmission region (T), and is completely removed at the remaining region (N), thereby forming a photoresist pattern 324a. At this time, in order to enhance the reliability of the gate pad and data pad, the partial exposure pattern is aligned to correspond to the pad region such that the photoresist film on the pad region remains thin to a thickness of about 4000 Å or less.

Figure 26A:
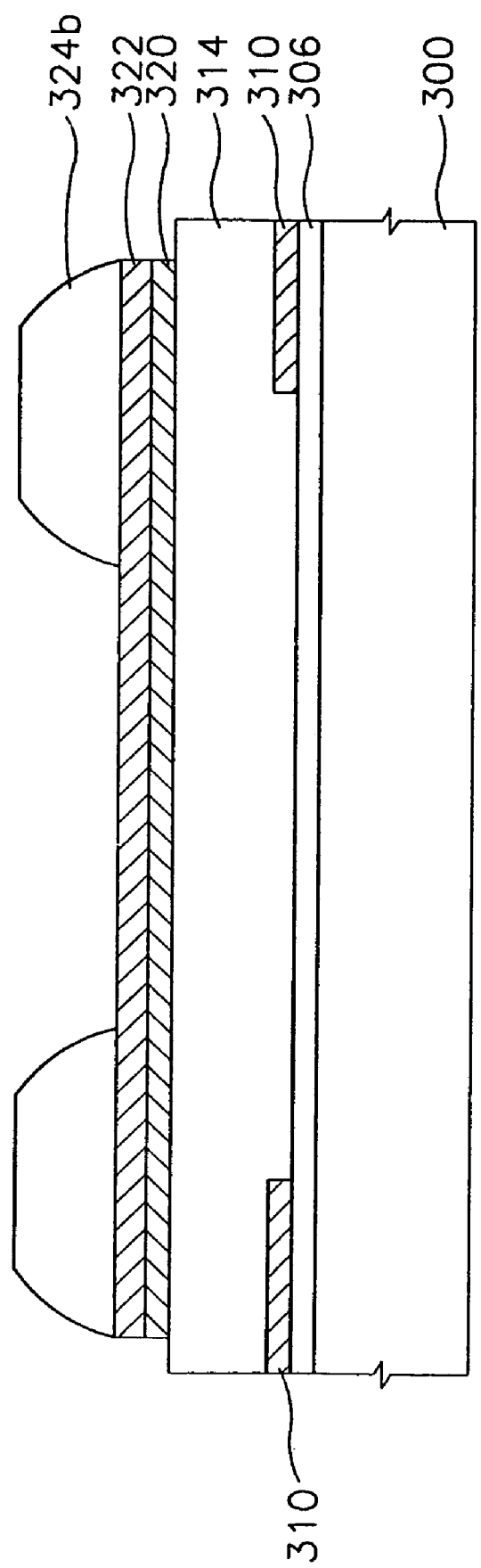
Figure 26B:
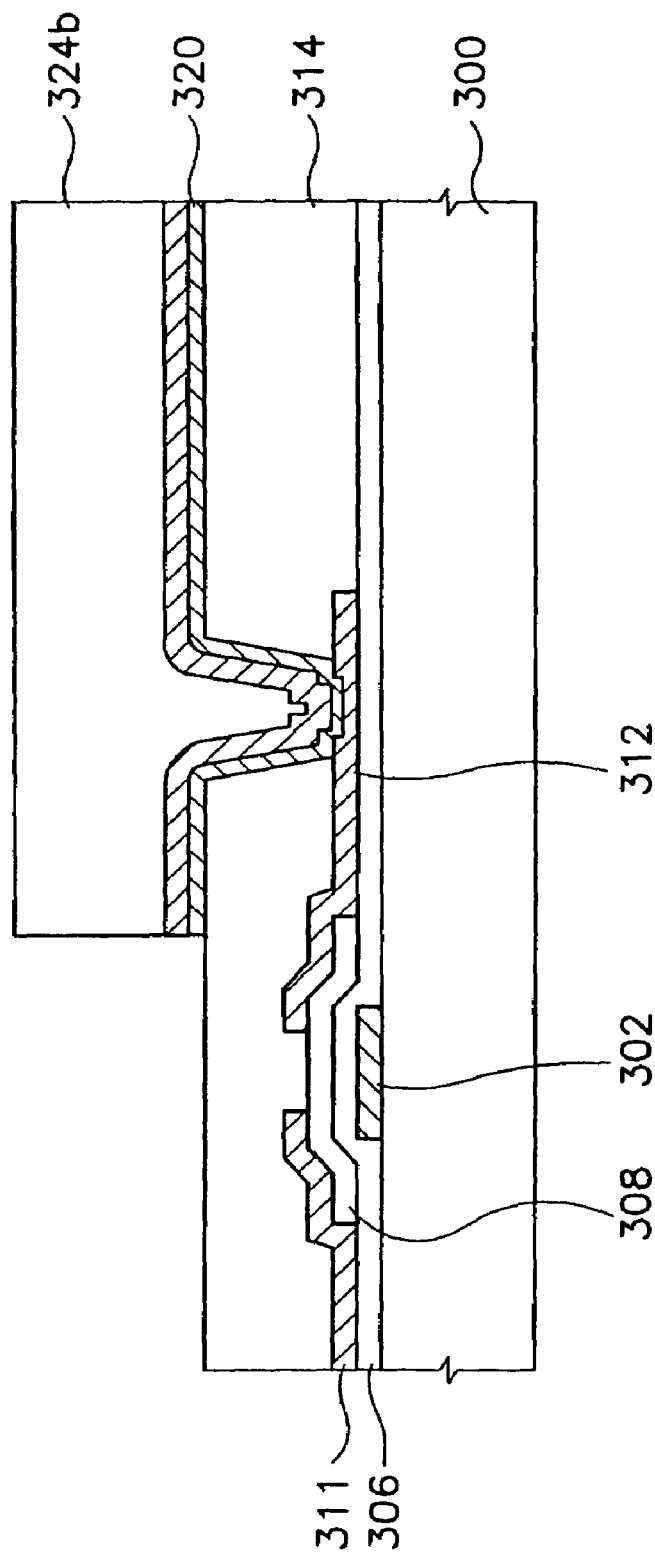
Figure 26C:
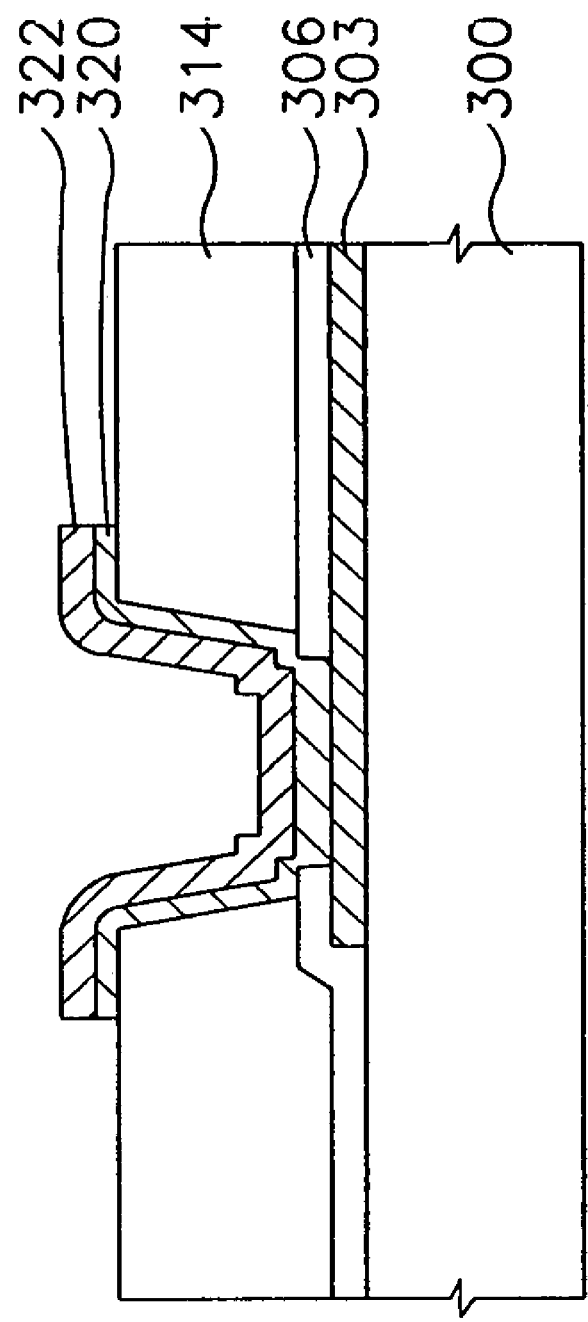

Referring to FIGS. 26A to 26C, using the photoresist pattern 324a as an etch mask, the reflection electrode layer 322 and the transparent electrode layer 320 are wet-etched at the same time. Here, a mixed solution of $H_3PO_4$, $HNO_3$ and $CH_3COOH$, which is an aluminum etchant, is used as a wet-etch solution.

Next, the photoresist pattern 324a is ashed or plasma dry-etched to completely remove the photoresist pattern 324a in the transmission region (T) such that the underlying reflection electrode layer 322 is exposed. The photoresist pattern 324a remains in the reflection region (R) without being removed.

Figure 27B:
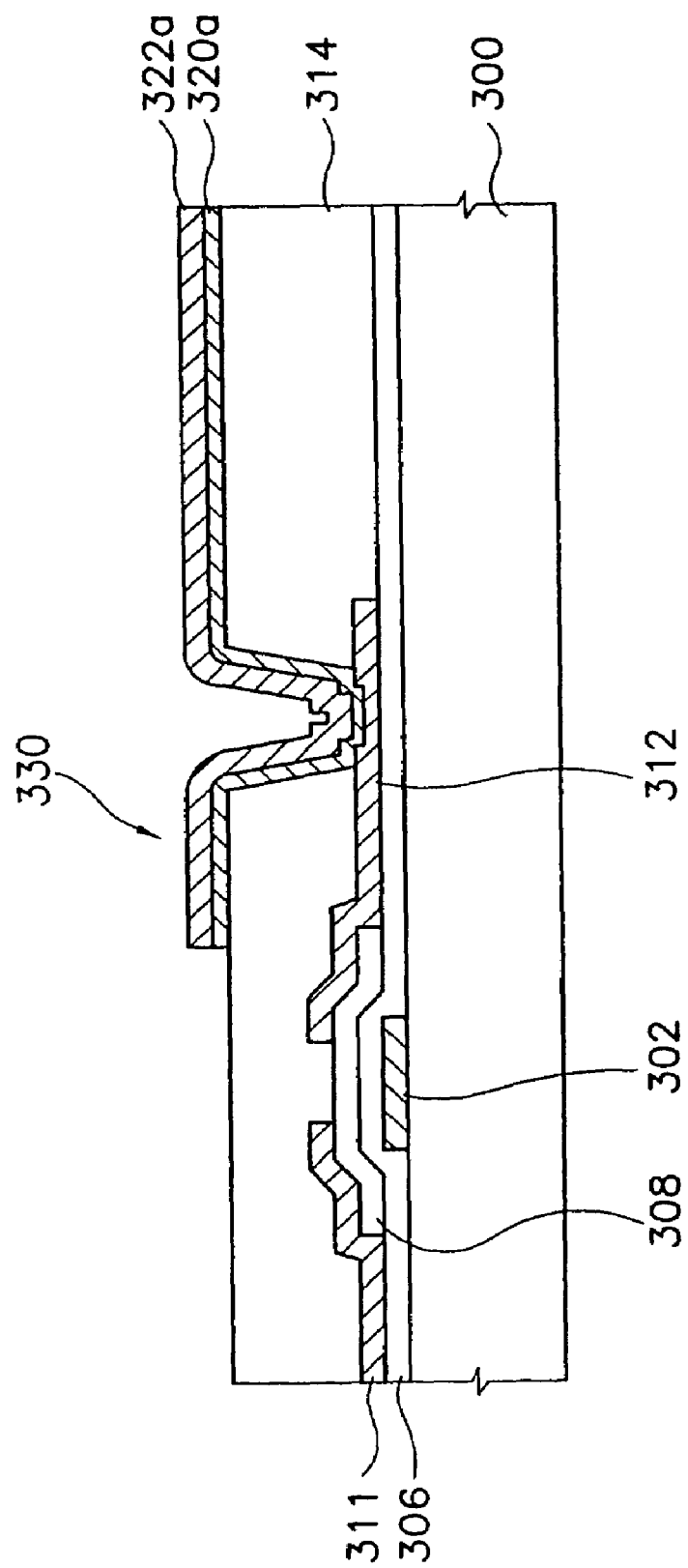
Figure 27C:
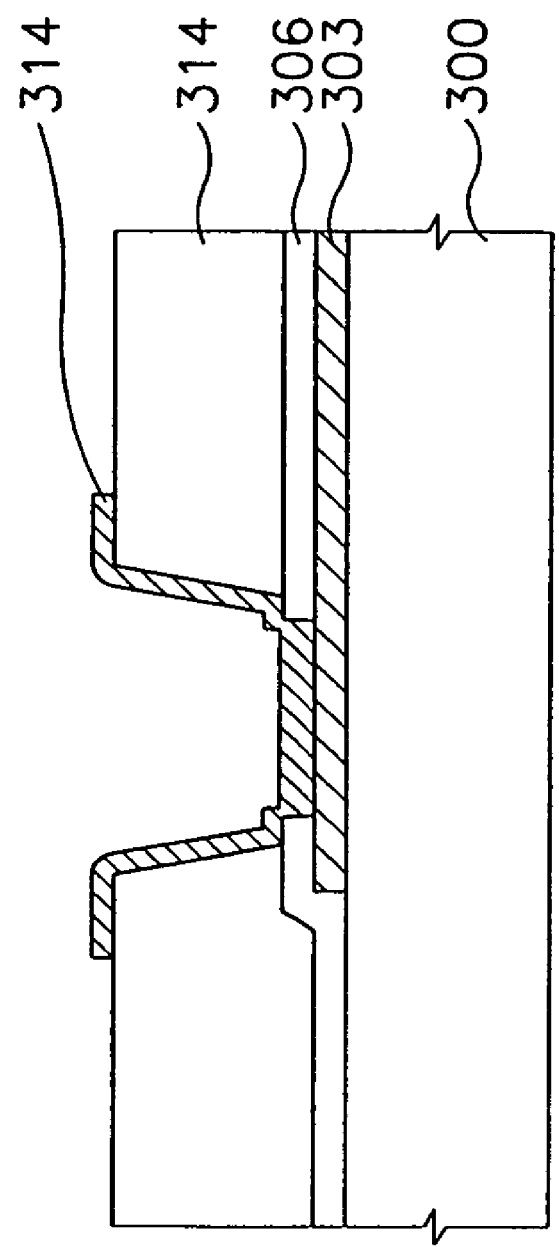

Referring to FIGS. 27A to 27C, the exposed reflection electrode layer 322 is dry-etched by using the remaining photoresist pattern 324b as an etch mask and $BCl_3$ and $Cl_2$ gas as an etch gas. Thus, the reflection electrode layer in the transmission region is removed and only the transparent electrode layer remains. At this time, if the reflection electrode layer 322 is wet-etched, since there is no an etch selectivity ratio between the reflection electrode layer 322 and the underlying transparent electrode layer, even the underlying transparent electrode layer 320 may be etched.

Next, the photoresist pattern 324b is removed by an ashing or strip process, so that a TFT for a reflection and transmission composite type LCD in which the reflection electrode 322a remains around a transparent electrode 320a is completed. A pixel electrode 330 is connected to the source electrode 312 through the first via hole 316 and it is formed in a double layered structure in which the reflection electrode 322a is stacked on the transparent electrode 320a. In the present embodiment, since the pixel electrode 330 is formed to be overlapped with the gate wiring and data wiring 310, the reflection electrode 322a remains around an overlapped region with the wirings, so that a sufficient aperture ratio can be obtained.

At this time, a pad electrode 332, which is connected to the gate pad 303 through the second via hole 317, is formed of only the transparent electrode. In other words, since the partial exposure pattern of the photomask is positioned on the pad region, the photoresist film in the partial exposure pattern is completely removed during a step of exposing the reflection electrode layer of the transmission region. Accordingly, the reflection electrode layer on the pad region is completely removed during dry-etch of the reflection electrode layer and only the transparent electrode remains.

According to the present embodiment, the transparent electrode layer is made of IZO. Meanwhile, in a conventional reflection and transmission composite type LCD having a transparent electrode layer made of ITO and an overlying reflection electrode layer made of aluminum or an aluminum-containing metal alloy, when a potential difference is continuously applied between the two conductive layers, the oxide of the ITO reacts with aluminum at the boundary between the transparent electrode layer and the reflection electrode layer, to create a very thin insulating film of $Al_2O_3$. To this end, there may occur a problem in that a potential of the ITO transparent electrode layer is not transferred to the reflection electrode layer.

In addition, the ITO transparent electrode layer is electrochemically reacted with the reflection electrode layer by an organic solvent of TMAH (Tetra Methyl Ammonium Hydroxide) which is conventionally used during a developing process of the photoresist film, so that corrosion of the ITO transparent electrode layer may occur. Further, when etching the reflection electrode layer and the transparent electrode layer by using the photoresist pattern as an etch mask, the Al reflection electrode layer should be wet-etched using an Al etchant and then the ITO transparent electrode layer should be wet-etched using an ITO etchant.

As an etchant for wet-etching the ITO transparent electrode layer, there can be used a strong acid such as HCl, $HNO_3$ or $FeCl_3$. If one of these strong acids is used as the etchant, although the photoresist film exists on the ITO transparent electrode layer, the strong acid may etch the Al reflection electrode severely.

Meanwhile, if IZO provided in embodiments of the present invention is used as the transparent electrode layer, any oxide or insulator is not formed. Further, an electrochemical reaction does not occur between the IZO transparent electrode layer and the Al reflection electrode layer. Furthermore, when etching the reflection electrode layer and the transparent electrode layer by using the photoresist pattern as an etch mask, since the IZO transparent electrode layer is easily etched by a mixing solution of $H_3PO_4$, $HNO_3$ and $CH_3COOH$, which is an Al etchant, the Al reflection electrode layer and the IZO transparent electrode layer can be wet-etched at the same time. Accordingly, a boundary characteristic between the transparent electrode and the reflection electrode is enhanced and the manufacturing process is simplified.

According to the first embodiment of the present invention, a passivation film made of an organic insulating film is once exposed using a photomask having a partial exposure pattern formed at an edge portion of a via hole to form an organic passivation film pattern such that the slope of the organic passivation film decreases as it travels to an edge where the via hole is to be formed. Afterwards, a dry-etch process is performed by using the organic passivation film pattern as an etch mask to form the via hole. Then, the organic passivation film pattern is ashed or plasma dry-etched to thereby remove the undercut beneath the organic passivation film pattern. Thus, as the undercut is removed, a lower film of the organic passivation film pattern is protruded from a bottom edge of the via hole. Therefore, there does not occur a failure in which a metal film deposited during a subsequent process is opened at a stepped portion.

Here, if the partial exposure pattern is further formed at a position corresponding to the reflection plate of the pixel region in the photomask, the via hole can be formed by one exposure process using a single photomask and at the same time an irregular surface having a plurality of concave portions and convex portions can be formed. Therefore, in a reflection and transmission composite type LCD or a reflection type LCD, it is possible to reduce the number of photomasks needed from seven sheets to five sheets.

According to the second embodiment of the present invention, an organic passivation film pattern is left at an edge of a via hole region by performing the exposure process twice in success using two photomasks. Afterwards, the via hole is formed using the organic passivation film pattern and an ashing or plasma dry-etch process is performed to remove the undercut formed beneath the organic passivation film pattern. Therefore, there can be prevented a failure in which a metal film for a pixel electrode is opened at a stepped portion due to a height difference.

Here, since either one of the two photomasks can be used as an exposure mask for forming an irregular surface in the organic passivation film, in a reflection and transmission composite type LCD or a reflection type LCD, it is possible to reduce the number of photomasks needed from seven sheets to six sheets.

According to the third embodiment, since a transparent electrode in a reflection and transmission composite type LCD is formed of IZO instead of ITO, a boundary characteristic between the transparent electrode and the reflection electrode is enhanced and the manufacturing process is simplified. Also, since a passivation film is made of a single layer of an organic insulating film and one end of the transparent electrode is overlapped with a gate wiring and a data wiring such that a reflection electrode is left around the overlapped region, a high aperture ratio for a sufficient light transmission is obtained.

While the present invention has been described in detail, it should be understood that various changes, substitutions and alterations can be made hereto without departing from the scope of the invention as defined by the appended claims.

What is claimed is:

1. A thin film transistor for a liquid crystal display (LCD), comprising:
    a gate wiring formed on a substrate including a display region and a pad region positioned at an outer portion of the display region, said gate wiring extending in a first direction;
    a gate insulating film formed on the gate wiring and the substrate, for partially exposing the gate wiring;
    an active pattern formed on the gate insulating film;
    a data wiring partially overlapped with the active pattern, the data wiring formed on the gate insulating film and extending in a second direction substantially perpendicular to the first direction;
    an organic passivation film pattern formed on the data wiring and the gate insulating film, said organic passivation film pattern including a first via hole to partially expose the data wiring and a second via hole to partially expose the gate wiring;
    a pixel electrode formed on the organic passivation film pattern and connected to the data wiring through the first via hole; and,
    a pad electrode formed on the organic passivation film pattern and connected to the gate wiring through the second via hole,
    wherein the data wiring comprises a stepped portion arranged on a surface of the data wiring in the first via hole.

2. The thin film transistor of claim 1, wherein the gate insulating film extends from a sidewall of the second via hole.

3. The thin film transistor of claim 1, wherein the gate wiring comprises a gate line including a gate electrode formed within the display region and a gate pad formed at the pad region, the gate pad is connected to an end of the gate line and the second via hole is formed on the gate pad.

4. The thin film transistor of claim 1, wherein the data wiring comprises a first electrode overlapped with a first region of the active pattern and a second electrode overlapped with a second region of the active pattern, the second region arranged opposite to the first region, and the first via hole is formed on the first electrode.

5. The thin film transistor of claim 1, further comprising a data pad arranged at the pad region and formed from the same layer as the gate wiring.

6. The thin film transistor of claim 5, further comprising a bridge electrode formed on the organic passivation film pattern, the bridge electrode is from the same layer as the pixel electrode and the bridge electrode connects an end of the data wiring with the data pad through a third via hole formed in the organic passivation film pattern on the end of the data wiring and a fourth via hole formed at both the gate insulating film and the organic passivation film pattern on the data pad.

7. The thin film transistor of claim 1, wherein the organic passivation film pattern has an irregular upper surface at the display region.

8. The thin film transistor of claim 1, wherein the pixel electrode further comprises a double layered structure including a transparent electrode and a reflection electrode.

9. The thin film transistor of claim 8, wherein the pad electrode comprises a single layer of the transparent electrode.

* * * * *